US007041549B2

(12) United States Patent
Ootsuka

(10) Patent No.: US 7,041,549 B2
(45) Date of Patent: May 9, 2006

(54) METHOD FOR MANUFACTURING SEMICONDUCTOR DEVICE

(75) Inventor: Fumio Ootsuka, Saitama (JP)

(73) Assignee: Renesas Technology Corp., Tokyo (JP)

( * ) Notice: Subject to any disclaimer, the term of this patent is extended or adjusted under 35 U.S.C. 154(b) by 125 days.

(21) Appl. No.: 10/855,467

(22) Filed: May 28, 2004

(65) Prior Publication Data

US 2004/0253790 A1 Dec. 16, 2004

(30) Foreign Application Priority Data

Jun. 10, 2003 (JP) ............................. 2003-165719

(51) Int. Cl.
*H01L 21/8238* (2006.01)
(52) U.S. Cl. ...................... 438/231; 438/199; 438/230; 438/232
(58) Field of Classification Search ................ 438/199, 438/299, 230, 231, 232
See application file for complete search history.

(56) References Cited

U.S. PATENT DOCUMENTS

| 6,130,144 A | 10/2000 | Verret |
| 6,335,253 B1 * | 1/2002 | Chong et al. ............... 438/305 |
| 6,372,591 B1 * | 4/2002 | Mineji et al. ............... 438/305 |
| 6,380,044 B1 * | 4/2002 | Talwar et al. ............... 438/308 |
| 6,432,802 B1 | 8/2002 | Noda et al. |
| 6,710,407 B1 * | 3/2004 | Yamamoto .................. 257/344 |
| 6,730,583 B1 | 5/2004 | Oh et al. |
| 2002/0121654 A1 | 9/2002 | Yamamoto |
| 2003/0146458 A1 * | 8/2003 | Horiuchi et al. ............ 257/288 |
| 2003/0193066 A1 * | 10/2003 | Ito et al. ..................... 257/335 |

FOREIGN PATENT DOCUMENTS

| JP | 7-95535 | 4/1995 |
| JP | 9-199719 | 7/1997 |

* cited by examiner

*Primary Examiner*—Michael Trinh
*Assistant Examiner*—Bac H. Au
(74) *Attorney, Agent, or Firm*—Leydig, Voit & Mayer, Ltd.

(57) ABSTRACT

In a method for manufacturing a semiconductor device, a gate insulating film and a gate electrode are first formed on a substrate. Next, Ge ions, Si ions, or the like are implanted to make the surface of the substrate amorphous, using the gate electrode as a mask. Thereafter, impurities such as B ions or the like, for forming a doped region, are implanted into the amorphous area of the substrate, using the gate electrode as a mask. Furthermore, the doped region is irradiated with visible light for a short period of time.

16 Claims, 44 Drawing Sheets

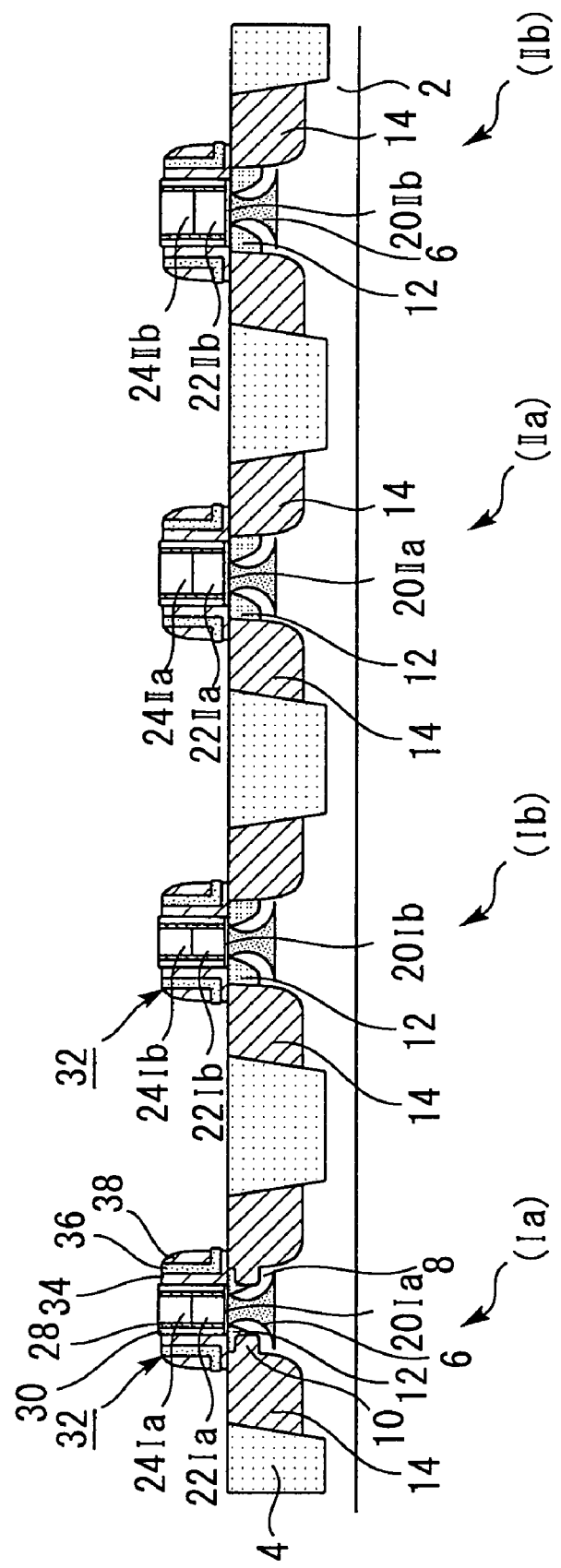

METHOD FOR MANUFACTURING SEMICONDUCTOR DEVICE

BACKGROUND OF THE INVENTION

1. Field of the Invention

The present invention relates to a method for manufacturing a semiconductor device. More specifically, the present invention relates to a semiconductor device having a diffusion layer, and to a method for manufacturing such a semiconductor device.

2. Background Art

In recent years, concurrent to the miniaturization and higher integration of semiconductor devices, the necessity of forming a plurality of transistors in a semiconductor device has arisen. However, if the number of transistors is simply increased, power consumption increases. Therefore, the voltage impressed to each transistor must be lowered. Furthermore, in order not to lower the switching speed even if the impressed voltage is lowered, the gate length of each transistor must be reduced.

In a transistor having a short gate length, however, the roll-off phenomenon of threshold voltage is significant. Therefore, as a countermeasure to the roll-off phenomenon, the junction of diffusion layer (source-drain and extensions) has been shallowed. For example, for CMOS transistors of 65-nm-technology node, the target values of the gate length of 32 nm and the depth of the diffusion layer of 10 to 17 nm have been presented in ITRS (the International Technology Roadmap for Semiconductors).

As a method for forming such an extremely shallow junction, the use of SPE (solid phase epitaxy) for pMOS has been proposed. In nMOS, arsenic (As) implanted into a diffusion layer can be activated at a temperature as low as about 600° C. However, boron (B) implanted into the diffusion layer of pMOS cannot be activated at such a temperature. Therefore, in order to realize the shallow junction of diffusion layers at a low temperature, a shallow junction by SPE is used especially in pMOS. The shallow junction by SPE is realized using the following method.

First, a gate insulating film and a gate electrode are formed on a substrate having an element isolating region, wells, and the like formed thereon. Thereafter, germanium (Ge) ions or silicon (Si) ions are implanted using the gate electrode as mask to form an amorphous layer on the surface of the substrate. Then, ions such as B are implanted to form an extension. Furthermore, a sidewall is formed, and ions such as B are implanted again to form a source and a drain. Thereafter, heat treatment at about 600° C. is performed to recrystallize to locate B on the lattice locations. Thereby, B is activated.

In this method for forming a shallow junction, ions such as Ge are previously implanted before implanting B ions to form an amorphous layer. Thereby, the implanting energy when B ions are implanted can be controlled to some extent to reduce the flying range of the B ions, and channeling by implanted ions when the extension is formed can be prevented.

On the other hand, when B ions are implanted, the substrate is damaged to some extent. The defect caused by this damage results in the occurrence of a leak current. Therefore, the damage must be restored. In order to restore the damage, recrystallization by annealing at above a certain high temperature is required. However, annealing at a high temperature extends and deepens the junction, and shallow junction cannot be realized. Therefore, especially in a semiconductor device that requires extremely shallow junction, priority is given to the realization of shallow junction using low-temperature annealing at about 600° C., or short time annealing.

Here, the target value of leak current presented by ITRS for a semiconductor device for LSTP (low stand-by power) having a long gate length and requiring no shallow junctions is 1 pA/μm. On the other hand, the target value of leak current for a semiconductor device for LOP (low operating power) requiring shallow junctions is 700 pA/μm to allow leak current to some extent.

With the current demands for multi-function semiconductor devices, a system LSI wherein transistors for LOP and transistors for LSTP are formed in a chip may be required; for example, the memory is composed of transistors for LSTP that require little standby power, and the peripheral circuits are composed of transistors for LOP that has a high speed and require little power consumption. In such a case, diffusion layers of different junction depth must be formed in a chip. Specifically, the formation of transistors having deep junctions to some extent and requiring high-temperature heat treatment for inhibiting leak current is required on one hand, and the formation of transistors that cannot be subjected to high-temperature heat treatment for realizing extremely shallow junctions is required on the other hand.

SUMMARY OF THE INVENTION

Therefore, the present invention provides a method for manufacturing an improved semiconductor device that can realize extremely shallow junctions while inhibiting leak currents.

The present invention also provides a method for manufacturing an improved semiconductor device that can realize junctions of different depth in a chip while inhibiting leak currents.

According to an aspect of the present invention, in a method for manufacturing a semiconductor device, a gate insulating film and a gate electrode are formed on a substrate. An amorphous layer is formed by implanting ions into said substrate for making the surface of said substrate amorphous using said gate electrode as a mask. A diffusion layer is formed by implanting ions into said substrate using said gate electrode as masks. Heat treatment at 500° C. to 700° C. is performed to said substrate. Then, sidewalls on the sides of said gate insulating film and gate electrode are formed. A part of said diffusion layer is concentrated by implanting an impurity using said gate electrode and said sidewalls as masks. Visible light is radiated to said substrate.

Other and further objects, features and advantages of the invention will appear more fully from the following description.

BRIEF DESCRIPTION OF THE DRAWINGS

FIGS. 49 to 52 are sectional schematic diagrams for illustrating the states in each manufacturing step the semiconductor device 700 according to the seventh embodiment of the present invention.

DETAILED DESCRIPTION PREFERRED EMBODIMENTS

Figure 1:
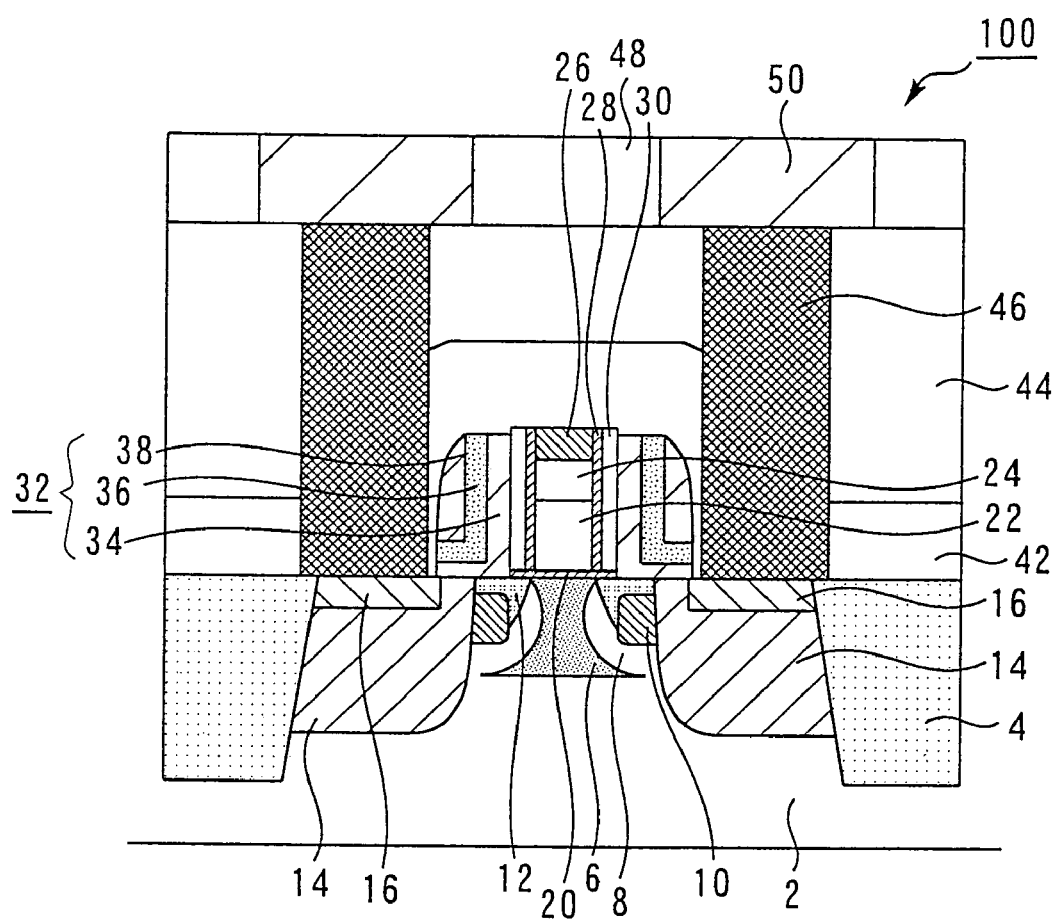
FIG. 1 is a sectional schematic diagram for illustrating a semiconductor 100 according to the first embodiment of the present invention.

The embodiments of the present invention will be described below referring to the drawings. In the drawings, the same or like parts will be denoted using the same reference numerals and characters, and the description thereof will be omitted or simplified.

First Embodiment

FIG. 1 is a sectional schematic diagram for illustrating a semiconductor 100 according to the first embodiment of the present invention.

The semiconductor 100 is a p-channel MOSFET for LOP (low operating power).

As FIG. 1 shows, a shallow trench isolation (STI) 4 is formed on an Si substrate 2 in the semiconductor 100, an n-well and punch-through stopper 6 are formed in the region partitioned by STI 4, and pocket layers 8 are symmetrically formed on the both side thereof.

An amorphous region 10 is formed in the vicinity of the surface of the Si substrate 2 on the pocket layers 8. An extension 12 wherein a p-type impurity, such as B ions, is implanted is formed above the amorphous region 10. The extension 12 has a low-concentration impurity diffusion layer having a relatively shallow junction depth of about 10 to 15 nm and relatively low impurity concentration.

Source-drain regions 14 are formed on the both sides of the extension 12. The source-drain regions 14 are high-concentration impurity diffusion layers having a deep junction depth of about 60 to 80 nm and relatively high impurity concentration. An NiSi film 16 is formed in the source-drain regions 14 on the surface of the Si substrate 2.

An $SiO_2$ film 20, which is a gate insulating film, is formed in the channel portion between the source-drain regions 14. A gate electrode composed of an SiGe film 22, an Si film 24 on the SiGe film 22, and an NiSi film 26 on the Si film 24, is formed on the $SiO_2$ film 20. Here, the width of the $SiO_2$ film (gate insulating film) 20 and the width of the gate electrode (SiGe film 22/Si film 24/NiSi film 26), i.e. the gate length is about 35 nm.

Oxide films 28 and spacers 30 are formed on the both sides of the $SiO_2$ film (gate insulating film) 20 and the gate electrode (SiGe film 22/Si film 24/NiSi film 26). Furthermore, a sidewall 32 is formed on the outside of each spacer 30. The sidewall 32 is composed of an $SiO_2$ film 34 formed adjacent to the side of the spacer 30 and the surface of the Si substrate 2, an SiN film 36 formed so as to contact the $SiO_2$ film 34, and the $SiO_2$ film 38 formed so as to contact the SiN film 36.

An SiN film 42 and an $SiO_2$ film 44 are formed on the Si substrate 2 as interlayer insulating films so as to bury the $SiO_2$ film (gate insulating film) 20, and the gate electrode (SiGe film 22/Si film 24/NiSi film 26), the sidewall 32 and the like. In the SiN film 42 and the $SiO_2$ film 44, contact plugs 46 passing through the SiN film 42 and the $SiO_2$ film 44 are formed from the surface of the $SiO_2$ film 44 to the surfaces of the NiSi films 16 on the surface of the Si substrate 2. Thereby, the NiSi films 16 are connected to the contact plugs 46.

An interlayer insulating film 48 is formed on the surface of the $SiO_2$ film 44, and on the contact plugs 46. Wirings 50 connecting to the surfaces of the contact plugs 46 are formed in the interlayer insulating film 48. The wiring 50 is connected to NiSi films 16 of source-drain region 14 by contact plugs 46.

Figure 2:
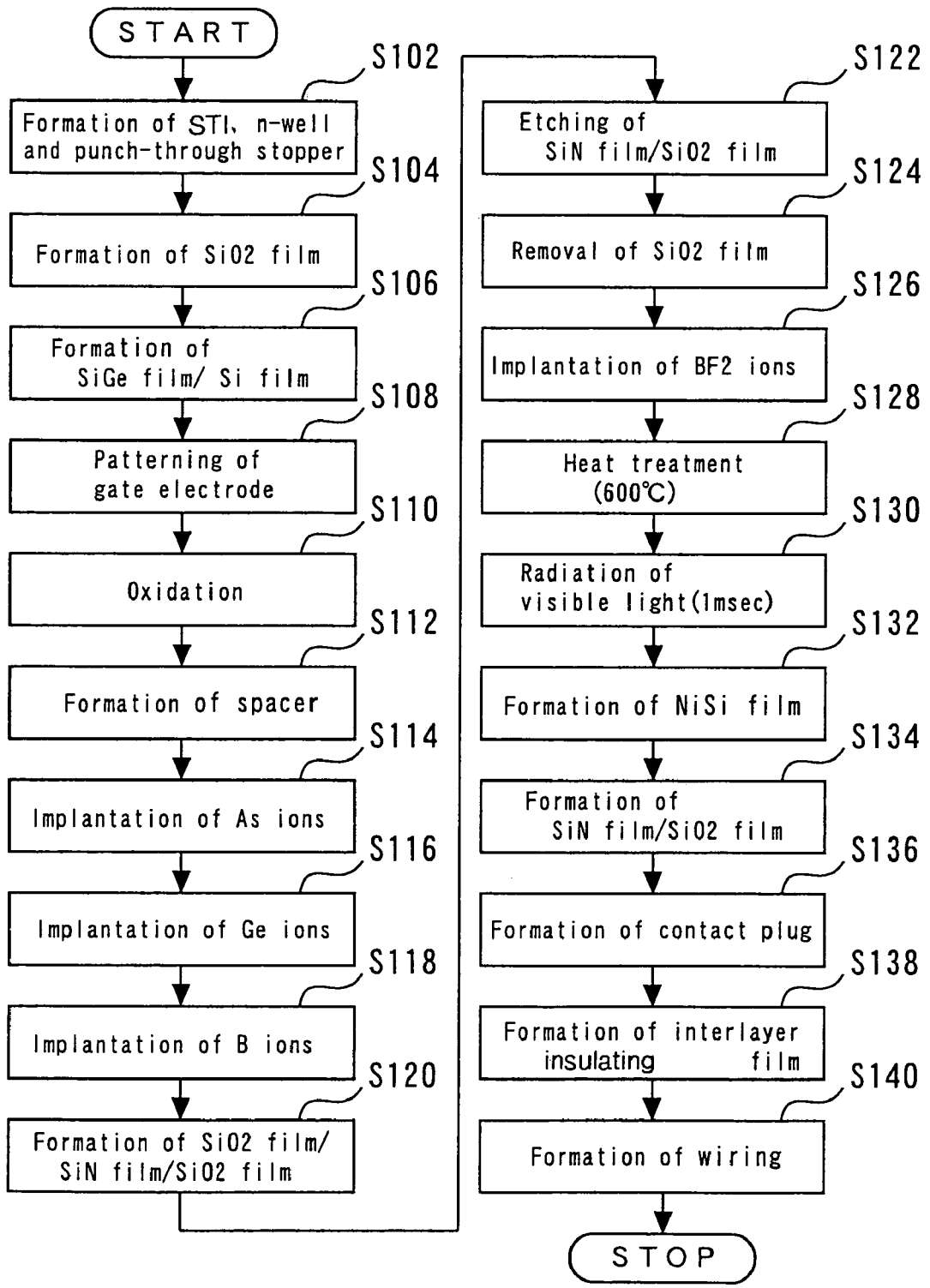
FIG. 2 is a flow diagram for illustrating a method for manufacturing the semiconductor device 100 according to the first embodiment of the present invention.

FIG. 2 is a flow diagram for illustrating a method for manufacturing the semiconductor device 100 of the first embodiment of the present invention. FIGS. 3 to 16 are sectional schematic diagrams for illustrating the state in each manufacturing step for manufacturing the semiconductor device 100.

The method for manufacturing the semiconductor device 100 of the first embodiment of the present invention will be described below referring to FIGS. 1 to 17.

Figure 3:
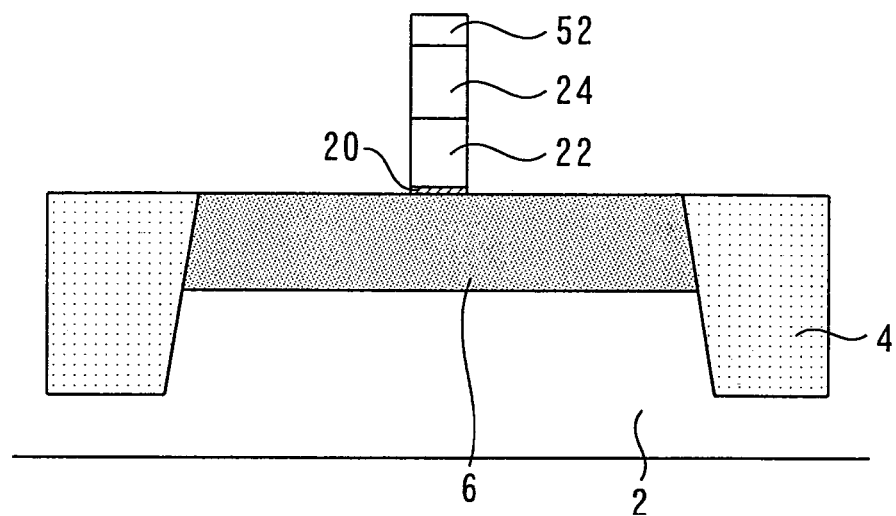
FIGS. 3 to 16 are sectional schematic diagrams for illustrating the state in each manufacturing step for manufacturing the semiconductor device 100 according to the first embodiment of the present invention.

First, as FIG. 3 shows, an STI 4, an n-well, and a punch-through stopper 6 are formed on an Si substrate 2 (Step S102). A relatively shallow trench is formed in the Si substrate 2, and $SiO_2$ is deposited in the trench to form the STI 4. Thereafter, an n-type impurity, such as P, is implanted in the region isolated by the STI 4, to form the n-well. Furthermore, a p-type impurity, such as B, is implanted to form the punch-through stopper 6.

Next, an $SiO_2$ film 20 is formed on the Si substrate 2 (Step S104). The $SiO_2$ film 20 is a material film to become a gate insulating film by later processing. Here, the $SiO_2$ film 20 is formed by oxidizing the Si substrate 2.

Next, an SiGe film 22 and an Si film 24 are formed on the $SiO_2$ film 20 (Step S106). The SiGe film 22 and the Si film 24 are material film to become a gate electrode by later processing. Both the SiGe film 22 and the Si film 24 are formed using a CVD (chemical vapor deposition) method.

Next, the SiGe film 22 and the Si film 24 are patterned for the gate electrode (Step S108). Here, a resist is first applied onto the Si film 24, and then exposure and development processing is performed to form a resist mask 52. Thereafter, the SiGe film 22 and the Si film 24 are etched using the resist mask 52 as a mask. Thereby, the SiGe film 22 and the Si film 24 are patterned to have the width of the gate electrode (60 nm). Thereafter, the resist mask 52 is removed. The portion exposed on the surface of the $SiO_2$ film 20 is removed using wet etching after patterning.

Figure 4:
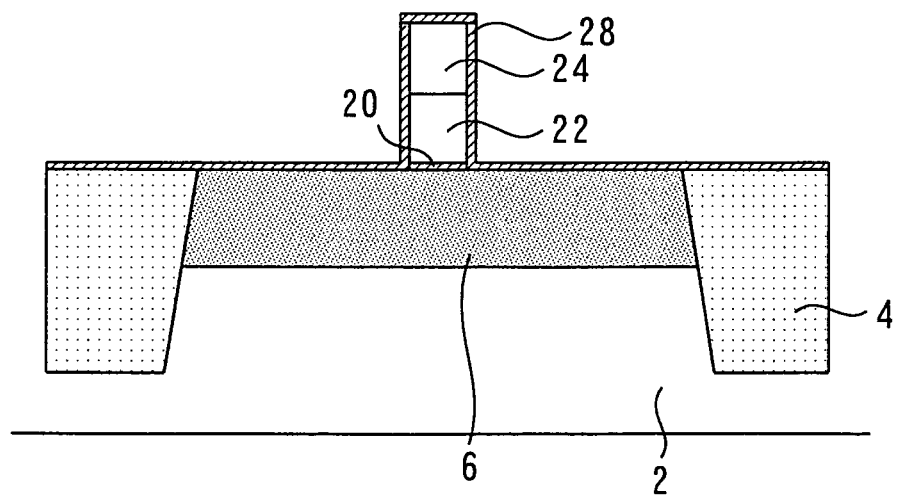

Next, as FIG. 4 shows, the exposed portions of the SiGe film 22, the Si film 24, and the Si substrate 2 to the surface are oxidized (Step S110). Thereby, the exposed portions of the SiGe film 22, the Si film 24, and the Si substrate 2 to the surface are coated with the oxide film 28, and damage caused by gate-electrode patterning is restored.

Figure 5:
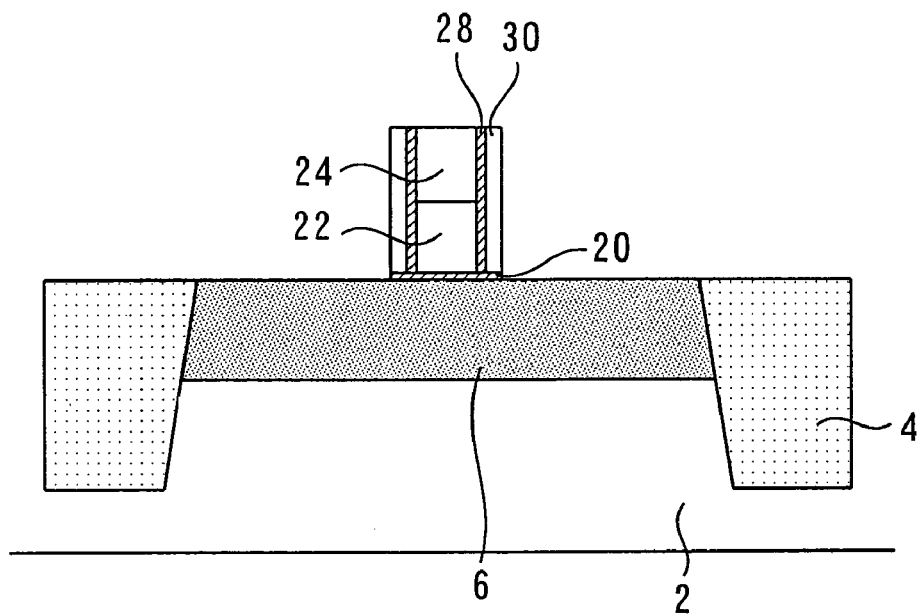

Next, as FIG. 5 shows, a spacer 30 is formed (Step S112). Here, after an SiN film is formed, the SiN film on the Si substrate is removed by etch back.

Figure 6:
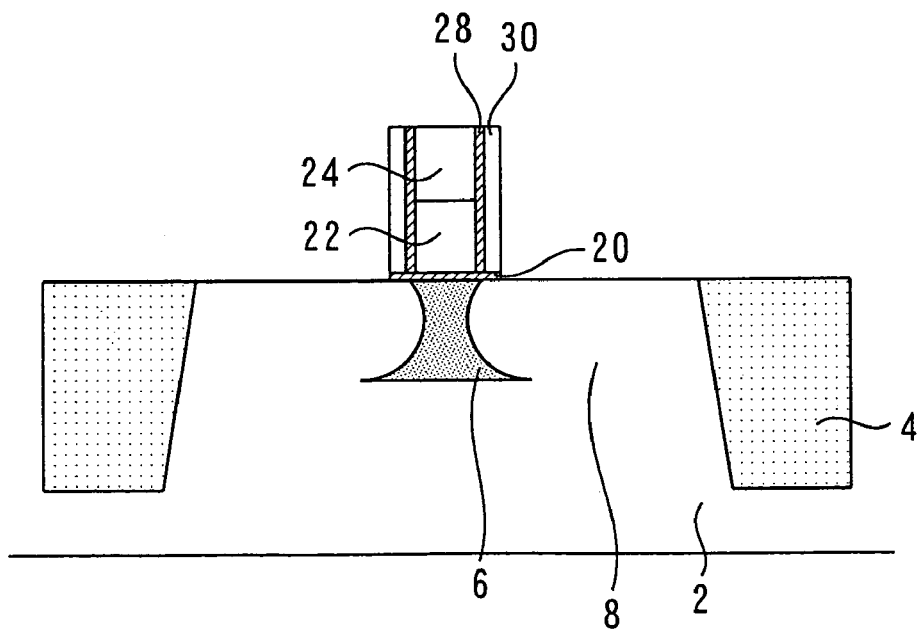

Next, As ions are implanted (Step S114). Here, As ions of a dose of about $2 \times 10^{13}$ $cm^{-2}$ are implanted by an implanting energy of about 70 keV using the SiGe film 22, the Si film 24, the oxide film 28, and the spacer 30 as masks. Thereby, a pocket layer 8 is formed as FIG. 6 shows.

Figure 7:
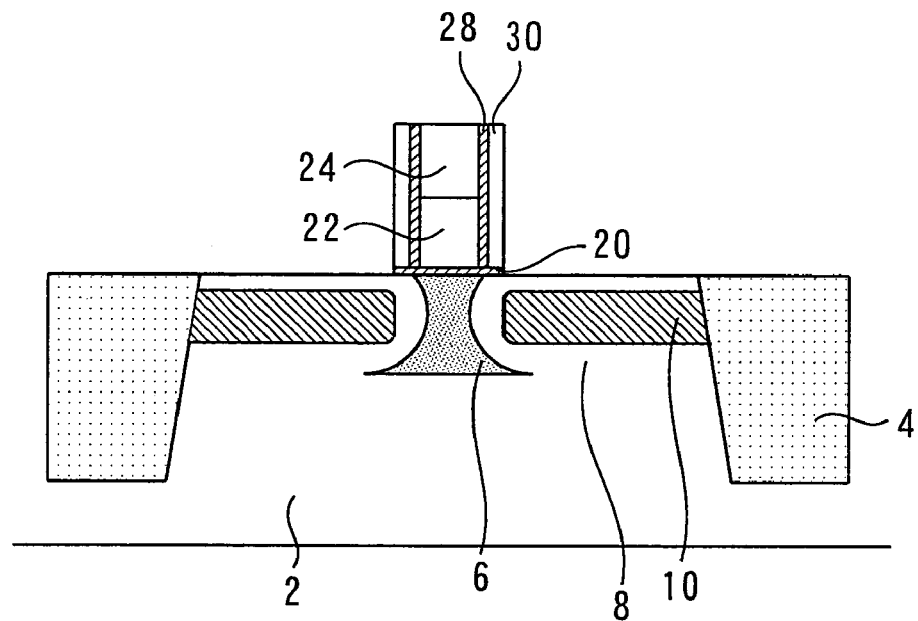

Next, Ge ions are implanted (Step S116). Here, Ge ions of a dose of about $1 \times 10^{15}$ $cm^{-2}$ are implanted by an implanting energy of about 10 keV using the SiGe film 22, the Si film 24, the oxide film 28, and the spacer 30 as masks. Thereby, an amorphous region 10 is formed as FIG. 7 shows.

Figure 8:
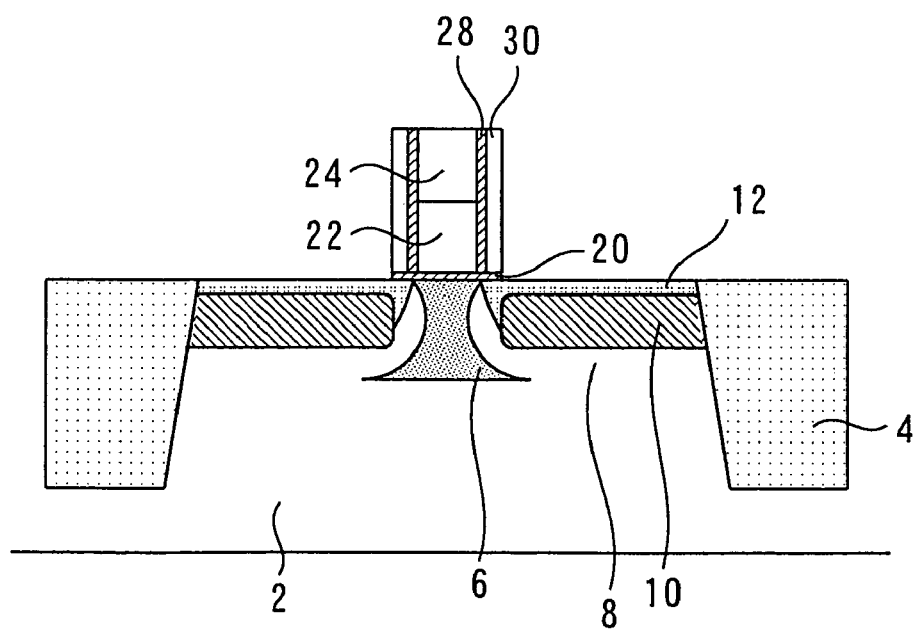

Next, B ions are implanted (Step S118). Here, B ions are implanted using the SiGe film 22, the Si film 24, the oxide film 28, and the spacer 30 as masks. The implanting energy is 200 to 400 eV (ultra-low acceleration), and the dose is about $1 \times 10^{15}$ $cm^{-2}$. Thereby, as FIG. 8 shows, B ions are implanted in the region shallower than the amorphous region 10, and a shallow extension 12 of a junction depth of 10 to 15 nm is formed.

Figure 9:
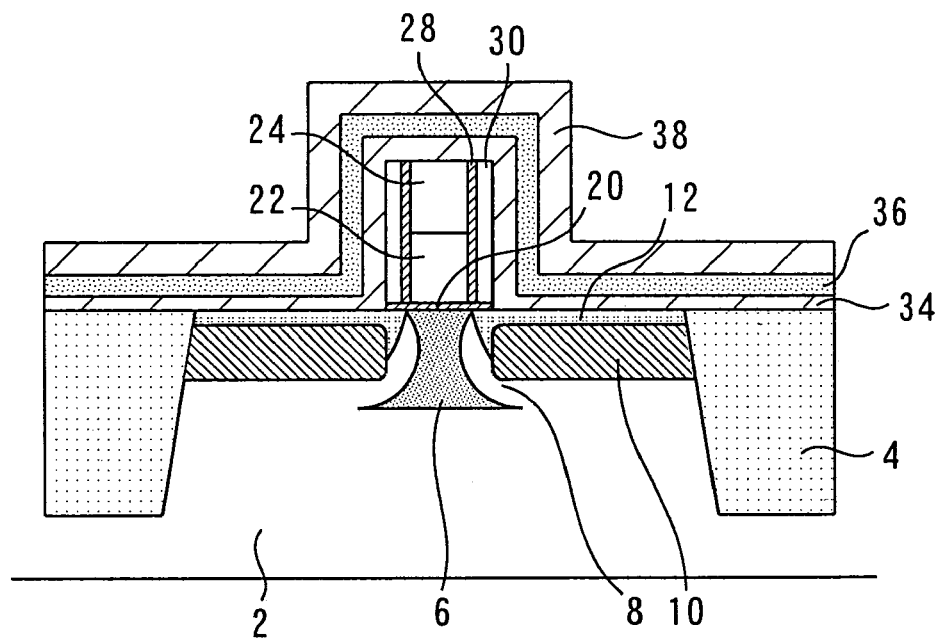

Next, as FIG. 9 shows, an $SiO_2$ film 34, an SiN film 36, and an $SiO_2$ film 38 are formed (Step S120). Here, each of the $SiO_2$ film 34, the SiN film 36, and the $SiO_2$ film 38 are formed using the CVD method, and the thickness of each film is 15 nm, 25 nm, and 25 nm, respectively. At this time, the film-forming temperature of each film is about 600° C. By this heat of the film-forming, the amorphous region 10 is simultaneously crystallized.

Figure 10:
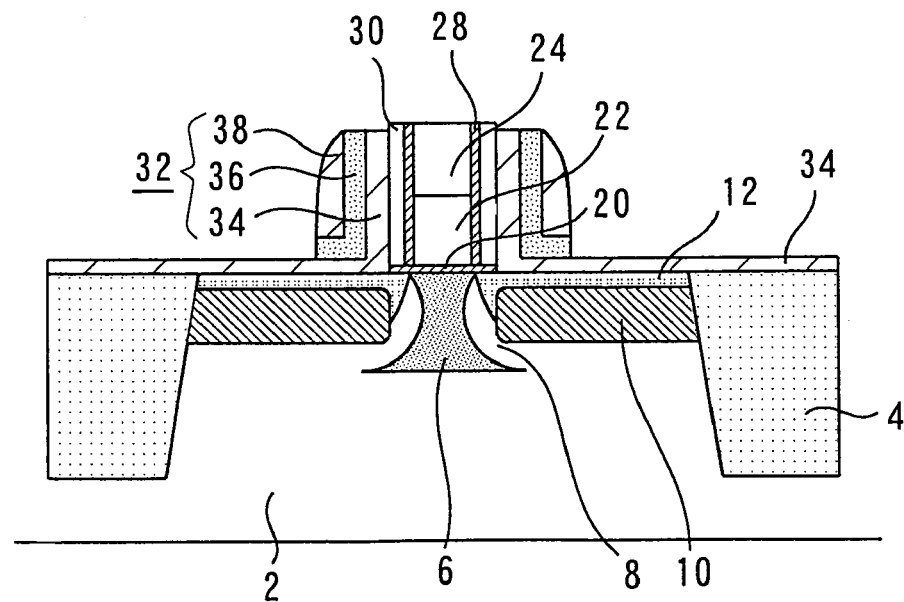
Figure 11:
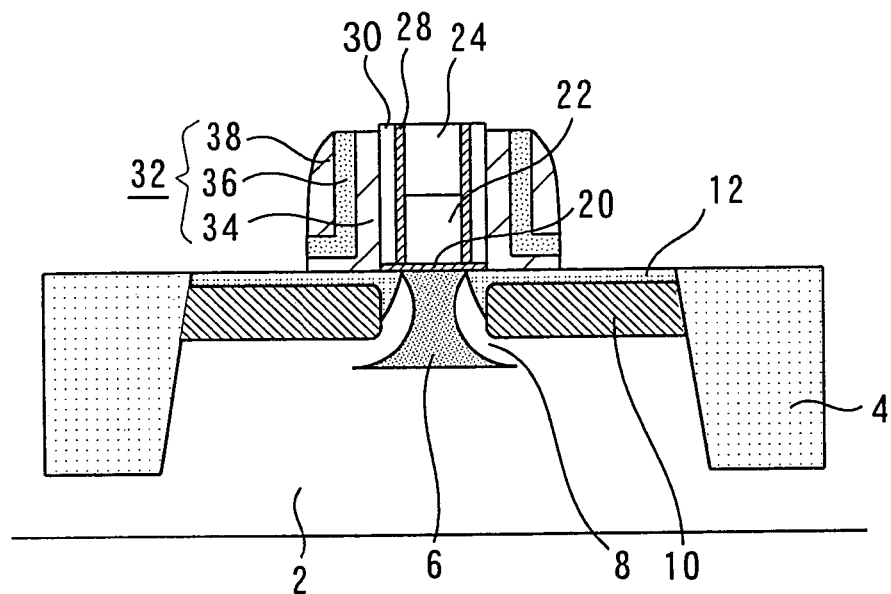

Next, as FIG. 10 shows, the $SiO_2$ film 38 and the SiN film 36 are etched (Step S122). Here, anisotropic etching is used. Thereafter, as FIG. 11 shows, the portion of the $SiO_2$ film exposed on the surface is removed (Step S124). Thereby, a sidewall 32 is formed.

Figure 12:
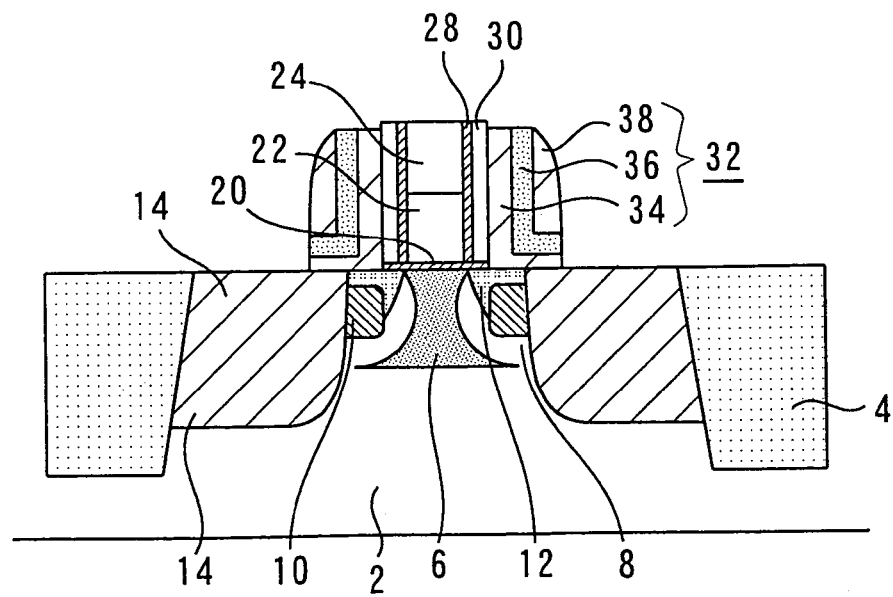

Next, $BF_2$ ions are implanted (Step S126). Here, $BF_2$ ions are implanted using the SiGe film 22, the Si film 24, the oxide film 28, the spacer 30, and the sidewall 32 as masks. The implanting energy is about 20 keV, and the dose is about $3 \times 10^{15}$ $cm^{-2}$. Thereby, as FIG. 12 shows, B ions are implanted into a relatively deep region in the portion of the Si substrate 2 not covered with the SiGe film 22, the Si film 24, the sidewall 32 and the like, and source-drain regions 14, which are of a junction depth of as deep as 60 nm to 80 nm and high-concentration impurity diffusion layers, are formed. Here, by using $BF_2$ ions, the source-drain regions 14 are simultaneously made amorphous.

Next, heat treatment for activation is performed (Step S128). Here, short time annealing for about 2 minutes is performed at a temperature of 600° C. or below. By this annealing, the source-drain regions 14 are simultaneously crystallized.

Figure 13:
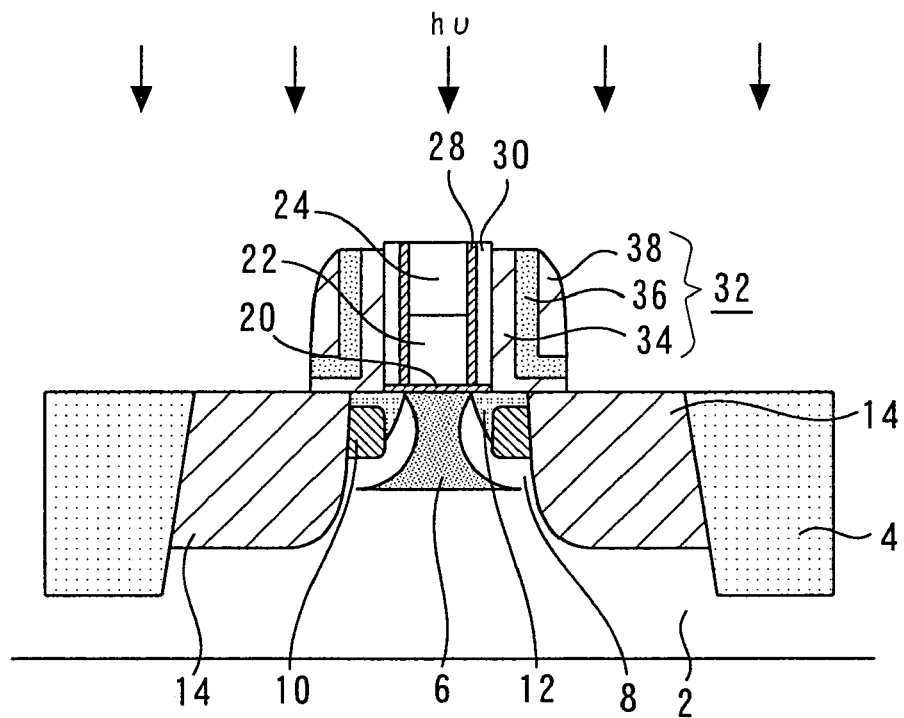

Next, as FIG. 13 shows, visible light is radiated by using flash lamp (Step S130). Here, the time for radiating visible light is as extremely short as 1 msec or less to prevent the diffusion layer from extension. Thereby, the B ions implanted in the extension 12 and the source-drain regions 14 can be activated.

Figure 14:
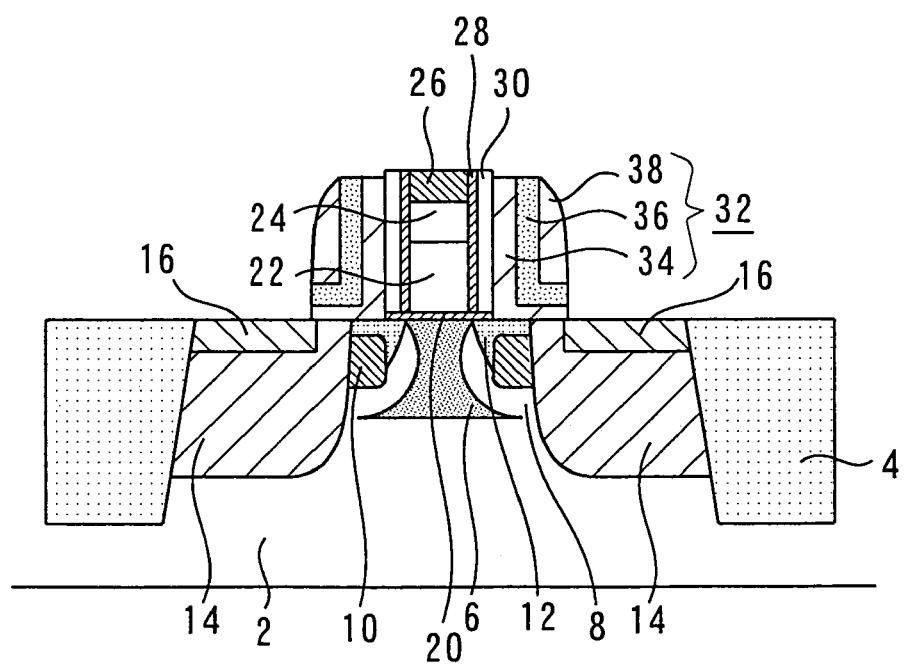

Next, as FIG. 14 shows, NiSi films 16 and 26 are formed (Step S132). Here, an Ni film is first formed on the entire surface using a sputtering method. Thereafter, heat treatment at a low temperature is performed using lamp annealing to allow Si to react with Ni to form nickel silicide. Thereafter, Ni that has not reacted is removed. Thereby, self-aligned NiSi films 16 and 26 are formed.

Figure 15:
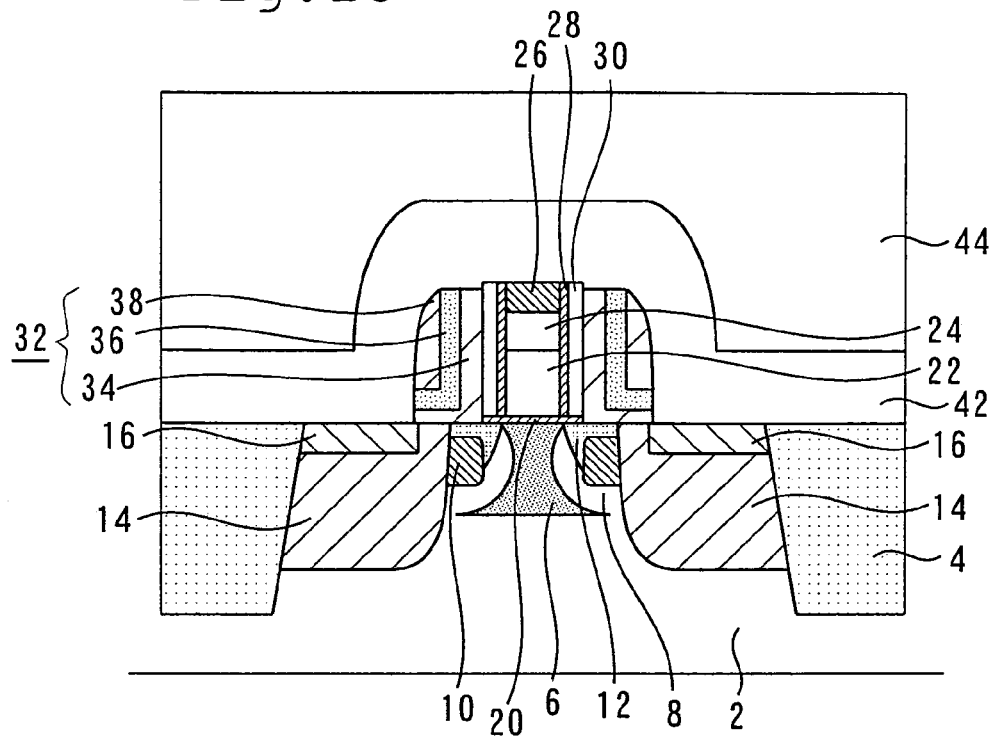

Thereafter, as FIG. 15 shows, an SiN film 42 and an $SiO_2$ film 44 are formed as interlayer insulating films (Step S134). Here, both the SiN film 42 and the $SiO_2$ film 44 are formed using a CVD method. The SiN film 42 functions as an etching stopper of the contacts.

Figure 16:
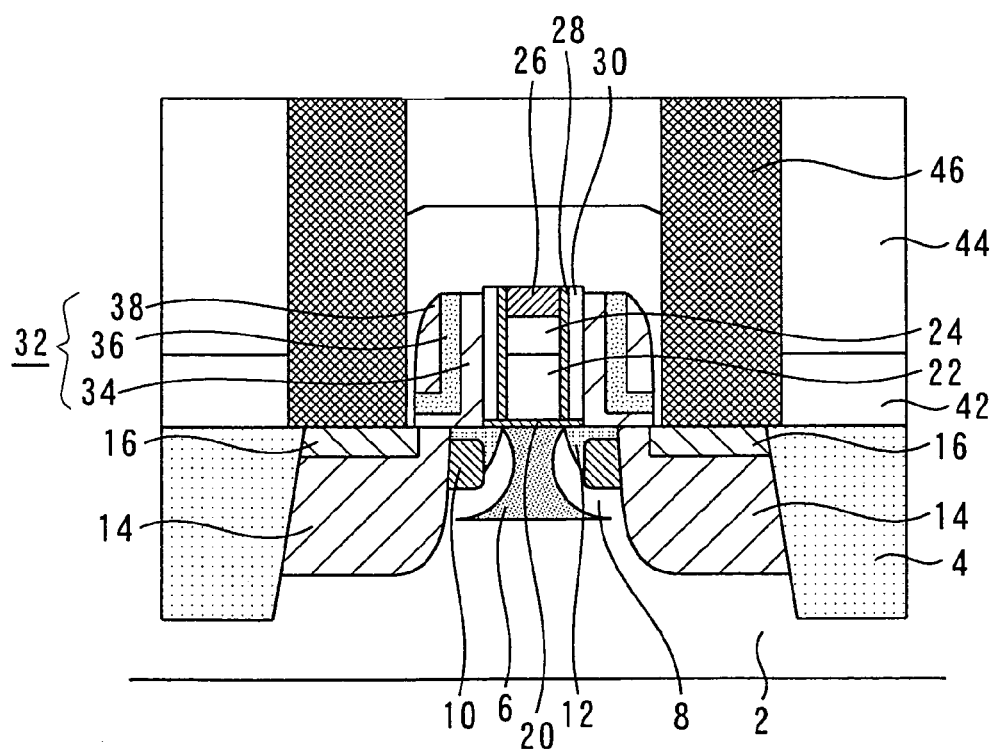

Next, as FIG. 16 shows, contact plugs 46 are formed on the SiN film 42 and the $SiO_2$ film 44 (Step S136). Here, the contact plugs 46 are formed by forming contact holes in the SiN film 42 and the $SiO_2$ film 44 so that the surface of the NiSi film 16 is exposed, burying tungsten (W) in the contact holes, and then planarizing W until the surface of the $SiO_2$ film 44 is exposed.

Next, an interlayer insulating film 48 is formed (Step S138). Thereafter, wirings 50 are formed in the interlayer insulating film.

Thereby, a semiconductor device 100 as shown in FIG. 1 can be obtained.

According to the first embodiment, as described above, Ge ions are first implanted into the region for forming diffusion layers (the extension 12 and the source-drain region 14) to make the region amorphous, B ions are implanted, and then, the amorphous region 10 is crystallized. Therefore, shallow junction can be realized with low implantation energy while preventing channeling. After the source-drain region 14 has been formed, heat treatment at a high temperature by lamp annealing using visible light for an extremely short time is performed. Thereby, the extension of the junction of the diffusion layers caused by heat treatment at a high temperature and for a long time can be controlled, and variation can be inhibited to realize shallow junction. At the same time, the damage of the Si substrate caused by the implantation of B ions can be restored by the heat treatment for an extremely short time, and the activation of B ions can be realized. Therefore, a semiconductor device having favorable device properties can be obtained.

In the first embodiment, the case wherein a pMOSFET is formed was described. This is because SPE (solid phase epitaxy) can prevent the rapid diffusion of B used for forming the pMOS, and is the most effective means. However, the present invention is not limited to pMOSFETs, but may be applied to nMOSFETs or other semiconductor devices. In these cases, the impurities to be implanted can be adequately selected.

Also in the present invention, the structure of the semiconductor device 100, and the materials, forming method and ions to be implanted are not limited to what are described for the first embodiment. The materials for forming the films may be selected from materials that can exert respective functions; and the forming method suited to the selected materials may be used.

In particular, for example in the first embodiment, the device having oxide films 28 or spacers 30 formed on the both sides of the gate electrode is described. This is because the formation of the oxide films 28 can restore the damage due to the processing of the gate electrode; and the spacers 30 can reduce the overlapping length of the extension 12 and the source-drain region 14 with the gate electrode to reduce the variation of the threshold voltage. However, in the present invention, the oxide films 28 and the spacers 30 are not necessarily formed.

Also in the first embodiment, the sidewall 32 of a three-layer structure is described. However, the present invention is not limited to the three-layer sidewall, but for example, a single-layer sidewall may be used.

Also in the first embodiment, the SiO$_2$ film 34, the SiN film 36, and the SiO$_2$ film 38 are formed at film-forming temperature of about 600° C. to form the sidewall 32. However, the present invention is not limited to this temperature. The temperature is preferred to be 500° C. to 700° C. to crystallize the amorphous region. If these films are not formed at this film-forming temperature, heat treatment at about 500° C.–700° C. may be performed after forming the extension 12.

Also in the first embodiment, the case wherein a diffusion layer is formed of the extension 12 having a relatively shallow junction and the source-drain region 14 having a relatively shallow junction is described. However, the present invention is not limited to the diffusion layer composed of two kinds of diffusion layers having different depths and concentrations, but may be composed of, for example, diffusion layers having the same depth and concentration.

Also in the first embodiment, for example, As ions are used for forming the pocket layer 8. However, in the present invention, other ions, such as P ions may be used.

Furthermore, the semiconductor device may have no pocket layer 8. Although Ge ions are used for forming the amorphous region, Si ions may also be used. Moreover, although B ions are used for forming the extension 12, BF$_2$ ions may also be used.

Also in the first embodiment, for example, the case wherein BF$_2$ ions are used for forming the source-drain region 14 is described. This is because the use of BF$_2$ ions can make the source-drain region 14 amorphous as well as the implantation of B ions. However, the present invention is not limited to the case wherein BF$_2$ ions are used. For example, as in the case of forming the extension 12 after implanting about $1 \times 10^{15}$ cm$^{-2}$ of Ge ions, about $3 \times 10^{15}$ cm$^{-2}$ of B ions may be implanted. Furthermore, the source-drain region 14 may be formed without making it amorphous.

Second Embodiment

Figure 17:
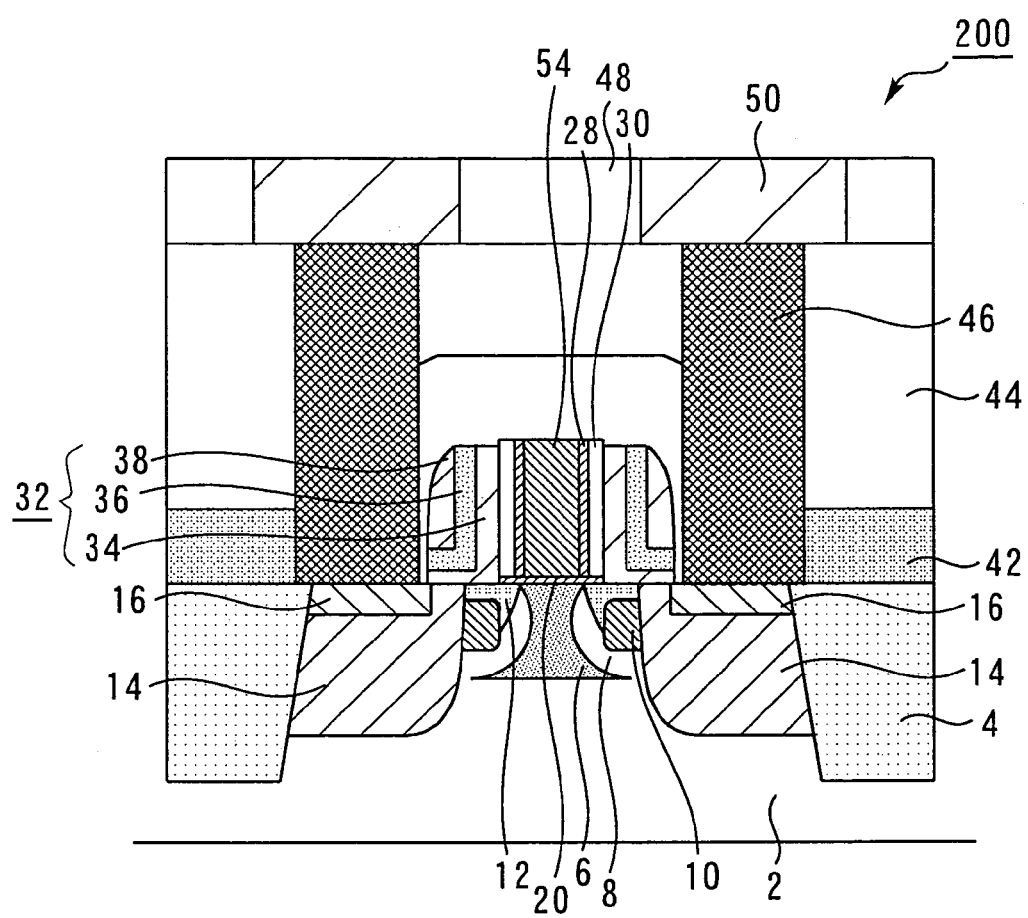
FIG. 17 is a sectional schematic diagram for illustrating the semiconductor device 200 according to the second embodiment of the present invention.

FIG. 17 is a sectional schematic diagram for illustrating the semiconductor device 200 according to the second embodiment of the present invention.

The semiconductor device 200 is a p-channel MOSFET for LOP similar to the semiconductor device 100 described in the first embodiment.

As FIG. 17 shows, the semiconductor device 200 is similar to the semiconductor device 100. However, in the semiconductor device 200, the gate electrode 54 is not a laminated structure of the SiGe film 22, the Si film 24 and the NiSi film 26; but is a metal gate composed of a TiN film.

Figure 18:
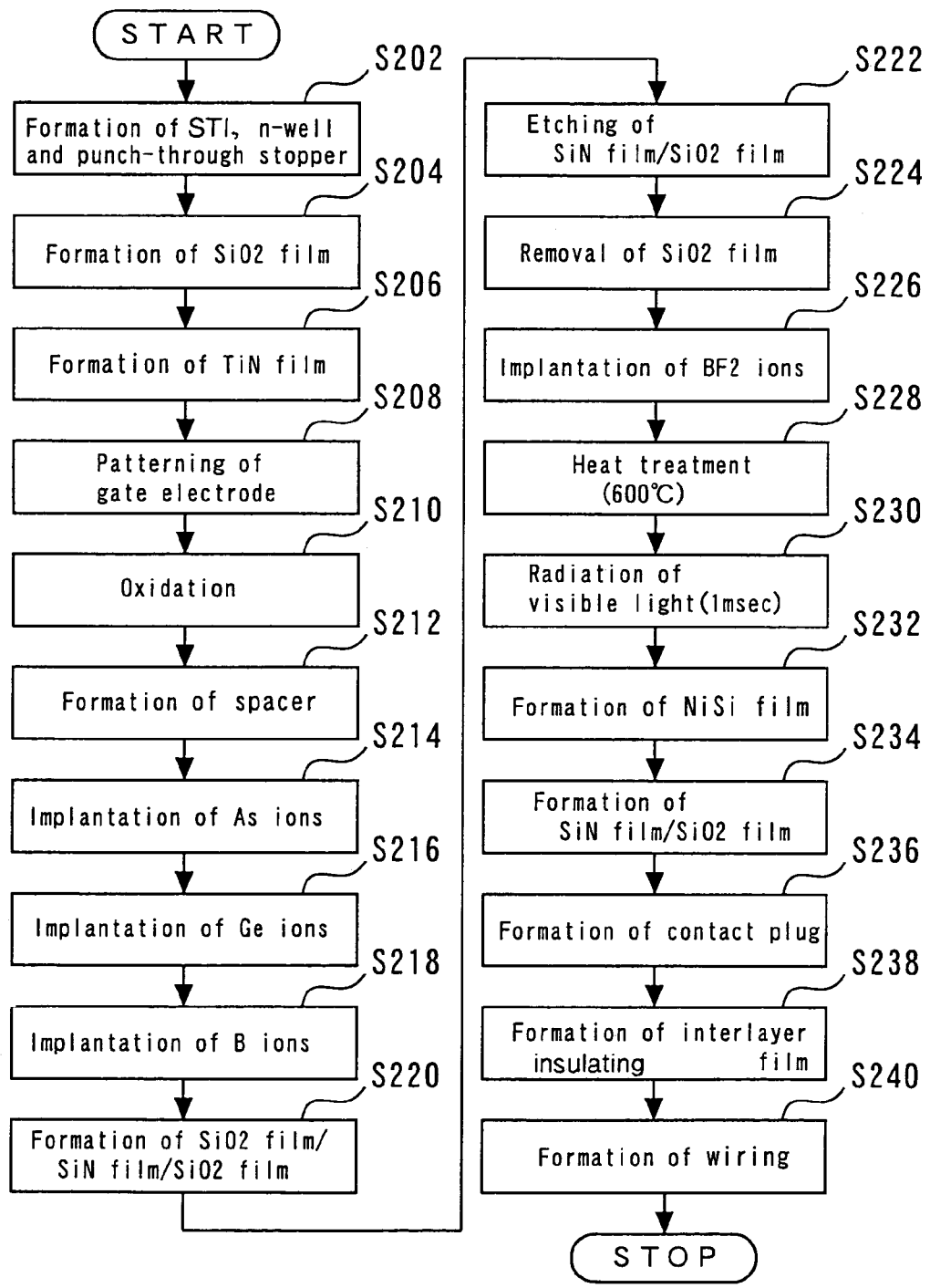
FIG. 18 is a flow diagram for illustrating the method for manufacturing the semiconductor device 200 according to the second embodiment of the present invention.
Figure 19:
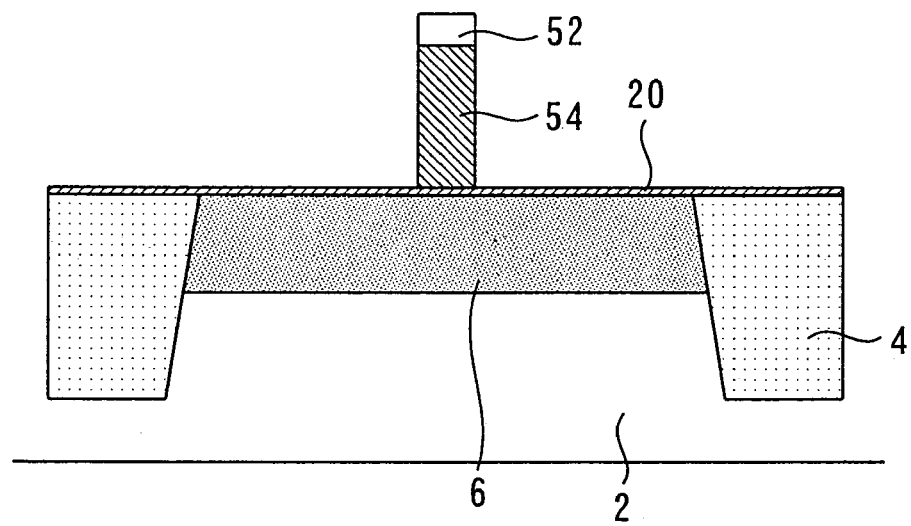
FIGS. 19 and 20 are sectional schematic diagrams for illustrating the states in each manufacturing step of the semiconductor device 200 according to the second embodiment of the present invention.
Figure 20:
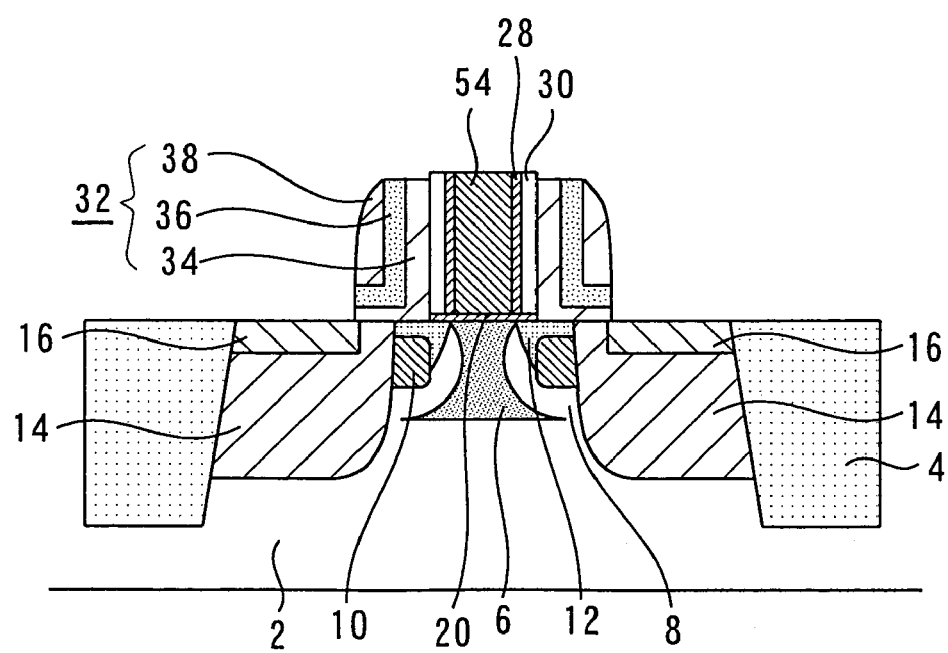

FIG. 18 is a flow diagram for illustrating the method for manufacturing the semiconductor device 200 according to the second embodiment of the present invention. FIGS. 19 and 20 are sectional schematic diagrams for illustrating the states in each manufacturing step of the semiconductor device 200.

The method for manufacturing the semiconductor device 200 is similar to the method for manufacturing the semiconductor device 100 described in the first embodiment. However, in the semiconductor device 200, as described above, a metal gate composed of a TiN film is used as the gate electrode 54 unlike the semiconductor device 100. Therefore, the step for forming the gate electrode is somewhat different from the steps for forming the gate electrode (Steps S106 to S108) described in the first embodiment.

The method for manufacturing a semiconductor device 200 according to the second embodiment of the present invention will be specifically described below referring to FIGS. 17 to 20.

First, in the same manner as Steps S102 and S104 in the first embodiment, an STI 4, an n-well, and a punch-through stopper 6 are formed on an Si substrate 2 (Step S202); and an SiO$_2$ film 20 is formed on the Si substrate 2 (Step S204).

Next, as FIG. 19 shows, a TiN film 54 is formed (Step S206) in place of the formation of the SiGe film 22 and the Si film 24 in the first embodiment (Step S106). The TiN film 54 is formed using a CVD (chemical vapor deposition) method.

Thereafter, the TiN film 54 is patterned for a gate electrode (Step S208). Here, in the same manner as the patterning of the SiGe film 22 and the Si film 24 described in the first embodiment (Step S108), the resist mask 52 is formed, and etching is performed using the resist mask 52.

Thereafter, in the same manner as Steps S110 to S130 in the first embodiment, the formation of oxide films 28 and spacers 30 (Steps S210 and S212); the formation of a pocket layer 8, amorphous regions 10, and extensions 12 using ion implantation (Steps S214 to S218); the formation of sidewalls 32 (Steps S220 to S224); the formation of source-drain region 14 (Step S226); and heat treatment (Step S228) are performed. Thereafter, in the same manner as in the first embodiment, visible light is radiated for an extremely short time of about 1 msec (Step S230).

Next, as FIG. 20 shows, an NiSi film 16 is formed (Step S232) Here, in the same manner as the formation of NiSi films 16 and 26 (Step S132) described in the first embodiment, an Ni film is first formed on the entire surface, and then, heat treatment at a low temperature is performed to allow Si to react with Ni to form nickel silicide. Thereafter, Ni that has not reacted is removed. Thereby, a self-aligned NiSi film 16 is formed. In the semiconductor device 200, however, the gate electrode 54 is composed of a TiN film, and no Si film is formed on the upper surface. Therefore, the surface of the gate electrode 54 does not react with Ni, and the NiSi film 16 is formed only on the source-drain region 14.

Thereafter, in the same manner as in Steps S134 to S140, an SiN film 42, an SiO$_2$ film 44, contact plugs 46, an interlayer insulating film 48, and wirings 50 are formed (steps S234 to S240).

Thus, a semiconductor device 200 as shown in FIG. 17 is formed.

According to the second embodiment, as described above, in the same manner as in the first embodiment, the junctions of the diffusion layers (extensions 12 and source-drain region 14) can be prevented from extending to realize shallow junction, and B ions implanted into the diffusion layers can be activated. Thereby, even in the shallow junction the variation of the threshold voltage, leak current can be controlled, and favorable device properties can be obtained even in a transistor for LOP that has a short gate length.

Also in the semiconductor device 200 of the second embodiment, a metal gate composed of TiN is used as the gate electrode 54. When a metal gate is used, the reaction of the metal with the gate insulating film during later heat treatment usually becomes a problem. In the second embodiment, however, the radiation of visible light for a short time can control the heat-treatment temperature after processing the gate electrode to be low. Therefore, the reaction of the metal with the gate insulating film can be prevented, and the poor withstand voltage of the gate insulating film can be prevented even when the metal gate is used.

Although the use of the TiN film 54 as the metal gate is described in the second embodiment, the present invention is not limited to TiN, and other metals such as W can be used.

Other parts are the same as in the first embodiment, the description thereof will be omitted.

Third Embodiment

Figure 21:
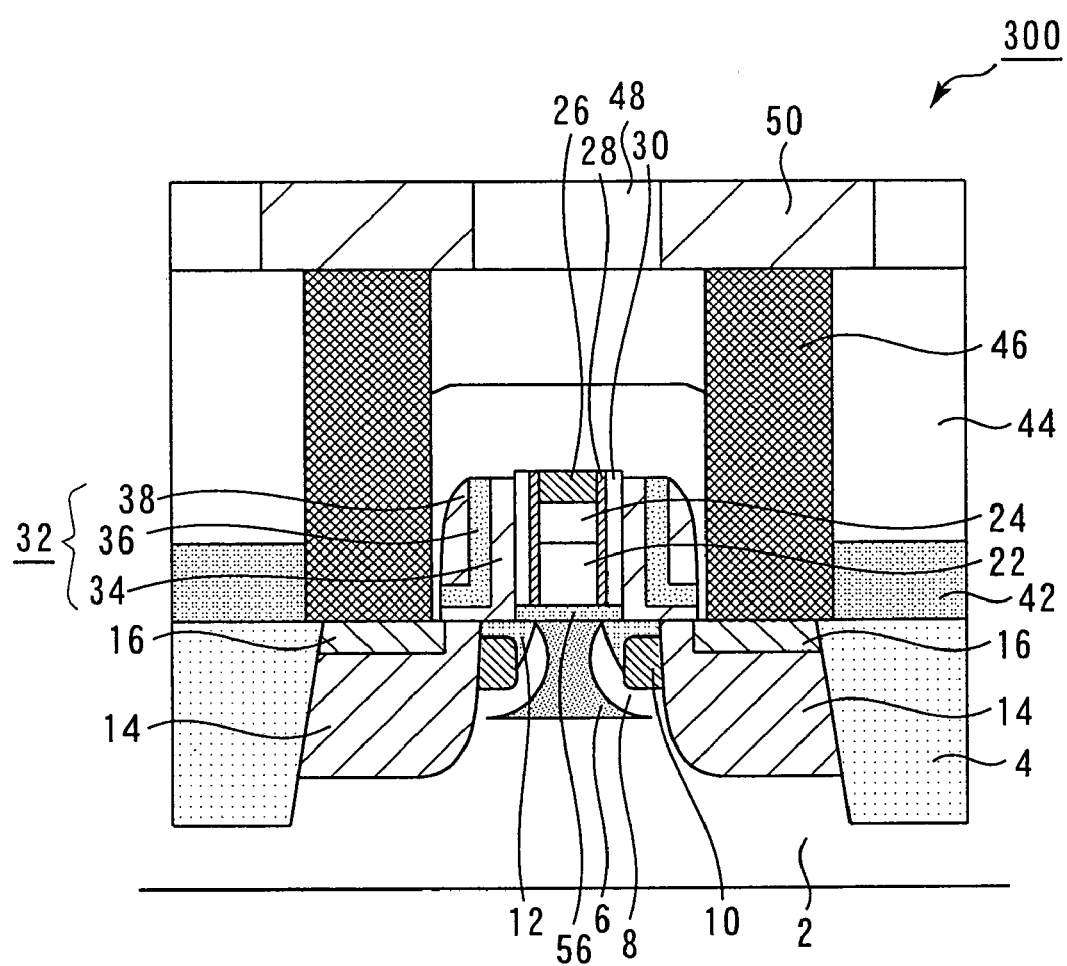
FIG. 21 is a sectional schematic diagram for illustrating the semiconductor device 300 according to the third embodiment of the present invention.

FIG. 21 is a sectional schematic diagram for illustrating the semiconductor device 300 according to the third embodiment of the present invention.

The semiconductor device 300 is a p-channel MOSFET for LOP similar to the semiconductor device 100 described in the first embodiment.

As FIG. 21 shows, the semiconductor device 300 is similar to the semiconductor device 100. However, the gate insulating film 56 in the semiconductor device 300 is composed of an HfO$_2$ film, which is a high-dielectric-constant film (High-k film), unlike the semiconductor device 100 wherein the gate insulating film 20 is an SiO$_2$ film.

Figure 22:
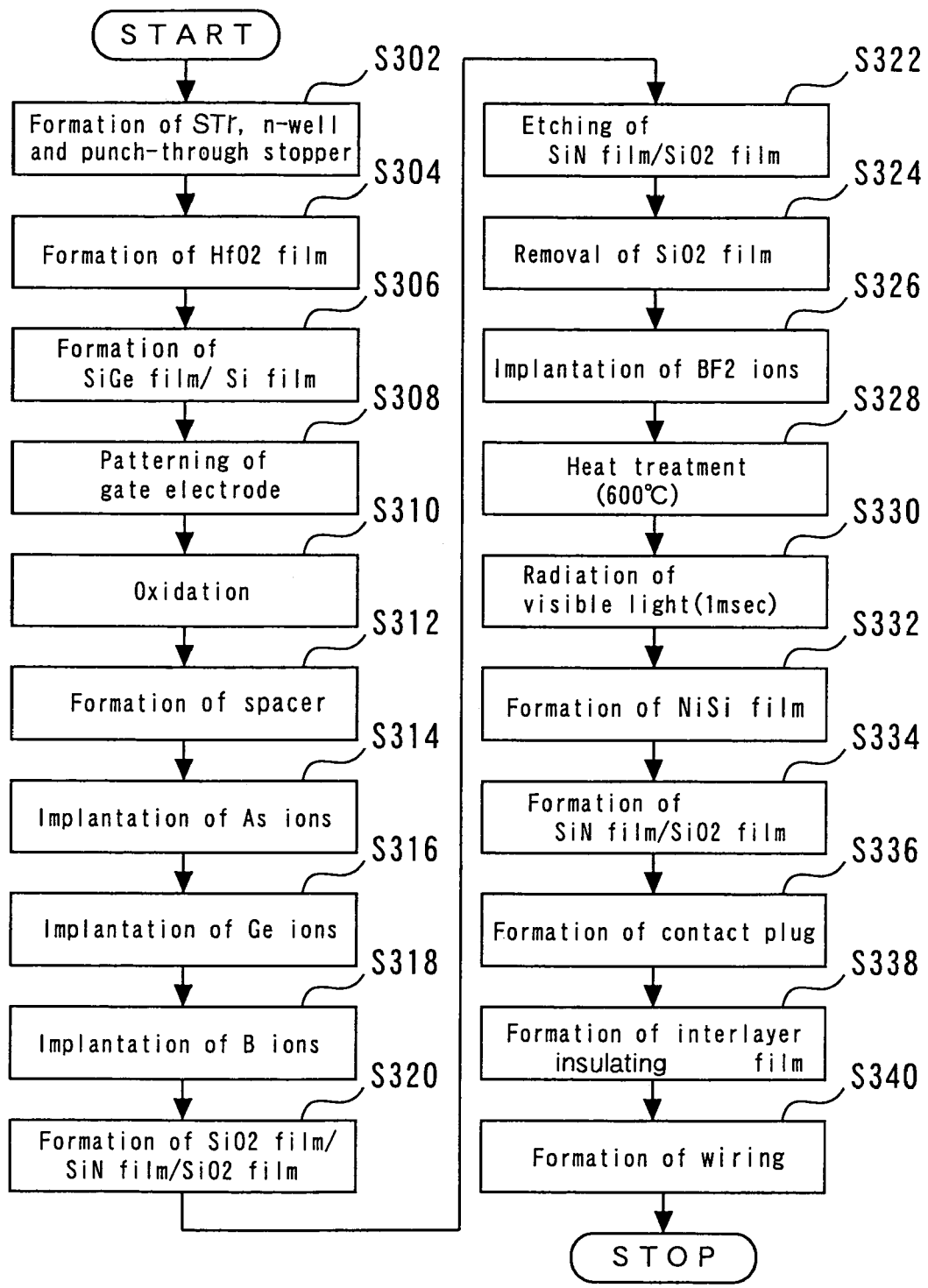
FIG. 22 is a flow diagram for illustrating the method for manufacturing the semiconductor device 300 according to the third embodiment of the present invention.

FIG. 22 is a flow diagram for illustrating the method for manufacturing the semiconductor device 300 according to the third embodiment of the present invention.

The method for manufacturing the semiconductor device 300 is similar to the method for manufacturing the semiconductor device 100 described in the first embodiment. However, in the semiconductor device 300, as described above, a high-dielectric-constant film composed of an HfO$_2$ film is used as the gate insulating film 56 unlike the semiconductor device 100. Therefore, the step for forming the gate insulating film 56 is somewhat different from the steps for forming the gate insulating film 20 (Steps S104).

Specifically, in place of the formation of the SiO$_2$ film 20 in the first embodiment (Step S104), an HfO$_2$ film is formed (Step S304). Here, a CVD method is used. Thereafter, in the same manner as Steps S106 and S108 in the first embodiment, an SiGe film 22 and an Si film 24 for a gate electrode are formed (Step S306), and these are processed into a gate electrode (Step S308). Here, the HfO$_2$ film 56 is simultaneously etched when the SiGe film 22 and the Si film 24 are etched.

Other parts are formed in the same manner as described in the first embodiment, and a semiconductor device 300 as shown in FIG. 21 is formed.

According to the third embodiment, as described above, in the same manner as in the first embodiment, shallow junction can be realized, and B ions implanted into the diffusion layers can be activated by preventing the junction of the diffusion layer from extending. Thereby, the variation of the threshold voltage, and favorable device properties can be obtained even when the gate length is short. In the third embodiment, an HfO$_2$ film is used as the gate insulating film. When a metal oxide film such as the HfO$_2$ film is used, the crystallization of the gate insulating film during later heat treatment usually becomes a problem. According to the method described in the third embodiment, the radiation of visible light can control the heat-treatment temperature after forming the gate insulating film 56 to be low. Therefore, the recrystallization of the gate insulating film 56 can be inhibited, and the leak current at the crystal grain boundaries can be prevented. Thereby a semiconductor device having favorable device characteristics can be obtained.

In the third embodiment, the use of an HfO$_2$ film as the gate insulating film 56 is described. However, the present invention is not limited thereto, but other high-dielectric-constant materials, such as Al$_2$O$_3$, HfAl$_x$O$_y$, and HfSiO$_4$, can be used. The gate electrode is not limited to the laminated structure composed of the SiGe film 22, the Si film 24 and the NiSi film 26, but for example, a metal gate composed of a TiN film 52 described in the second embodiment, or the like, can also-be used.

For example, the Si substrate 2 in the first to third embodiments corresponds to the substrate of the present invention, the amorphous region 10 corresponds to the amorphous layer of the present invention, and the extensions 12 and the source-drain region 14 correspond to the diffusion layers of the present invention.

Also the step for forming the gate of the present invention can be carried out by, for example, carrying out Steps S104 to S108 in the first embodiment, Steps S204 to S208 in the second embodiment, and Steps S304 to S308 in the third embodiment. Also for example, by carrying out Steps S116, S216, and S 316 of the first, second, and third embodiments, respectively, the step for forming the amorphous region can be carried out. Also for example, by carrying out Steps S118, S218, and S 318 of the first, second, and third embodiments, respectively, the step for forming a diffusion layer can be carried out. Also for example, by carrying out Steps S120 to S124, S220 to S224, and S 320 to S324 of the first, second, and third embodiments, respectively, the step for forming the sidewalls can be carried out; and simultaneously, carrying out Steps S120, S220, and S320, respectively, the step for performing heat treatment can be carried out. Also for example, by carrying out Steps S126, S226, and S 326 of the first, second, and third embodiments, respectively, the step for concentrating can be carried out; and by carrying out Steps S130, S230, and S 330, the step for radiating visible light can be carried out.

Fourth Embodiment

Figure 23:
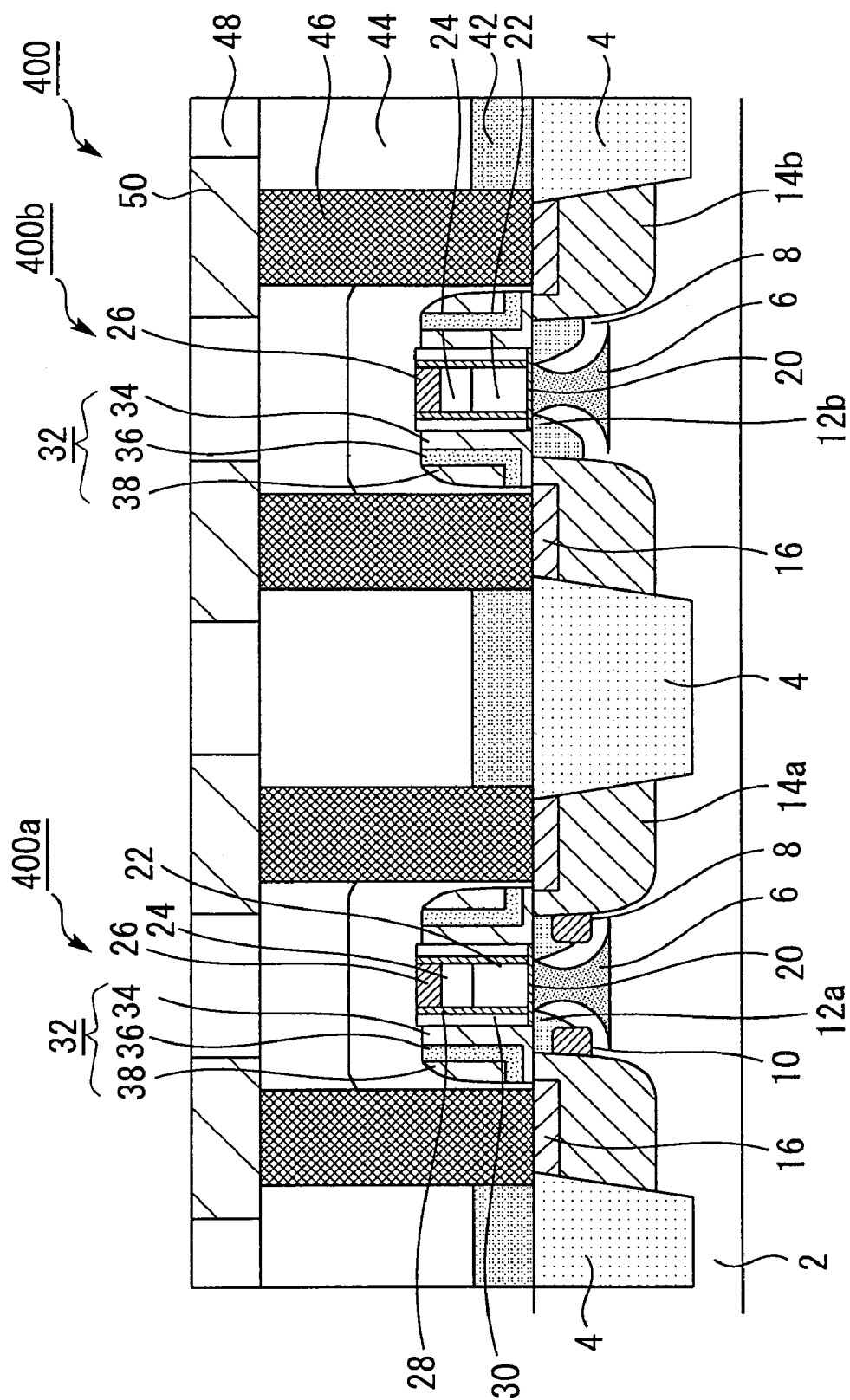
FIG. 23 is a sectional schematic diagram for illustrating the semiconductor device 400 according to the fourth embodiment of the present invention.

FIG. 23 is a sectional schematic diagram for illustrating the semiconductor device 400 according to the fourth embodiment of the present invention.

The semiconductor device 400 is similar to the semiconductor device 100. However, as FIG. 23 shows, the semiconductor device 400 is a CMOSFET wherein a pMOS 400a and an nMOS 400b are formed in a chip, different from the semiconductor device 100, which is a p-channel MOSFET.

The structure of the pMOS 400a is identical to the structure of the semiconductor device 100 described in the first embodiment. The nMOS 400b is also similar to the semiconductor device 100, and similarly to the pMOS 400a, extensions 12a of a shallow junction depth and a low concentration, and source-drain regions 14a of a deep junction depth and a high concentration are formed on an Si substrate 2. However, As, which is an n-type impurity, is implanted in place of a p-type impurity such as B into the diffusion layer composed of the extensions 12b and the source-drain regions 14b. No amorphous region 10 is formed in the nMOS 400b.

Figure 24:
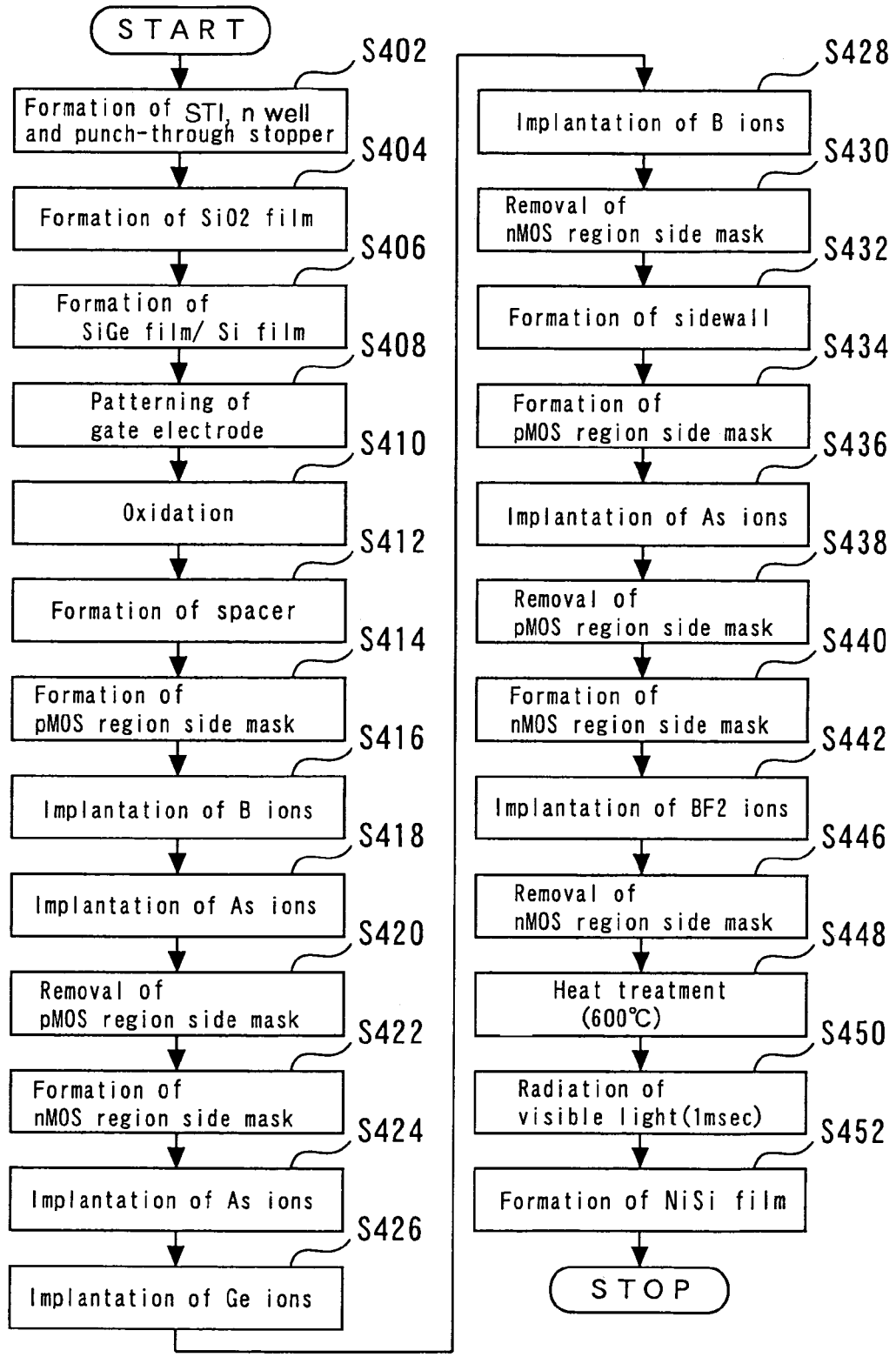
FIG. 24 is a flow diagram for illustrating the method for manufacturing the semiconductor device 400 according to the fourth embodiment of the present invention.
Figure 25:
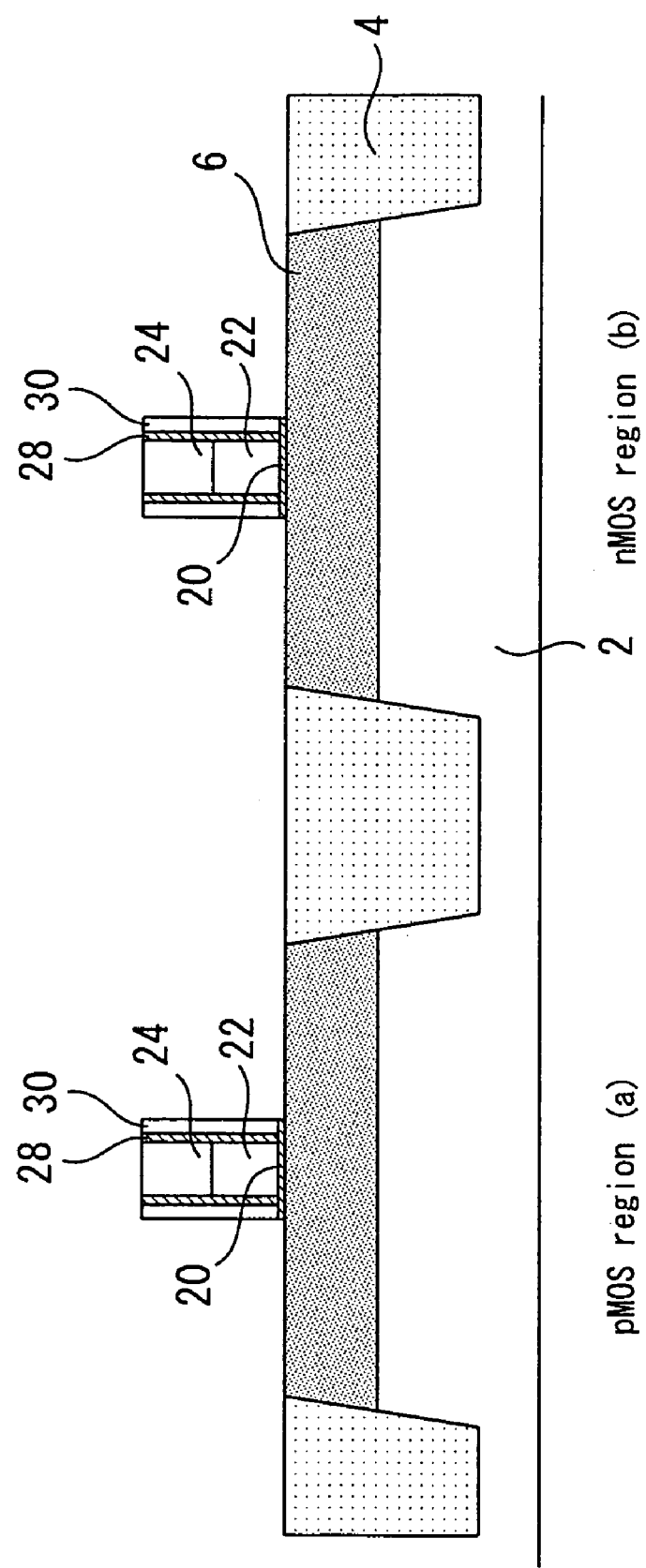
FIGS. 25 to 31 are sectional schematic diagrams for illustrating the states in each manufacturing step of the semiconductor device 400 according to the fourth embodiment of the present invention.
Figure 31:
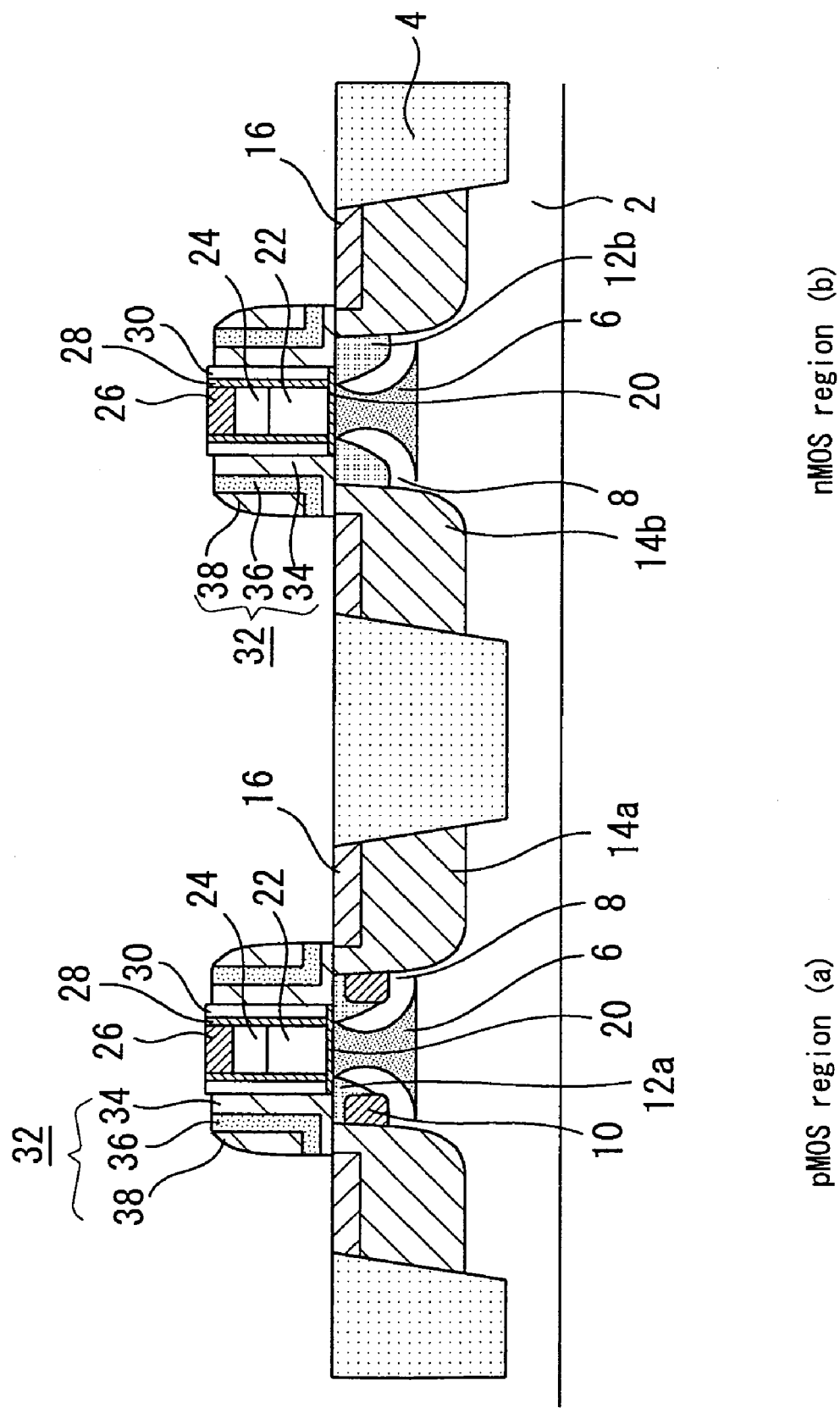

FIG. 24 is a flow diagram for illustrating the method for manufacturing the semiconductor device 400 according to the fourth embodiment of the present invention. FIGS. 25 and 31 are sectional schematic diagrams for illustrating the states in each manufacturing step of the semiconductor device 400.

The method for manufacturing the semiconductor device 400 is similar to the method for manufacturing the semiconductor device 100 described in the first embodiment. However, as described above, since the semiconductor device 400 is a CMOS wherein a pMOS 400a and an nMOS 400b are formed, the manufacturing method is somewhat different.

The method for manufacturing a semiconductor device 400 according to the fourth embodiment of the present invention will be specifically described below referring to FIGS. 23 to 31.

First, in the same manner as Step S102 in the first embodiment, an STI 4, wells, and punch-through stoppers 6 are formed in an Si substrate 2 (Step S402). In this embodiment, however, the area on the Si substrate 2 is divided into at least two types of active regions of a pMOS region (a) and an nMOS region (b) by the STI4. In the pMOS region (a), n-type ions such as P ions are implanted to form an n-well. On the other hand, in the nMOS region (b), p-type ions such as B ions are implanted to form a p-well. Furthermore, in the pMOS region (a), n-type ions such as As ions are implanted, and in the nMOS region (b), p-type ions such as In ions are implanted to form a punch-through stopper 6 in each of the regions (a) and (b).

Next, as FIG. 25 shows, in the same manner as Steps S104 to S112 in the first embodiment, gate insulating films ($SiO_2$ films) 20, gate electrodes (SiGe films 22 and Si films 24), oxide films 28, and spacers 30 are formed on the Si substrate 2 (Steps S404 to S412). In this embodiment, the gate electrodes and the like are formed in each of the pMOS region (a) and the nMOS region (b).

Figure 26:
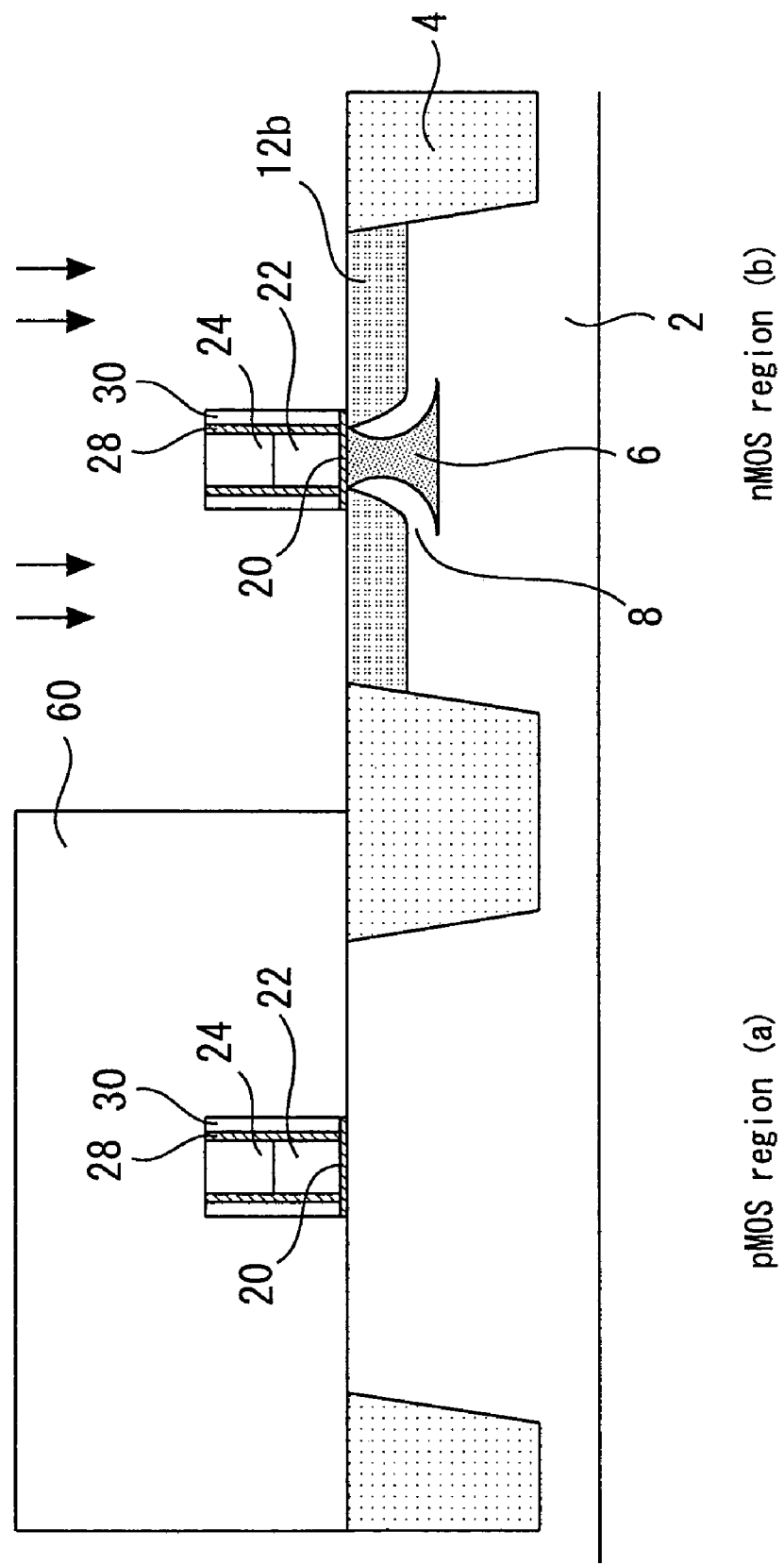

Next, as FIG. 26 shows, a resist mask 60 that covers the pMOS region (a) is formed (Step S414). Thereafter, B ions are implanted using the resist mask 60, the gate electrode of the nMOS region (b), oxide films 28 and the spacers 30 as masks (Step S416). Thereby, a pocket layer 8 is formed in the nMOS region (b) of the Si substrate 2.

Next, As ions are implanted using the resist mask 60, the gate electrode of the nMOS region (a), oxide films 28 and the spacers 30 as masks (Step S418). Thereby, shallow extensions 12b wherein an n-type impurity is implanted is formed. Here, the ion-implanting energy is about 4 keV, and the dose is about $1 \times 10^{15}$ $cm^{-2}$. Thereafter, the resist mask 60 is removed (Step S420). Thereby, a shallow diffusion layer of a junction depth of about 20 nm is formed.

Figure 27:
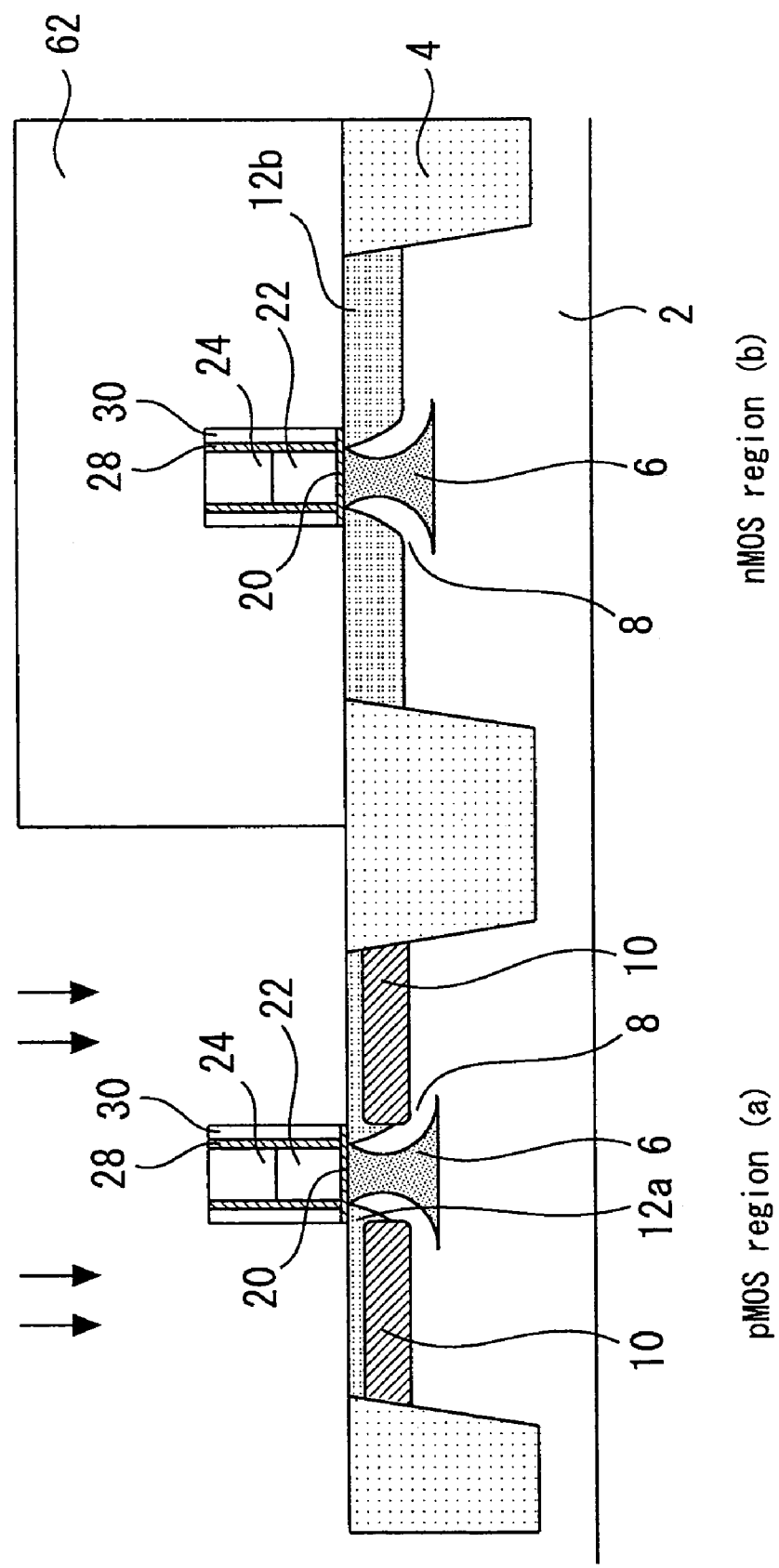

Next, as FIG. 27 shows, a resist mask 62 that covers the nMOS region (b) is formed (Step S422). Thereafter, in the same manner as Steps S114 to S118 in the first embodiment, As ions, Ge ions, and B ions are implanted (Steps S424 to S428). Here, the resist mask 62, the gate electrode of the pMOS region (a), oxide films 28 and the spacers 30 are used masks in implanting ions. Thereby, in the same manner as in the first embodiment, a pocket layer 8, an amorphous region 10, and extensions 12a are also formed on the pMOS region (a) side. Thereafter, the resist mask 62 is removed (Step S430).

Figure 28:
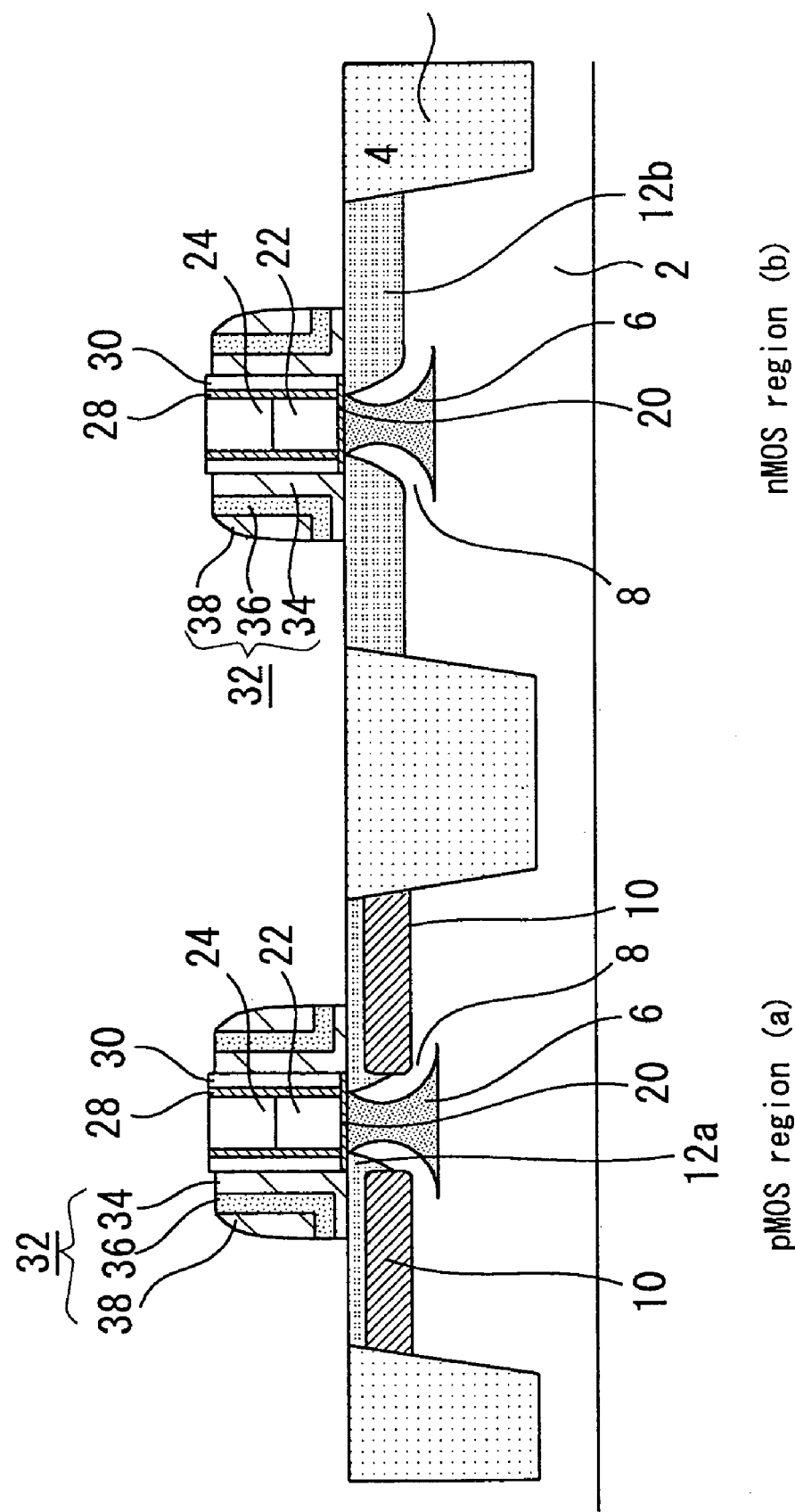

Next, as FIG. 28 shows, in the same manner as Steps S120 to S124 in the first embodiment, sidewalls 32 are formed on the sides of the spacers 30 of the gate electrode formed in the pMOS region (a) and the nMOS region (b) (Step S432). Here, the amorphous region 10 is simultaneously crystallized by the heat at film-forming temperature of about 600° C. in the step for forming the sidewalls 32 as well as the first embodiment.

Figure 29:
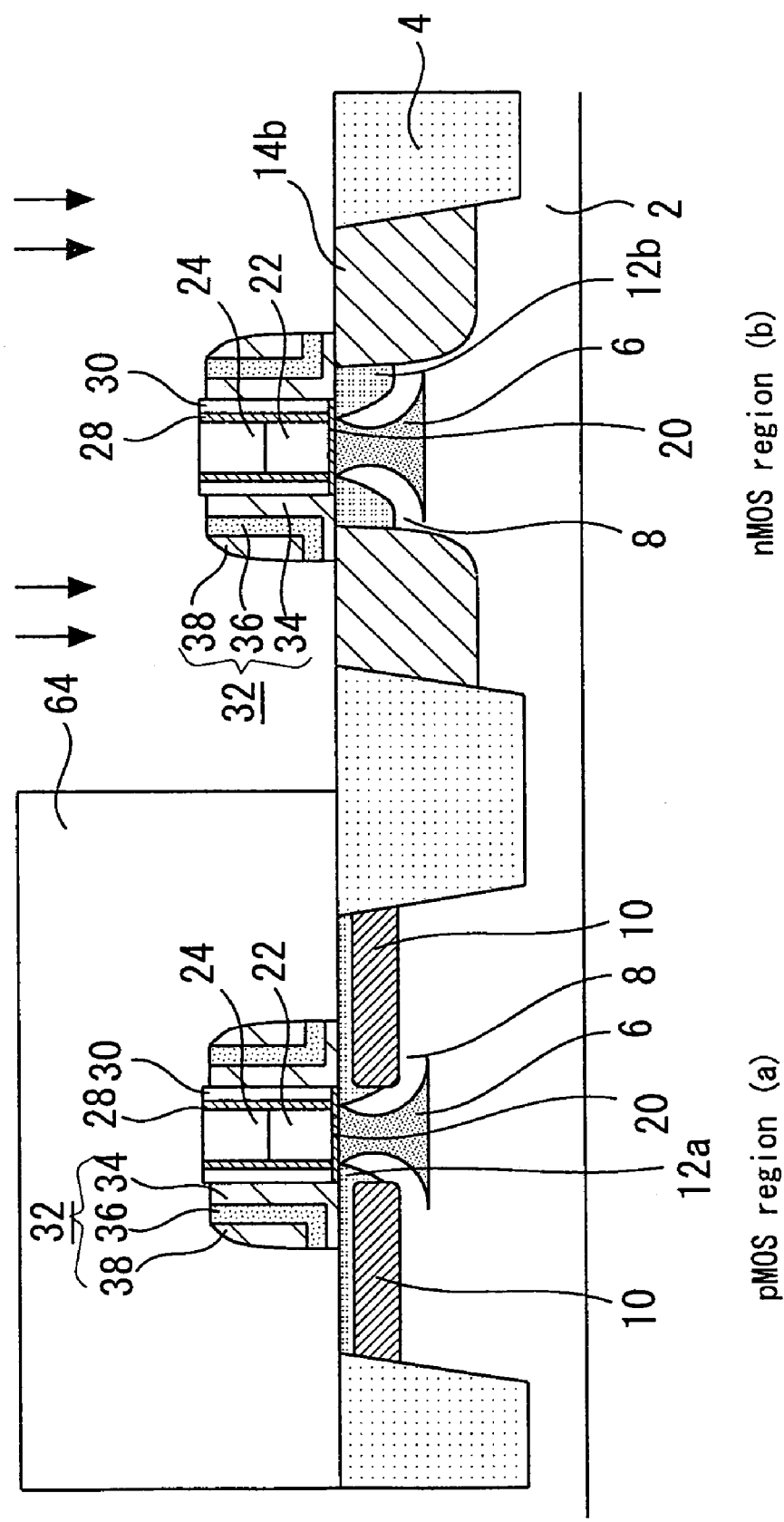

Next, as FIG. 29 shows, a resist mask 64 that covers the pMOS region (a) is formed again (Step S434). Thereafter, As ions are implanted (Step S436). Here, the resist mask 64, the gate electrode, the oxide film 28, spacers 30, and sidewalls 32 are used as masks. At this time, the ion-implanting energy is about 40 keV, and the dose is about $5 \times 10^{15}$ $cm^{-2}$. Thereby a source-drain region 14b, which is a diffusion layer having a junction depth as deep as 60 to 80 nm, and a high impurity concentration, is formed in the nMOS region (b). Thereafter, the resist mask 64 is removed (Step S438).

Figure 30:
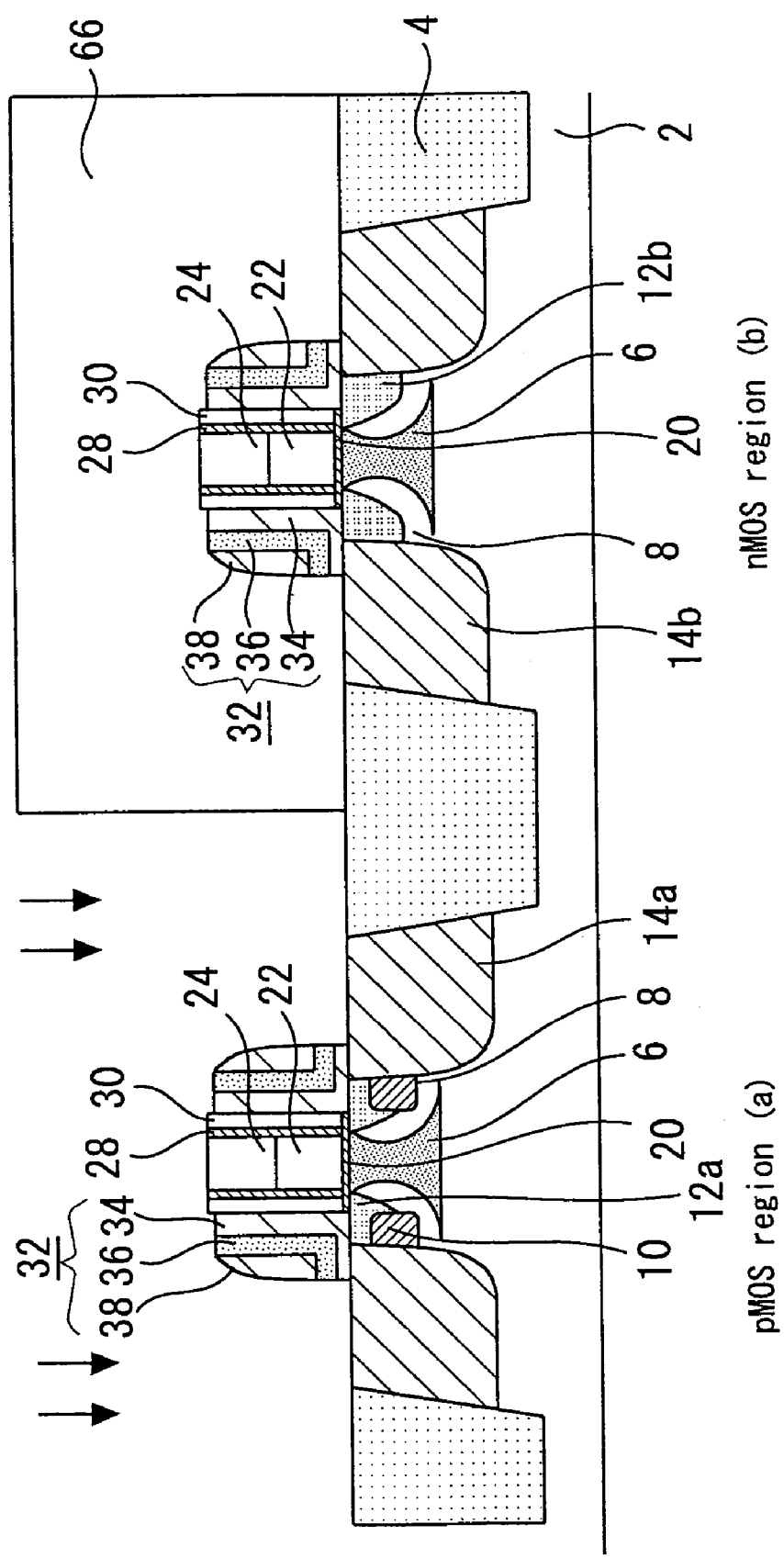

Next, as FIG. 30 shows, a resist mask 66 that covers the nMOS region (b) is formed (Step S440). Thereafter, $BF_2$ ions are implanted (Step S442). Here, the resist mask 66, the gate electrode, the oxide film 28, spacers 30, and sidewalls 32 are used as masks. Thereby, a source-drain region 14a, which is a diffusion layer having a deep junction depth and a high impurity concentration, is formed in the pMOS region (a). Thereafter, the resist mask 66 is removed (Step S446).

Next, in the same manner as Steps S128 and S130 of the first embodiment, annealing is performed at a low temperature as about 600° C. (Step S448), and then visible light is radiated for about 1 msec (Step S450). Thereby, recryatallization is promoted, and B ions and the like can be activated. However, since heating time is extremely short, the junction of extensions 12a and 12b, and source-drain regions 14a and 14b are prevented from extending.

Next, as FIG. 31 shows, in the same manner as Step S132 of the first embodiment, NiSi films 16 and 26 are formed (Step S452). Furthermore, in the same manner as Steps S134 to S140 of the first embodiment, an SiN film 42, an $SiO_2$ film 44, contact plugs 46, interlayer insulating film 48, and wirings 50 are formed.

Thus, a semiconductor device 400 as shown in FIG. 23 is formed.

According to the fourth embodiment, as described above, the activation of source-drain regions 14a and 14b, and extensions 12a and 12b can be simultaneously performed while realizing shallow junction even in a CMOS having both pMOS 400a and nMOS 400b. Therefore, the variation of threshold voltage, and leak current can be inhibited, and favorable device characteristics can be obtained in the CMOS for LOP having a short gate length and a shallow junction.

In the fourth embodiment, the use of an SiO$_2$ film as the gate insulating film 20, and the use of an electrode of a laminated structure composed of an SiGe film 22, an Si film 24, and an NiSi film 26 as the gate electrode are described. However, the gate insulating film 20 and the gate electrode of the present invention are not limited thereto. For example, as described in the second embodiment, a high-dielectric-constant film such as an HfO$_2$ film may be used as a gate insulating film; and as described in the third embodiment, a metal gate such as TiN may also be used as a gate electrode. Thus, similar effects to the second and third embodiments can be obtained.

Since other aspects are same as those in the first embodiment, the description thereof will be omitted.

For example, the Si substrate 2 of the fourth embodiment corresponds to the substrate of the present invention, the nMOS region (b) corresponds to the first active region, and the pMOS region (a) corresponds to the second active region.

For example, the step for isolation of the present invention can be carried out by carrying out Step S402 in the fourth embodiment; and the step for forming the gate of the present invention can be carried out by carrying out Steps S406 and S408 in the fourth embodiment. Also for example, by carrying out Steps S418 and S 428 of the fourth embodiment, the step for forming first and second diffusion layer of the present invention can be carried out; and by carrying out Steps S436 and S 442, the step for concentrating first and second diffusion layer can be carried out. Also for example, by carrying out Steps S426 and S442 of the fourth embodiment, the step for forming the amorphous region and the second amorphous region can be carried out, respectively. Also for example, by carrying out Step S432 of the fourth embodiment, the step for forming the sidewalls and for performing heat treatment can be carried out.

Fifth Embodiment

Figure 32:
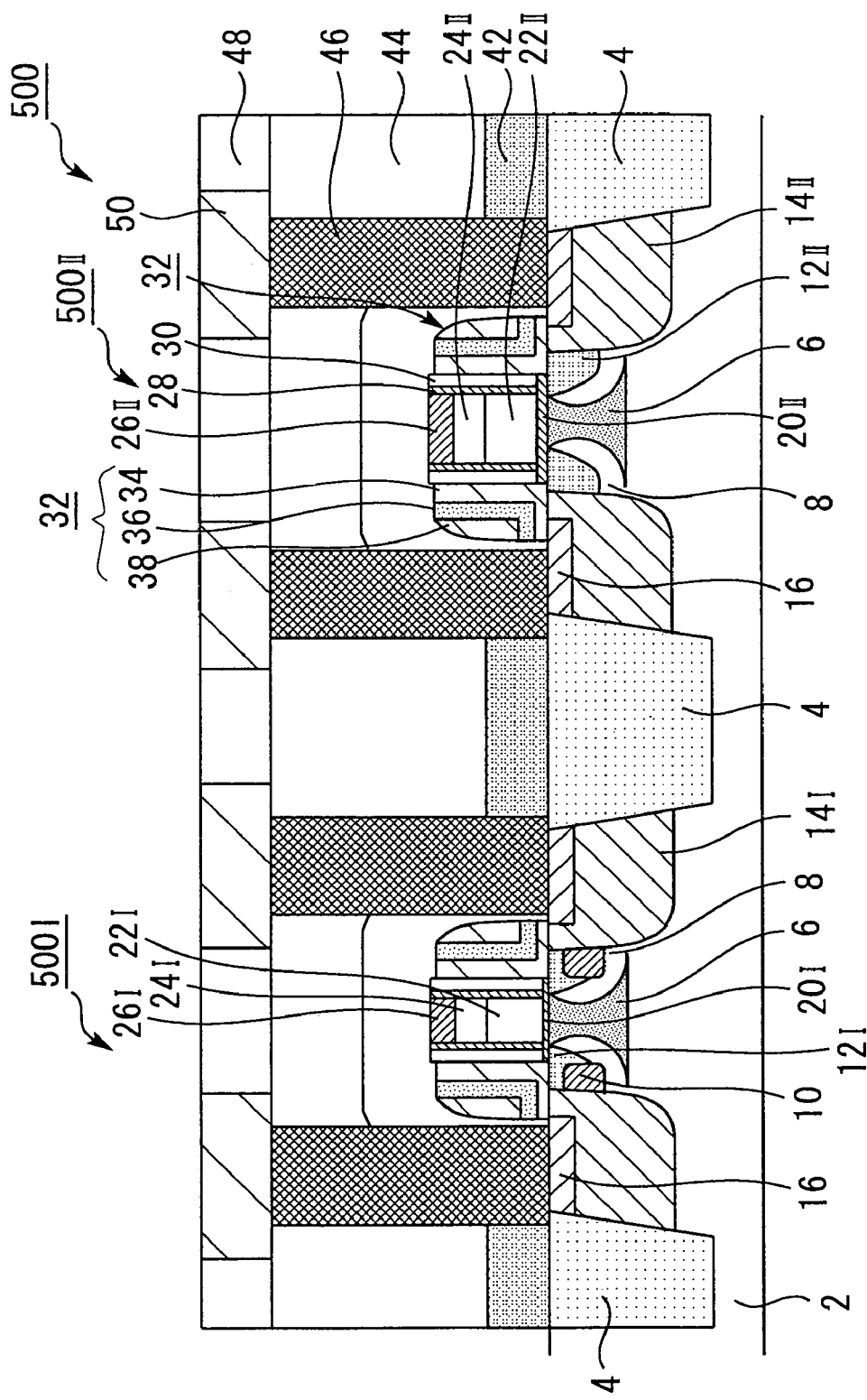
FIG. 32 is a sectional schematic diagram for illustrating the semiconductor device 500 according to the fifth embodiment of the present invention.

FIG. 32 is a sectional schematic diagram for illustrating the semiconductor device 500 according to the fifth embodiment of the present invention.

The semiconductor device 500 is a system LSI having a p-channel MOSFET for LOP (hereafter abbreviated as "pMOS for LOP") 500I and a p-channel MOSFET for LSTP (hereafter abbreviated as "pMOS for LSTP") 500 II in a chip.

In the semiconductor device 500, the pMOS for LOP 500I has the same structure as the semiconductor device 100 described in the first embodiment. On the other hand, in the pMOS for LSTP 500 II, the junction depth of the extensions 12 II and the source-drain regions 14 II is deeper than the junction depth of the extensions 12I and the source-drain regions 14I of the pMOS for LOP 500I, respectively. The thickness of the gate insulating film 20 II is thicker than the gate insulating film 20I for LOP. Furthermore, in the nMOS for LSTP 500 II, a gate having a long gate length is formed. Specifically, the widths (gate lengths) of the gate insulating film 20 II and the gate electrode (SiGe film 22 II/Si film 24 II/NiSi film 26 II) for LSTP are larger than the widths (gate lengths) of the gate electrode (SiGe film 22I/Si film 24I/NiSi film 26I) for LOP.

Here, the pMOS 500I for LOP is a peripheral circuit of the semiconductor device 500, which is a system LSI, and is a high-speed, low-power-consumption transistor. Therefore, gate electrode having a short gate length and diffusion layers having an extremely shallow junction are formed in the pMOS 500I for LOP. On the other hand, the pMOS 500 II for LSTP is a memory portion in the system LSI, and is a transistor that requires little standby current and has a high resistance to large current. Therefore, in the pMOS 500 II for LSTP, the gate is formed to be relatively long, the gate insulating film 20 I is formed to be relatively thick, and diffusion layers (extensions 12 II, source-drain regions 14 II) of a relatively deep junction are formed.

Figure 33:
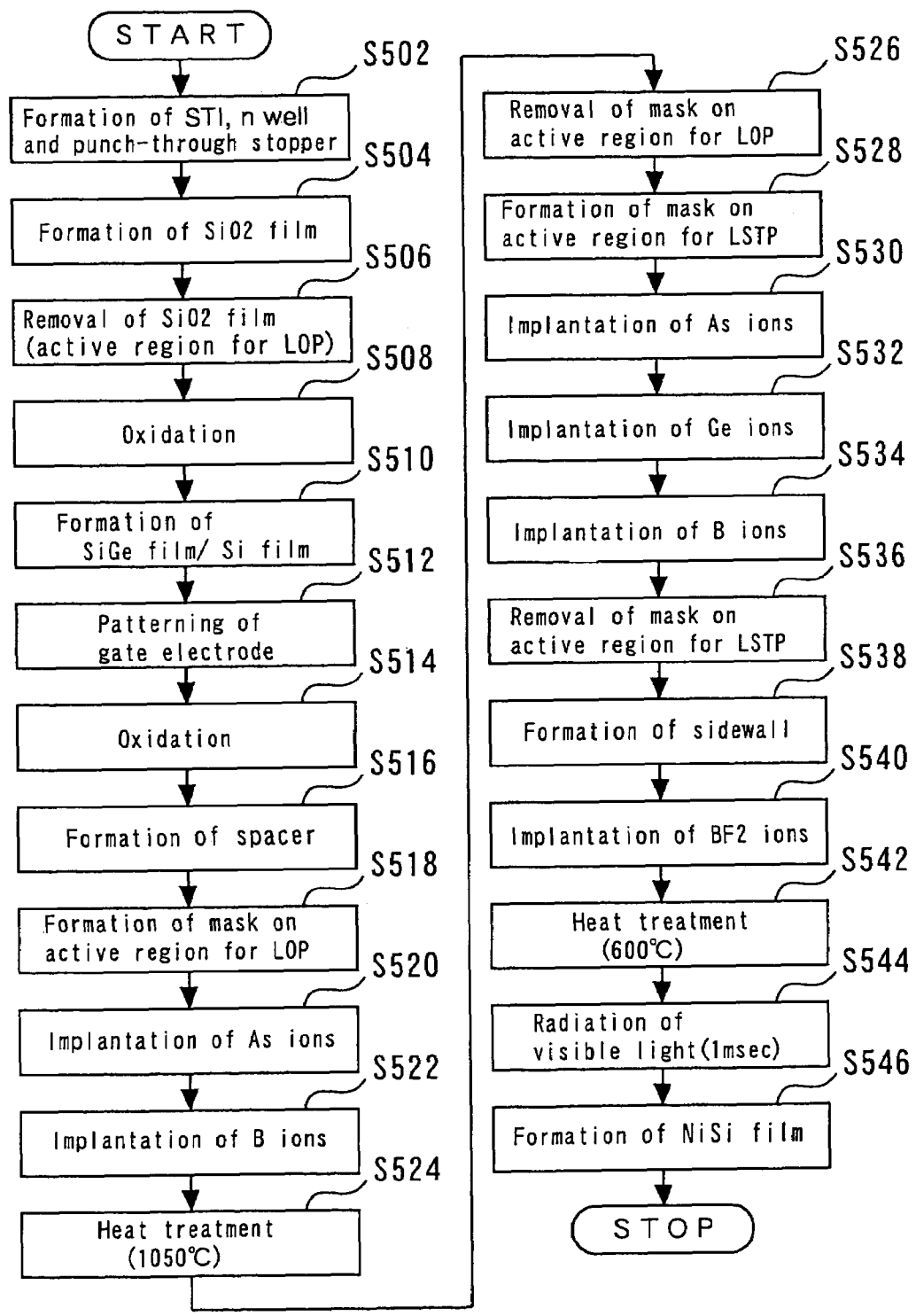
FIG. 33 is a flow diagram for illustrating the method for manufacturing the semiconductor device 500 according to the fifth embodiment of the present invention.

FIG. 33 is a flow diagram for illustrating the method for manufacturing the semiconductor device 500 according to the fifth embodiment of the present invention. FIGS. 34 to 42 are sectional schematic diagrams for illustrating the states in each manufacturing step of the semiconductor device 500.

The method for manufacturing the semiconductor device 500 is similar to the method for manufacturing the semiconductor device 100 described in the first embodiment. However, in the semiconductor device 500, since a pMOS for LSTP 500 II is formed in the same chip, the manufacturing method is different in this portion.

The method for manufacturing a semiconductor device 500 according to the fifth embodiment of the present invention will be specifically described below referring to FIGS. 32 to 42.

Figure 34:
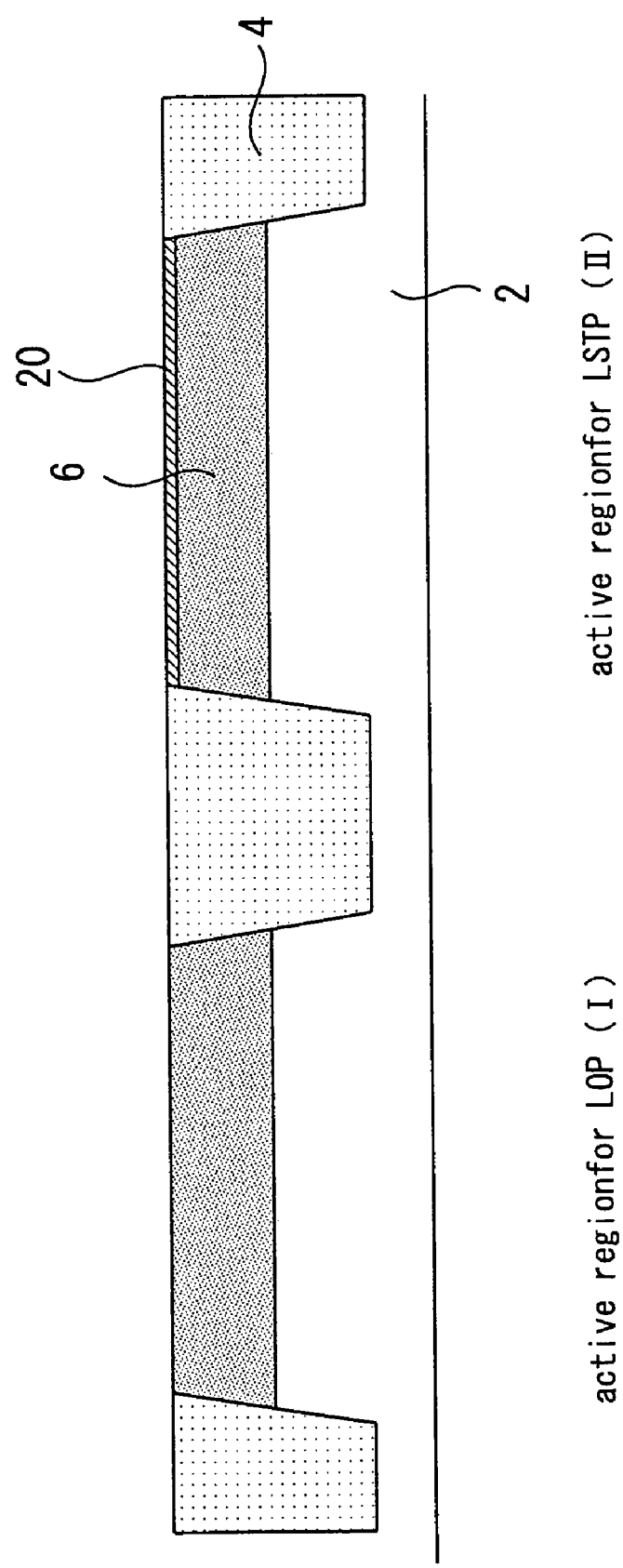
FIGS. 34 to 42 are sectional schematic diagrams for illustrating the states in each manufacturing step of the semiconductor device 500 according to the fifth embodiment of the present invention.

First, as FIG. 34 shows, in the same manner as Step S102 of the first embodiment, an STI 4, n Wells, and punch-through stoppers 6 are formed on an Si substrate 2 (Step S502). In this embodiment, however, the area on the Si substrate 2 is divided into at least two active regions of an active region for LOP (I) and an active region for LSTP (II) by the STI4. An n-well and a punch-through stopper 6 are formed in each of the active region for LOP (I) and the active region for LSTP (II).

Next, a gate insulating film (SiO$_2$ film) 20 is formed on the Si substrate 2 by thermal oxidation (Step S504). Thereafter, as FIG. 34 shows, the SiO$_2$ film 20 on the active region for LOP (I) side is removed (Step S506). Here, a resist mask that covers the active region for LSTP (II) side is formed, and after removing the SiO$_2$ film on the active region for LOP (I) side, the resist mask is removed.

Figure 35:
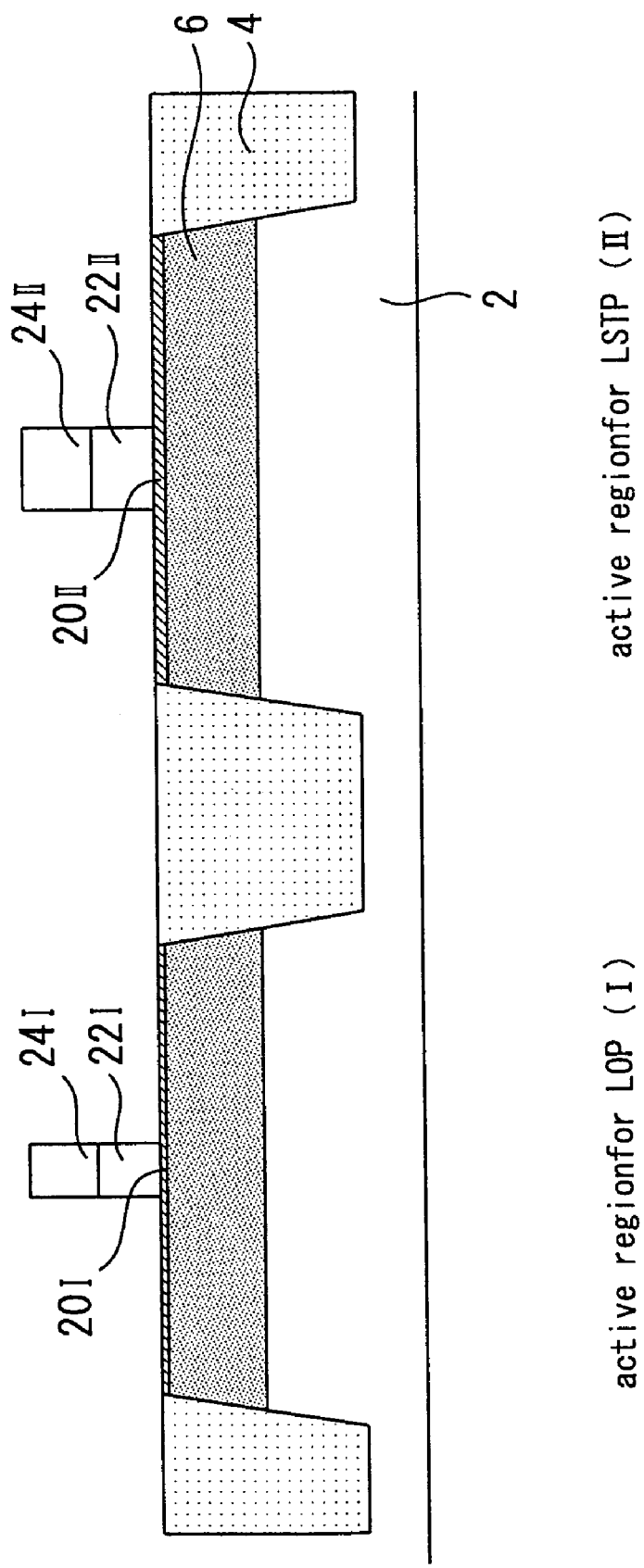

Next, oxidation is performed (Step S508). Thereby, as FIG. 35 shows, an SiO$_2$ film 20I of a thickness of about 1.0 to 1.5 nm is formed again on the active region for LOP (I). In the active region for LSTP (II) side, oxidation further proceeds, and the thickness of the SiO$_2$ film 20 II is thickened to about 1.5 to 2.0 nm. Thus, a thicker SiO$_2$ film 20 II than the SiO$_2$ film 20I on the active region for LOP (I) is formed.

Next, as FIG. 35 shows, in the same manner as Steps S106 and S108 of the first embodiment, a gate electrode is formed in each of the active region for LOP (I) and the active region for LSTP (II) (Steps S510 and S512). In this embodiment, however, the gate length of the gate electrode for LOP is different from the gate length of the gate electrode for LSTP. Specifically, an SiGe film 22I and an Si film 24I are formed in the active region for LOP (I) side as a relatively short gate electrode of about 30 to 40 nm; whereas an SiGe film 22 II and an Si film 24 II are formed in the active region for LSTP (II) side as a relatively long gate electrode of about 50 to 70 nm.

Figure 36:
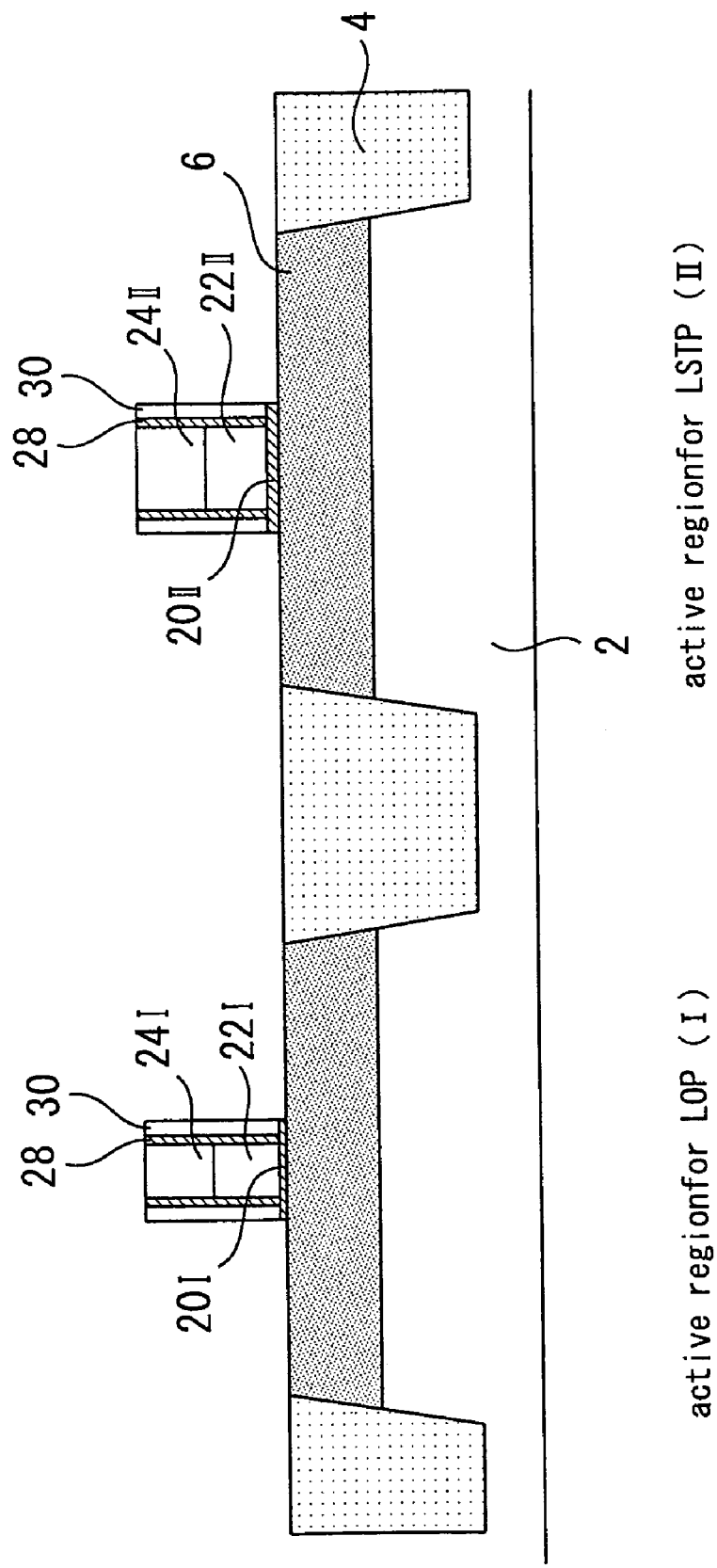

Thereafter, as FIG. 36 shows, in the same manner as Steps S110 and S112 in the first embodiment, an oxide film 28 and a spacer 30 are formed on the side of each gate electrode (Steps S 514 and S 516).

Figure 37:
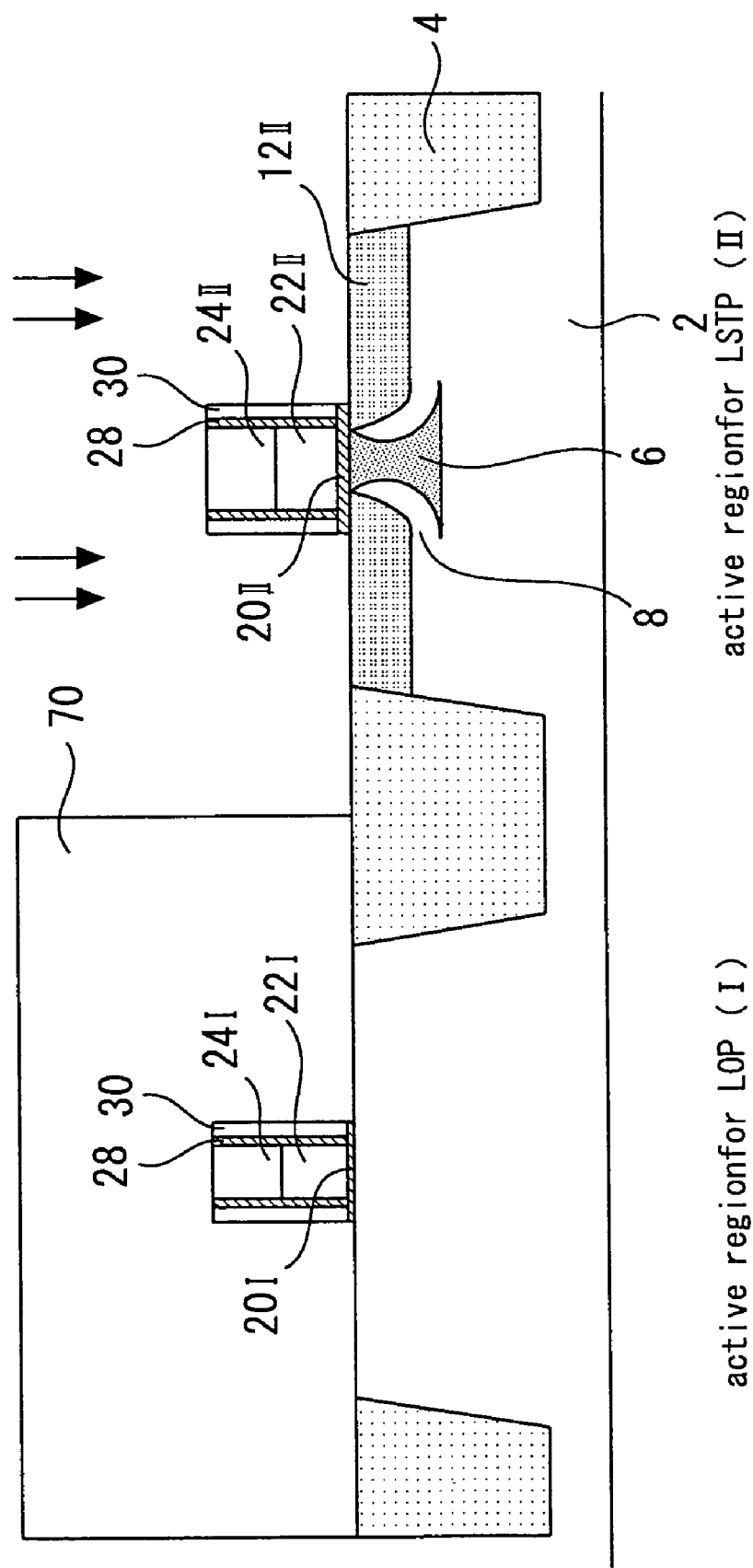

Next, as FIG. 37 shows, a resist mask 70 that covers the active region for LOP (I) side is formed (Step S518).

Thereafter, the implantation of As ions (Step S520) and the implantation of B ions (Step S522) are performed using the resist mask 70, and the gate electrode, the oxide film 28 and the spacer 30 of the active region for LSTP (II) as masks. Thereby, a pocket layer 8 and extensions 12 II are formed on the Si substrate 2 of the active region for LSTP (II) Next, heat treatment is performed (Step S524). Here, the temperature of the heat treatment is as high as about 1050° C. Thereby, the extensions 12 II in the active region for LSTP (II) side are activated to become rather deep diffusion layers having a junction depth of about 30 nm. Thereafter, the resist mask 70 is removed (Step S526).

Figure 38:
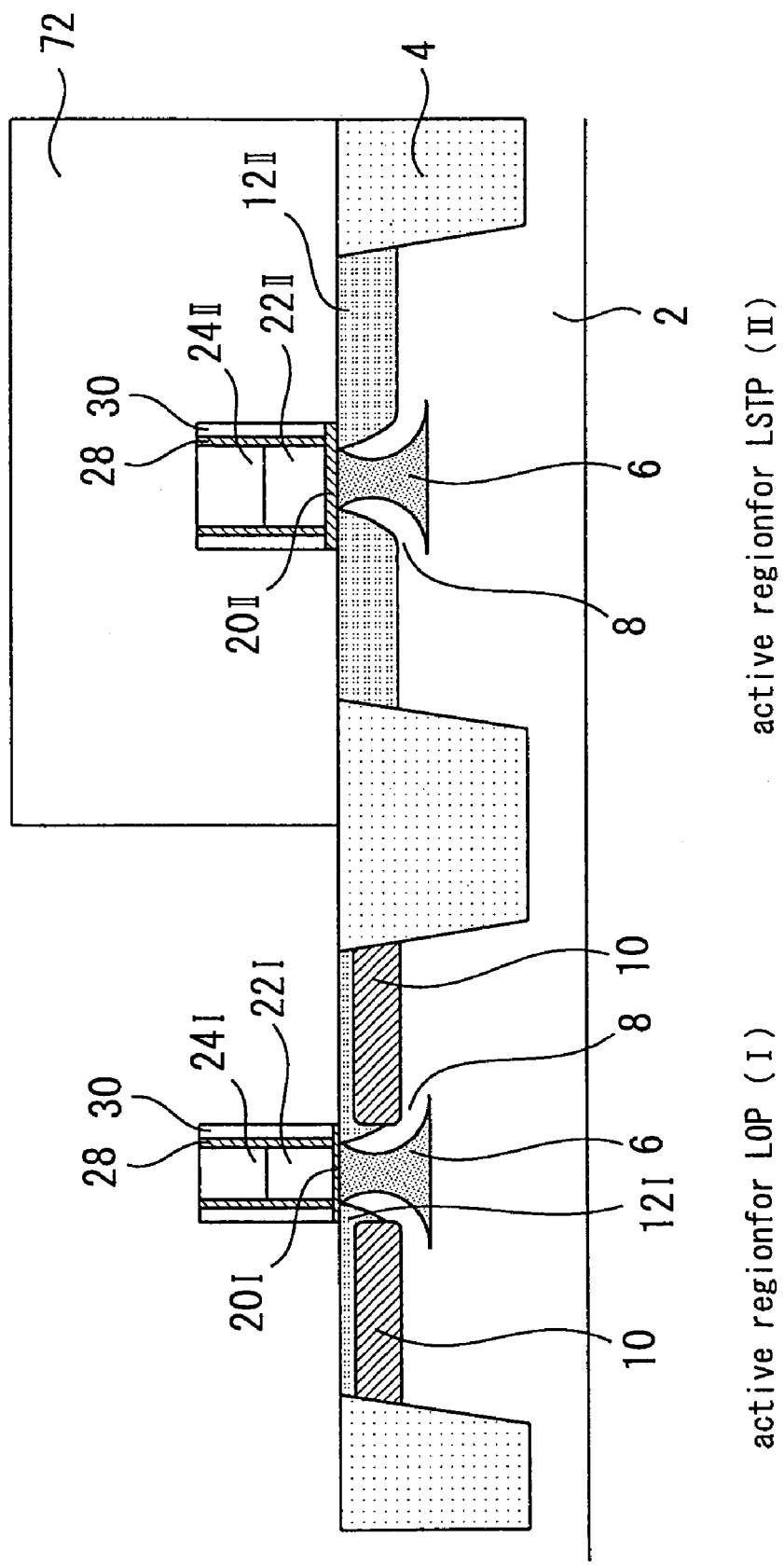

Next, as FIG. 38 shows, a resist mask 72 that covers the active region for LSTP (II) side is formed (Step S528). Thereafter, in the same manner as Steps S114 to S118 in the first embodiment, the implantation of As ions (Step S530), the implantation of Ge ions (Step S532), and the implantation of B ions (Step S534) are performed. Here, the resist mask 72, and the gate electrode, the oxide film 28 and the spacer 30 of the active region for LOP (I) are used as masks in implanting ions. Thereby, as in the first embodiment, a pocket layer 8, an amorphous region 10, and extensions 12I are formed in the active region for LOP (I). Thereafter, the resist mask 72 is removed (Step S536).

Figure 39:
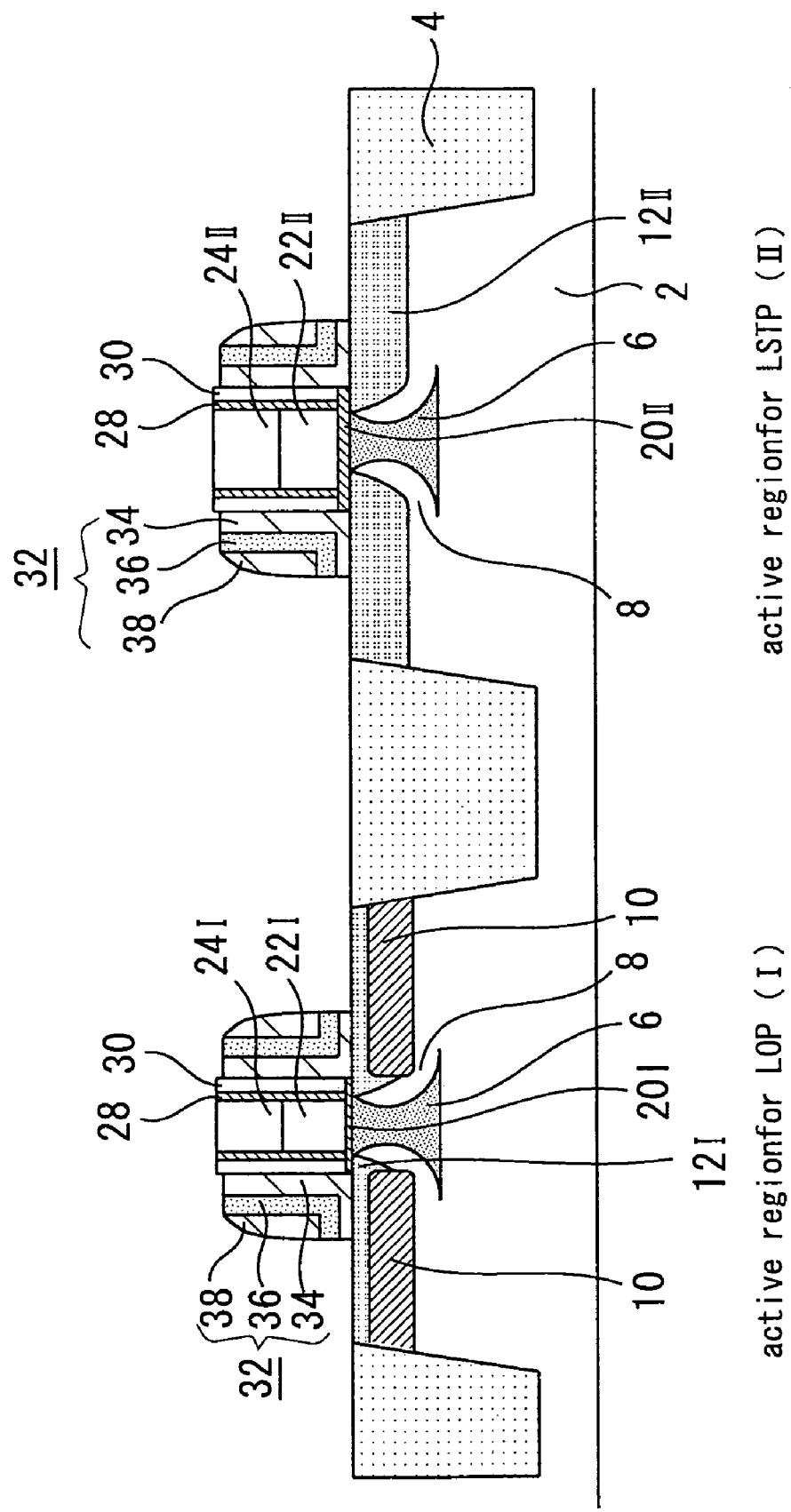

Next, as FIG. 39 shows, in the same manner as Steps S120 to S124, sidewalls 32 are formed on the sides of the spacers 30 of the gate electrodes formed in the active region for LOP (I) and the active region for LSTP (II). In this time, the temperature for forming the sidewalls 32 is about 600° C. By this heat treatment, the amorphous region 10 is crystallized also in the active region for LOP (I), and B ions implanted in the extensions 12I are disposed on the lattice positions of Si.

Figure 40:
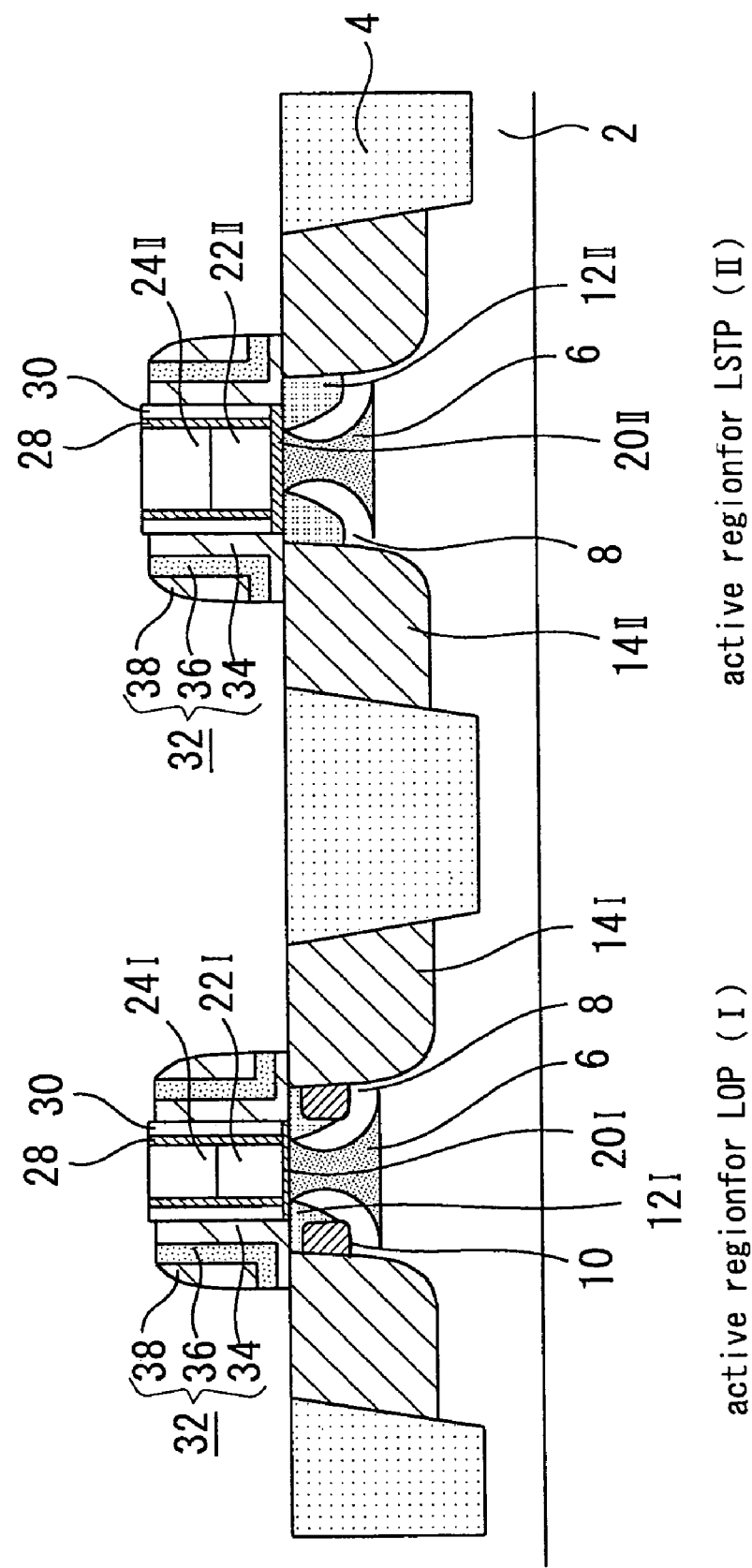

Next, $BF_2$ ions are implanted (Step S540). Here, the gate electrodes, the oxide films 28, the spacers 30, and the sidewalls 32 are used as masks. Thereby, as FIG. 40 shows, source-drain regions 14I and 14 II, which are diffusion layers having a deep junction depth and a high impurity concentration, are formed in the active region for LOP (I) and the active region for LSTP (II), respectively.

Figure 41:
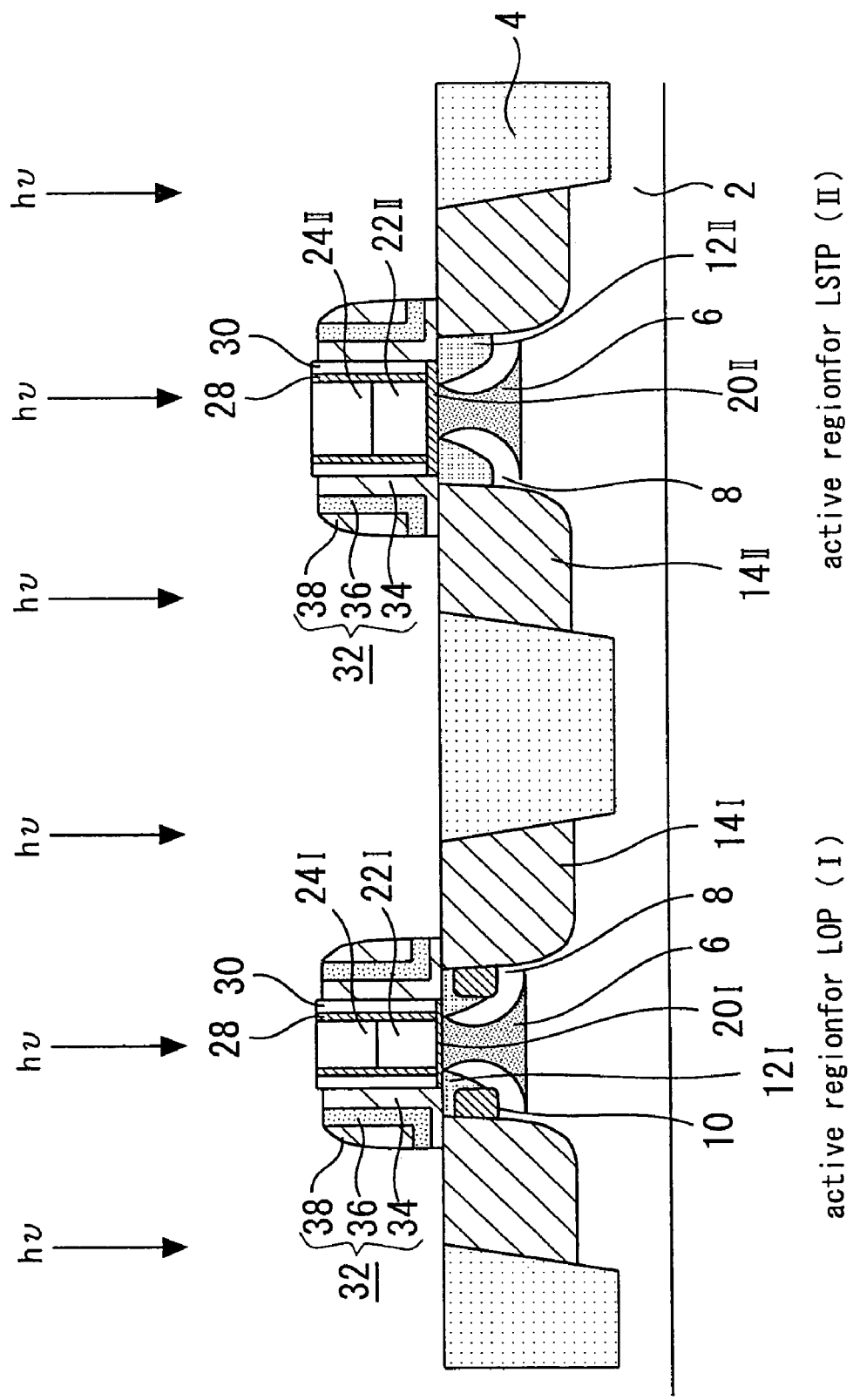

Next, as FIG. 41 shows, in the same manner as Steps S128 and S130 in the first embodiment, low-temperature annealing is performed at about 600° C. (Step S542), and then, visible light is radiated for about 1 msec (Step S544). Thereby, recrystallization is promoted, and B ions can be activated; however, the junction of the extensions 12I and 12 II, and the source-drain regions 14I and 14 II are prevented from extending because of heating for an extremely short time.

Figure 42:
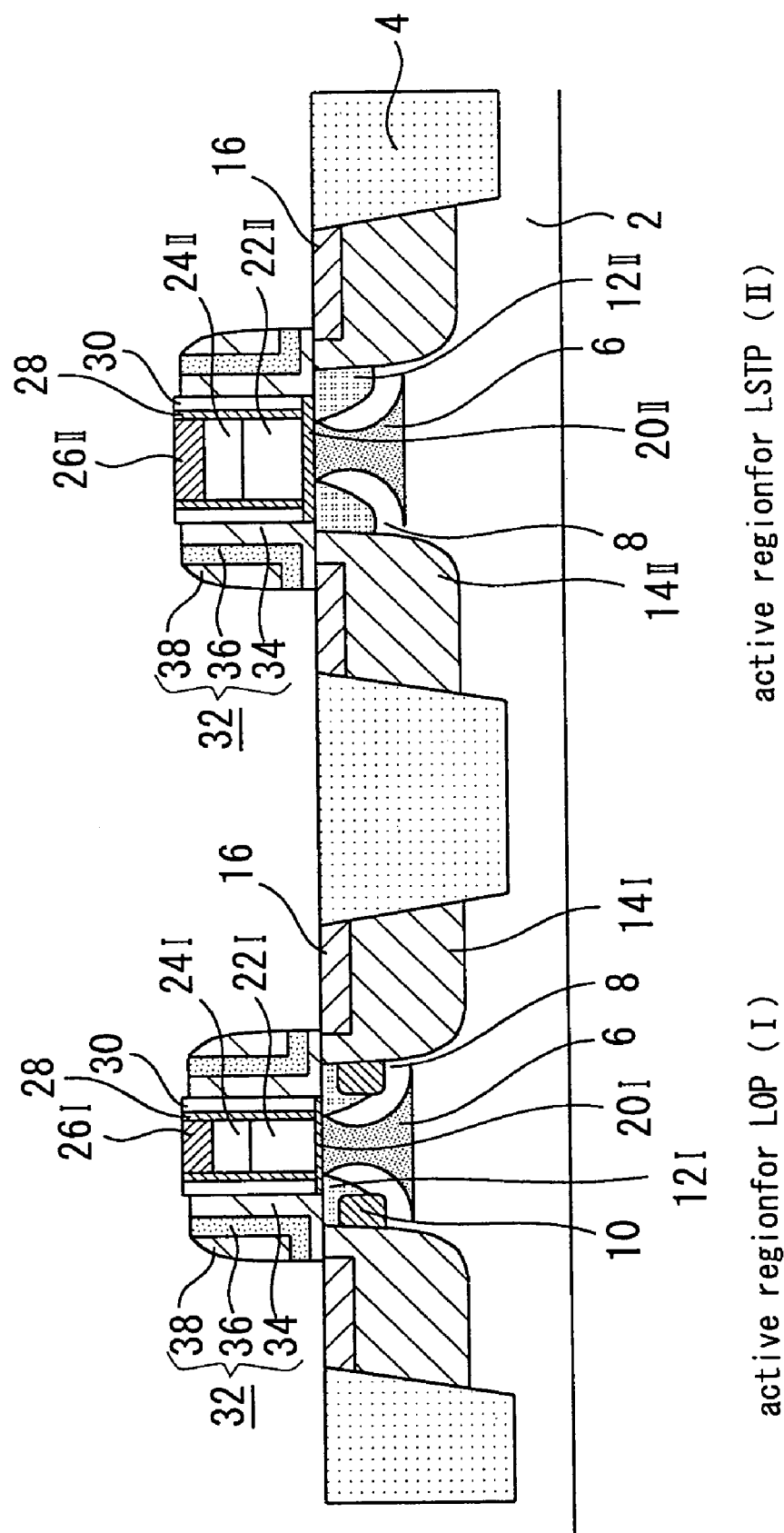

Next, as FIG. 42 shows, in the same manner as Step 132 in the first embodiment, NiSi films 16 and 26 are formed (Step S546). Here, the temperature for forming the NiSi films 16 and 26 is about 500° C. Furthermore, in the same manner as Steps 134 to S140 in the first embodiment, an SiN film 42, an $SiO_2$ film 44, contact plugs 46, an interlayer insulating film 48, and wirings 50 are formed.

Thus, the semiconductor device 500 as shown in FIG. 32 is formed.

According to the fifth embodiment, as described above, sufficient activation can be achieved by heat treatment at 1050° C. after the ion implantation into the extensions 12 II in the pMOS for LSTP 500 II. Thereby, in the pMOS for LSTP 500 II having a small target value of leak current, recrystallization can be promoted, and leak current can be further reduced to a higher target value. On the other hand, in the pMOS for LOP 500I, the extending of junctions can be prevented by forming the extensions 12I and the source-drain regions 14I after this high-temperature heat treatment. In addition, by radiating visible light after forming the extensions 12I and the source-drain regions 14I, the diffusion layers can be activated also in the pMOS for LOP 500I. According to the fifth embodiment, as described above, a transistor for LOP and a transistor for LSTP having favorable device characteristics can be formed on a chip.

In the fifth embodiment, the gate electrode is described for a gate electrode having a laminated structure composed of an SiGe film, an si film, and an NiSi film. However, in the present invention, the gate electrode is not limited thereto. For example, a metal gate such as an TiN gate as described in the second embodiment may also be used as the gate electrode. In this case, the same effect as in the second embodiment can be achieved.

Since other parts are the same as in the first embodiment, the description thereof will be omitted.

Sixth Embodiment

Figure 43:
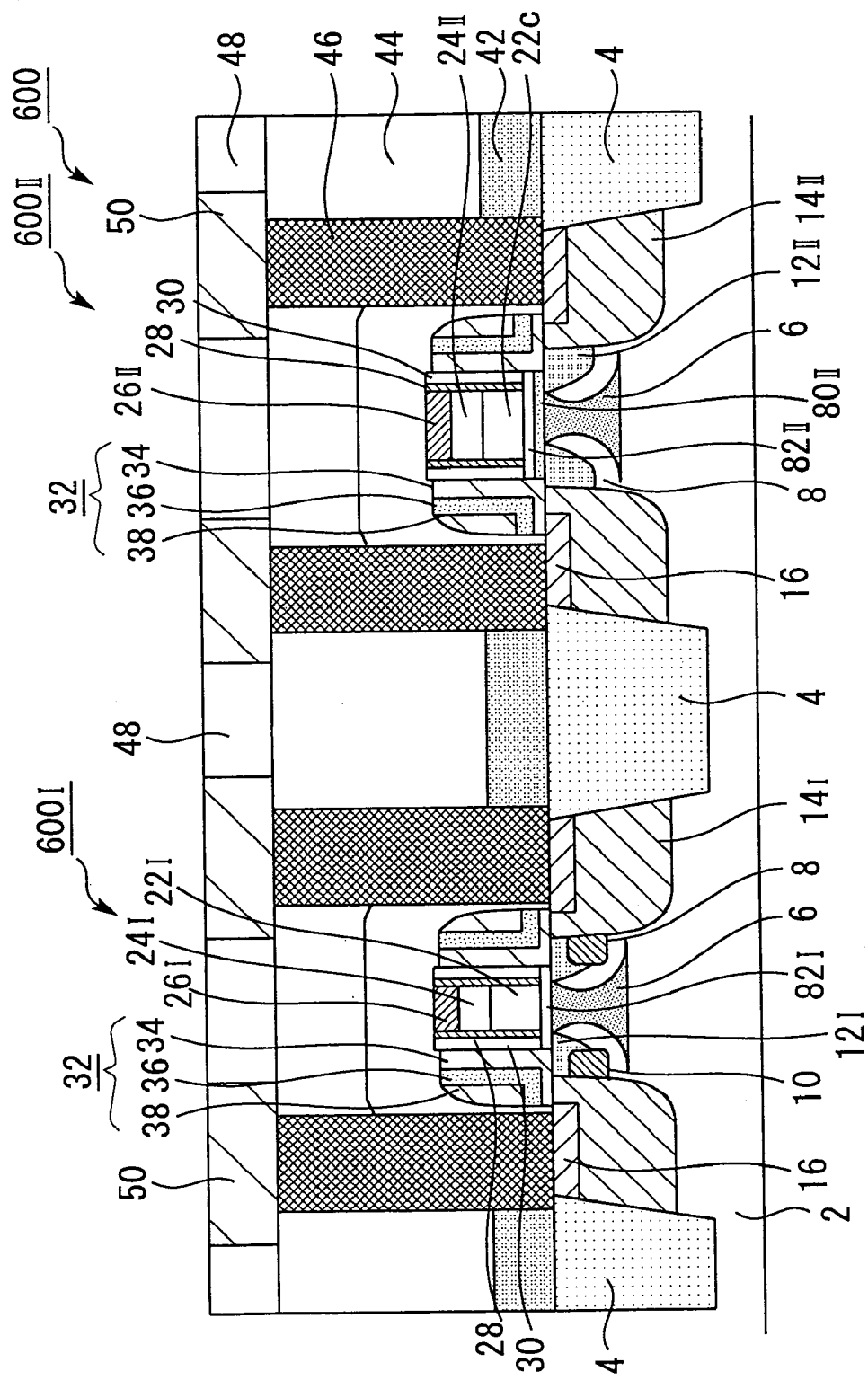
FIG. 43 is a sectional schematic diagram for illustrating the semiconductor device 600 according to the sixth embodiment of the present invention.

FIG. 43 is a sectional schematic diagram for illustrating the semiconductor device 600 according to the sixth embodiment of the present invention.

The semiconductor device 600 is a system LSI having a p-channel MOSFET for LOP (hereafter abbreviated as "pMOS for LOP") 600I and a p-channel MOSFET for LSTP (hereafter abbreviated as "pMOS for LSTP") 600 II in a chip.

The semiconductor device 600 is similar to the semiconductor device 500. However, in the semiconductor device 500, the gate insulating films 20I and 20 II are formed of $SiO_2$ films having different thickness; whereas in the semiconductor device 600, the gate insulating film 82I of the pMOS for LOP 600 I is formed of an HfSiO film, and the gate insulating film of the pMOS for LSTP 600 II is formed of a laminated film composed of an $SiO_2$ film 80 II and an HfSiO film 82 II.

Thus, in the semiconductor device 600, since HfSiO, which has a high dielectric constant, is used as the gate insulating film, equivalent oxide-film thickness (EOT) is reduced. Thereby the ON current of the transistor increases, and the LSI can be operated at a higher speed.

Figure 44:
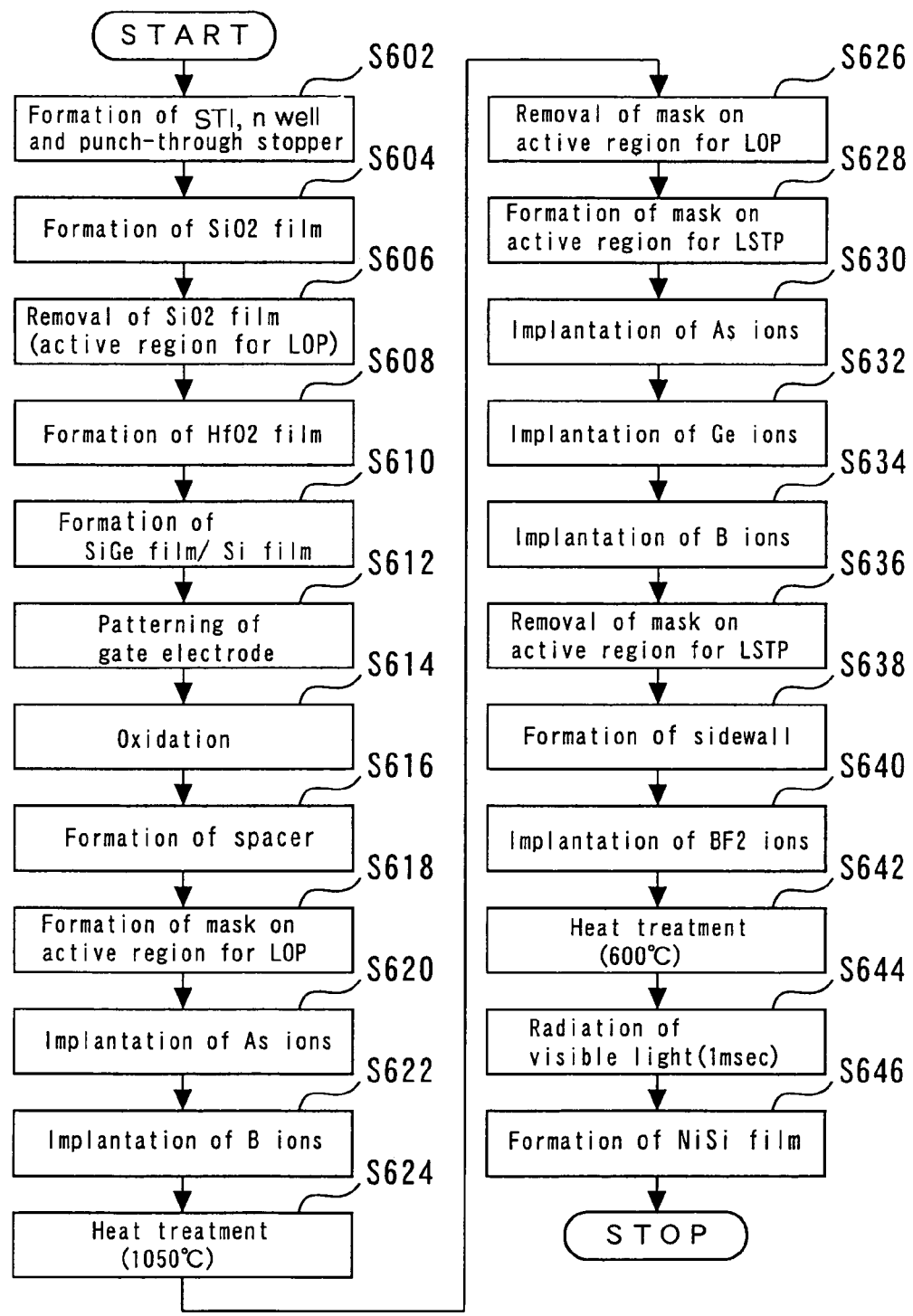
FIG. 44 is a flow diagram for illustrating the method for manufacturing the semiconductor device 600 according to the sixth embodiment of the present invention.
Figure 45:
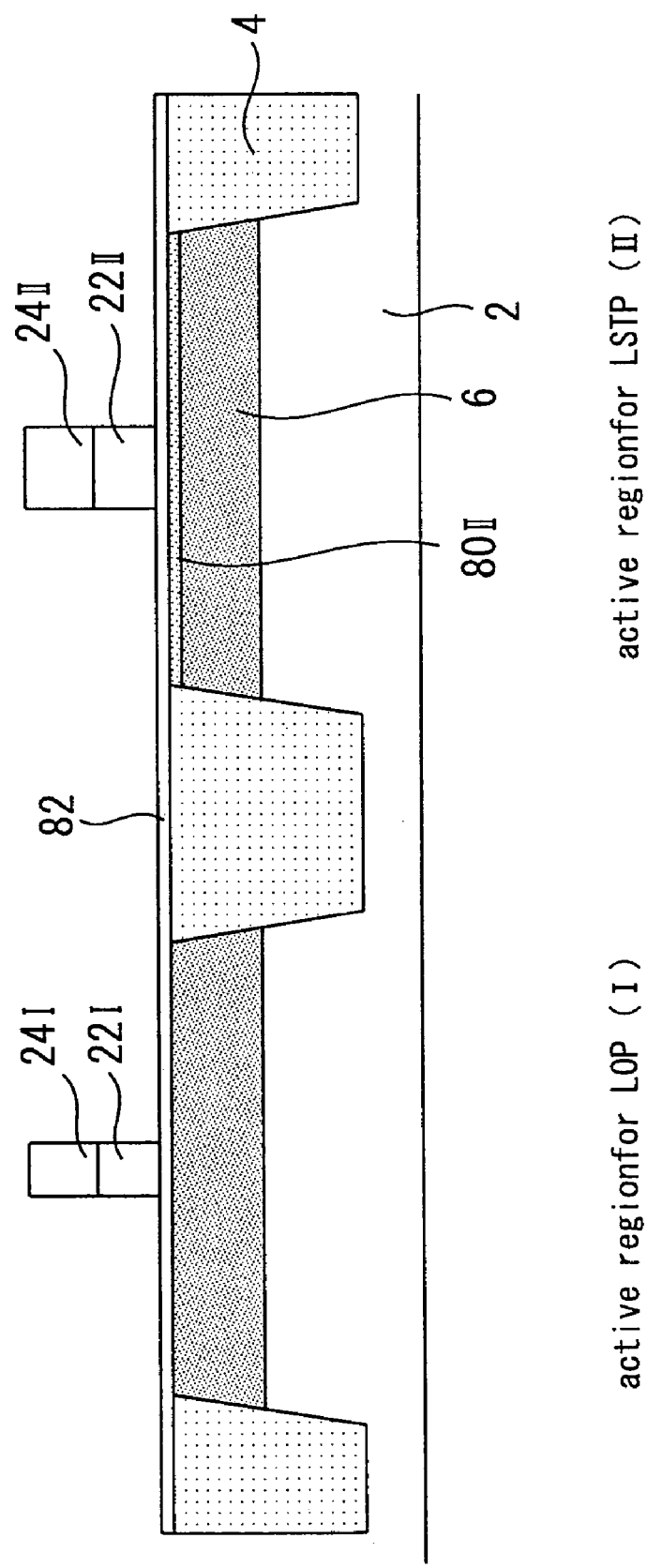
FIG. 45 is a sectional schematic diagram for illustrating the states in each manufacturing step of the semiconductor device 600 according to sixth embodiment of the present invention.

FIG. 44 is a flow diagram for illustrating the method for manufacturing the semiconductor device 600 according to the sixth embodiment of the present invention. FIG. 45 is a sectional schematic diagram for illustrating the states in each manufacturing step of the semiconductor device 600.

The method for manufacturing the semiconductor device 600 is similar to the method for manufacturing the semiconductor device 500 described in the fifth embodiment. However, as described above, the semiconductor device 600 differs from the semiconductor device 500 in that a high-dielectric-constant film composed of an HfSiO film 82 I is used as the gate insulating film of the pMOS for LOP 600I, and a laminated film composed of an $SiO_2$ film 80 II and an HfSiO film 82 II is used as the gate insulating film of the pMOS for LSTP 600 II. Therefore, the steps for forming the gate insulting film is somewhat different from the steps for forming the gate insulating films 20I and 20 II described in the fifth embodiment and the gate electrode (Steps S504 to S512).

Specifically, as the method for forming the gate insulating films, an $SiO_2$ film 80 is first formed as in the fifth embodiment (Step S604), and then, the, $SiO_2$ film 80 in the active region for LOP (I) is removed (Step S606). Thereafter, as FIG. 45 shows, an HfSiO film 82 is formed on the entire surface (Step S608). Here a CVD method is used. Thereafter, in the same manner as Steps S510 and S512 of the fifth embodiment, gate electrodes having a different gate lengths are formed in the active region for LOP (I) and the active region for LSTP (II), respectively (Steps S610 and S 612). In processing the gate electrodes (S 612), the HfSiO film 82 is etched at the same time. The SiO$_2$ film 80 is etched by later etching.

Other parts are formed in the same manner as described in the fifth embodiment, and the semiconductor device 600 as shown in FIG. 43 is formed.

According to the sixth embodiment, as described above, a transistor for LOP and a transistor for LSTP having favorable device characteristics can be formed on a chip. Since equivalent oxide-film thickness (EOT) can be reduced by using high-dielectric-constant films 82I and 82 II as the gate insulating films, the ON current of the transistor increases, and a semiconductor device that can be operated at a higher speed can be obtained.

In the sixth embodiment, the use of an HfSiO film as the high-dielectric-constant films 82 is described. However, the present invention is not limited thereto, but other high-dielectric-constant films composed of Al$_2$O$_3$, HfAl$_x$O$_y$, HfO$_2$ or HfSiO$_x$ may also be used.

Since other parts are the same in the first to fifth embodiments, the description thereof will be omitted.

In the fifth and sixth embodiments, the Si substrate 2 corresponds to the substrate of the present invention. In the embodiments 5 and 6, the isolating steps are carried out by carrying out the Steps S502 and S602; and gate-forming steps are carried out by carrying out Steps S504 to S512 and Steps S604 to S612. Also for example, in the embodiments 5 and 6, the steps for forming first diffusion layer can be carried out by carrying out Steps S522 and S622; the high-temperature heating steps can be carried out by carrying out Steps S524 and S624; the steps for forming the amorphous layers can be carried out by carrying out Steps S532 and S632; the steps for forming second diffusion layer can be carried out by carrying out Steps S534 and S634.

Also for example, in the embodiments 5 and 6, by carrying out Steps S538 and S638, the steps for forming the sidewalls and for performing heat treatment can be carried out, simultaneously; and the concentrating steps can be carried out by carrying out Steps S540 and S640. Also for example, the steps for radiating visual light can be carried out by carrying out Steps S544 and S644.

Seventh Embodiment

Figure 46:
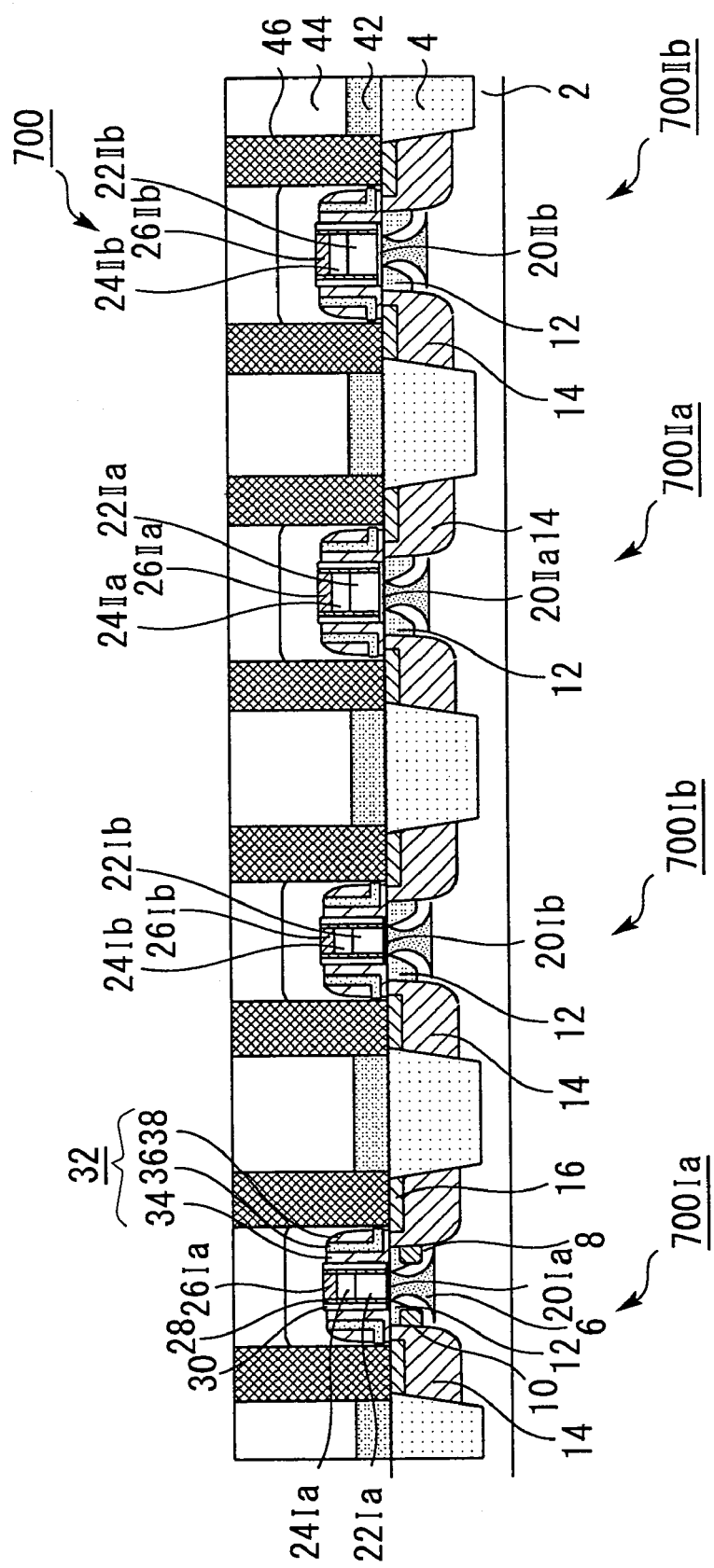
FIG. 46 is a sectional schematic diagram for illustrating the semiconductor device 700 according to the seventh embodiment of the present invention.

FIG. 46 is a sectional schematic diagram for illustrating the semiconductor device 700 according to the seventh embodiment of the present invention.

The semiconductor device 700 is a CMIS containing a pMOS for LOP 700Ia, an nMOS for LOP 700Ib, a pMOS for LSTP 700 IIa, and an nMOS for LSTP 700 IIb.

The pMOS for LOP 700Ia and the nMOS for LOP 700Ib of the semiconductor device 700 have the same structures of the pMOS for LOP 400a and the nMOS for LOP 400b of the semiconductor device 400 described in the fourth embodiment. The pMOS for LOP 700Ia and the pMOS for LSTP 700 IIa have the same structures of the pMOS for LOP 500I and the pMOS for LSTP 500 II of the semiconductor device 500. The nMOS for LSTP 700 IIb has the same structure as the pMOS for LSTP 700 IIa; however, the pMOS for LSTP 700 IIa is a pMOS, while the nMOS for LSTP IIb is an nMOS. Therefore, an n-type impurity such as As is implanted in the extensions 12 IIb and the source-drain regions 14 IIb.

Specifically, the gate insulating films 20Ia and 20Ib in the MOS for LOP 700Ia and 700Ib are thinner than the gate insulating films 20 IIa and 20 IIb in the MOS for LSTP 700 IIa and 700 IIb. Also the gate electrodes in the MOS for LOP 700Ia and 700Ib are shorter than the gate electrodes in the MOS for LSTP 700 IIa and 700 IIb. The junctions of the extensions 12Ia and 12Ib in the MOS for LOP 700Ia and 700Ib are shallower than the extensions 12 IIa and 12 IIb in the MOS for LSTP 700 IIa and 700 IIb.

Figure 47:
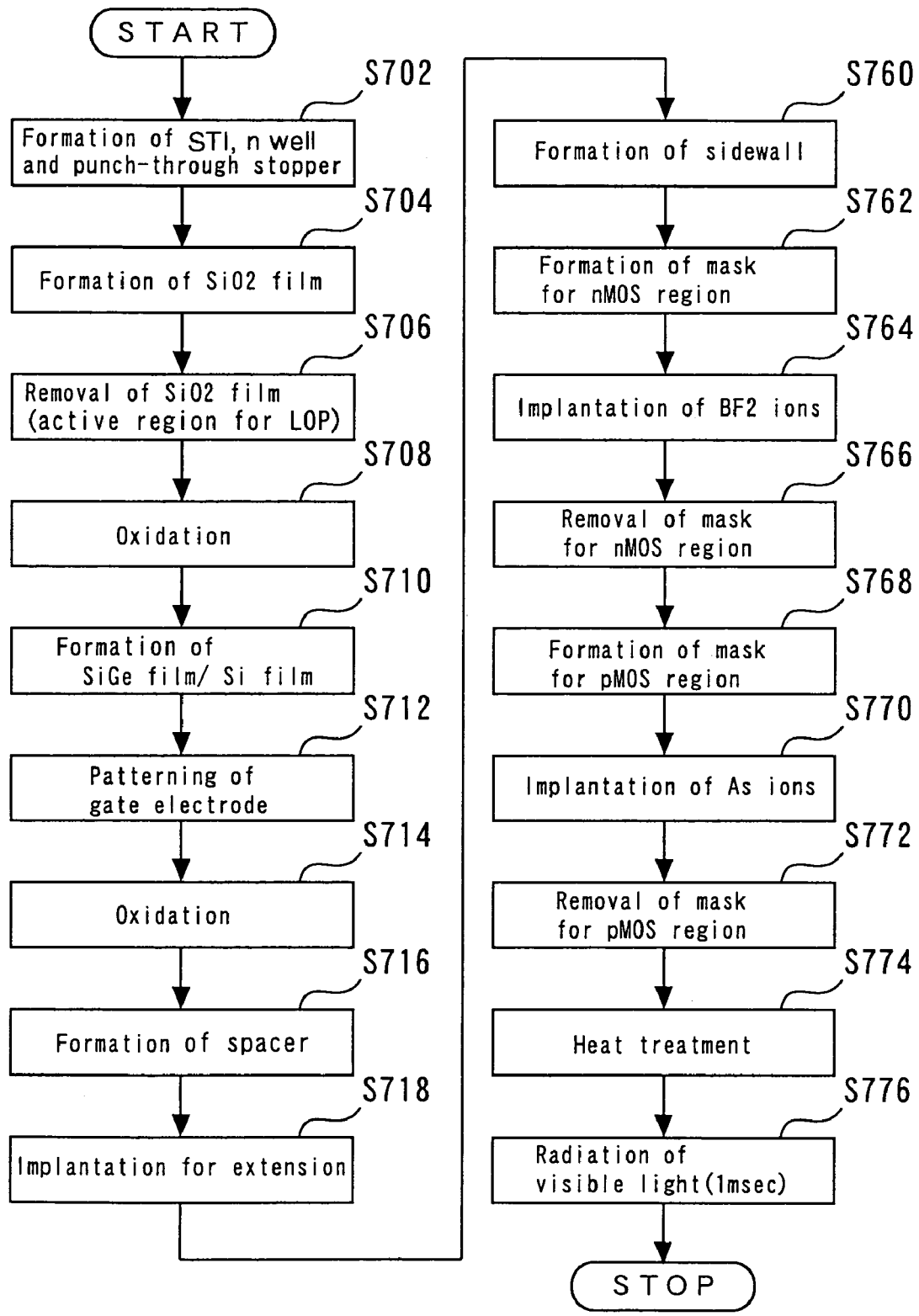
FIGS. 47 and 48 are flow diagrams for illustrating the method for manufacturing the semiconductor device 700 according to the seventh embodiment of the present invention.
Figure 48:
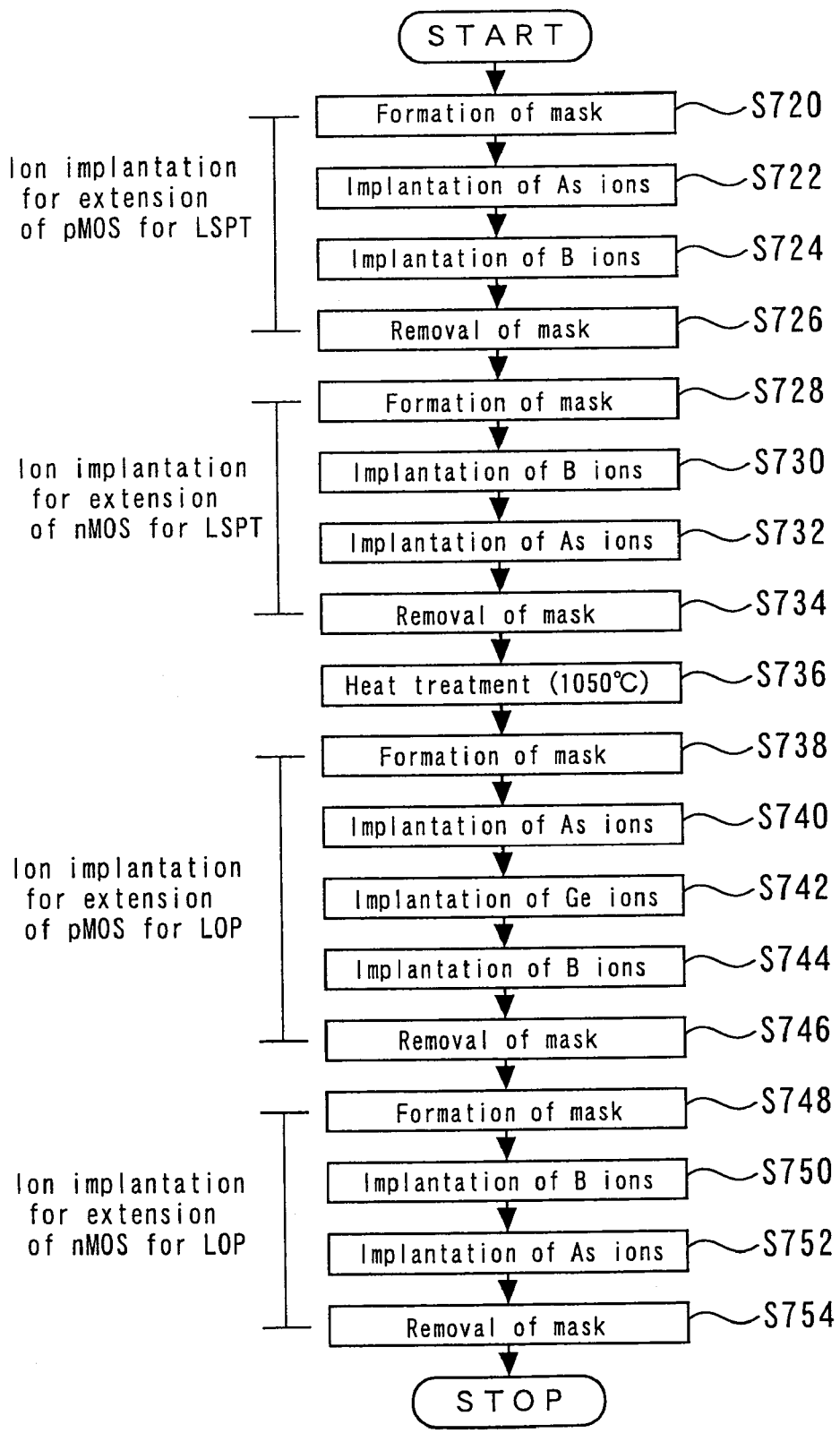
Figure 49:
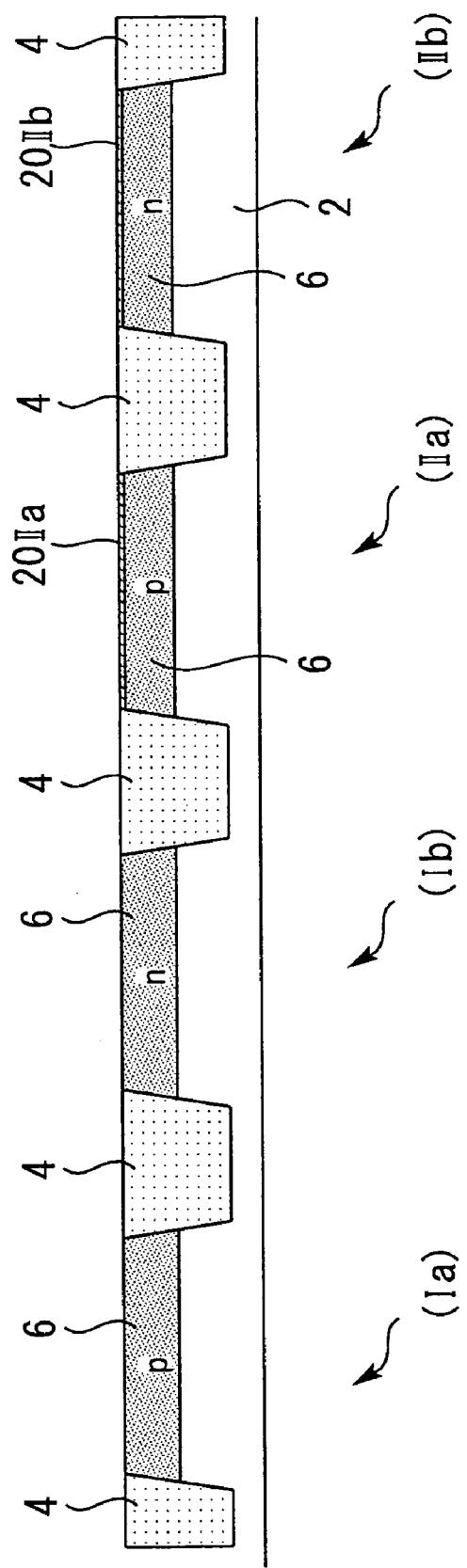

FIGS. 47 and 48 are flow diagrams for illustrating the method for manufacturing the semiconductor device 700 according to the seventh embodiment of the present invention. FIGS. 49 to 52 are sectional schematic diagrams for illustrating the states in each manufacturing step the semiconductor device 700.

The method for manufacturing the semiconductor device 700 is a combination of the method for manufacturing the semiconductor device 400 described in the fourth embodiment and the method for manufacturing the semiconductor device 500 described in the fifth embodiment.

The method for manufacturing a semiconductor device 700 of the present invention will be specifically described below referring to FIGS. 46 to 52.

First, in the same manner as Step 402 in the fourth embodiment, an STI 4, wells, and punch-through stoppers 6 are formed on an Si substrate 2 (Step S702). In this embodiment, the area on the Si substrate 2 is divided into four active regions by the STI 4, so that an active region for LSTP (I) and an active region for LOP (II) can be formed, and a pMOS region (a) and an nMOS region (b) can be formed in each of the active regions (I) and (II). An n-well is formed in each of pMOS regions (Ia) and (IIa); and a p-well is formed in each of nMOS regions (Ib) and (IIb). Furthermore, a punch-through stopper 6 is formed in each of the regions (Ia), (Ib), (IIa) and (IIb).

Next, in the same manner as Step S504 in the fifth embodiment, a gate insulating film (SiO$_2$ film) 20 is formed (Step S704). Thereafter, in the same manner as Step S506 in the fifth embodiment, the SiO$_2$ film on the active region for LOP (I) side is removed (Step S706). Here, as in the fifth embodiment, a resist mask that covers the active region for LSTP (II) side (i.e., regions (IIa) and (IIb) side) is formed, and after removing the SiO$_2$ film on the active region for LOP (I) side, the resist mask is removed.

Thereafter, in the same manner as Step S508 in the fifth embodiment, SiO$_2$ films are formed by thermal oxidation (Step S708). Thereby, SiO$_2$ films 20Ia and 20Ib are formed again on the active region for LOP (I). In the active region for LSTP (I) side, oxidation further proceeds, and thicker SiO$_2$ films 20 IIa and 20 IIb than the SiO$_2$ films 20 on the active region for LOP (I) is formed.

Next, in the same manner as Steps S106 to S108 in the first embodiment, a gate electrode is formed on each of regions (Ia), (Ib), (IIa), and (IIb) (Steps S710 to S712). In this embodiment, however, the gate length of each gate electrode in the active region for LOP (I) is different from the gate length of each gate electrode in the active region for LSTP (II), and the gate length of each gate electrode in the active region for LSTP (II) is longer in the same manner as in the fifth embodiment.

Next, in the same manner as Steps S110 to S112 in the first embodiment, an oxide film 28 and a spacer 30 are formed on the side of each gate electrode (Steps S714 to S716).

Next, ion implantation for forming extensions is performed into each of regions (Ia), (Ib), (IIa), and (IIb) (Step S718). This ion implantation is performed using resist masks in the order of the pMOS region for LSTP (IIa), the nMOS region for LSTP (IIb), the pMOS region for LOP (Ia), and the nMOS region for LOP (Ib).

Figure 50:
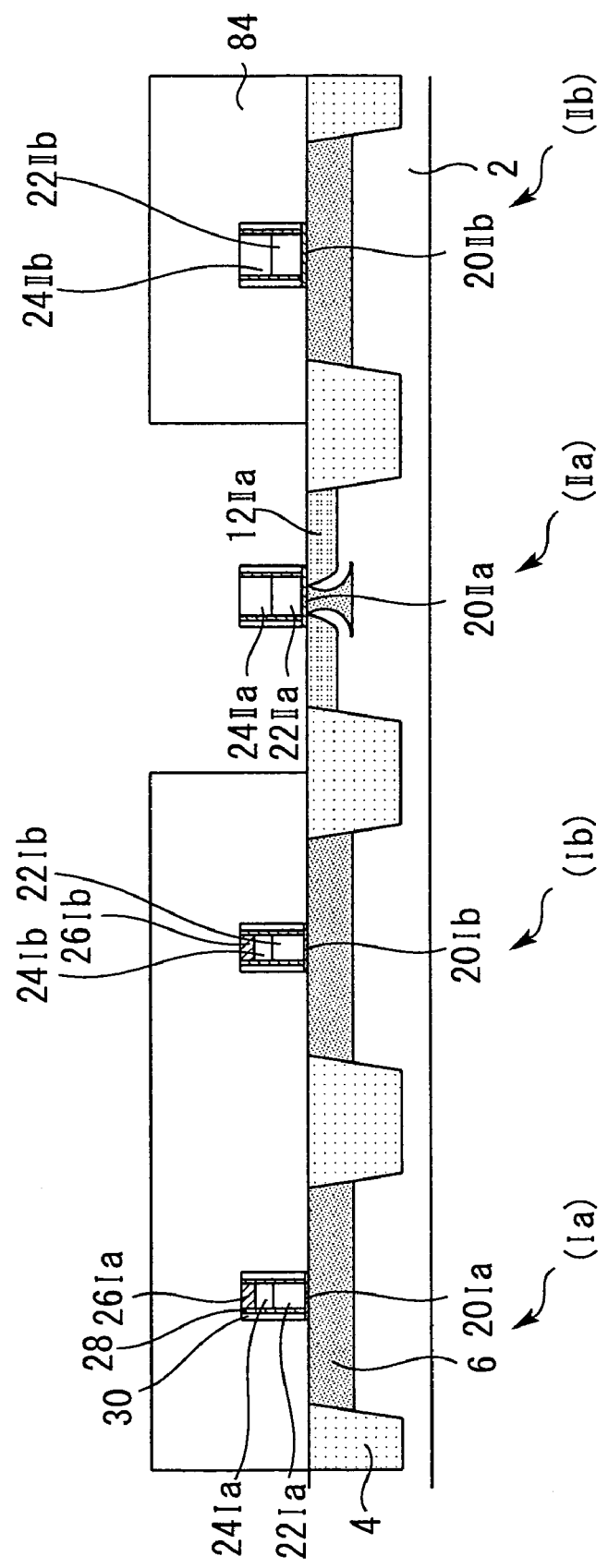
Figure 51:
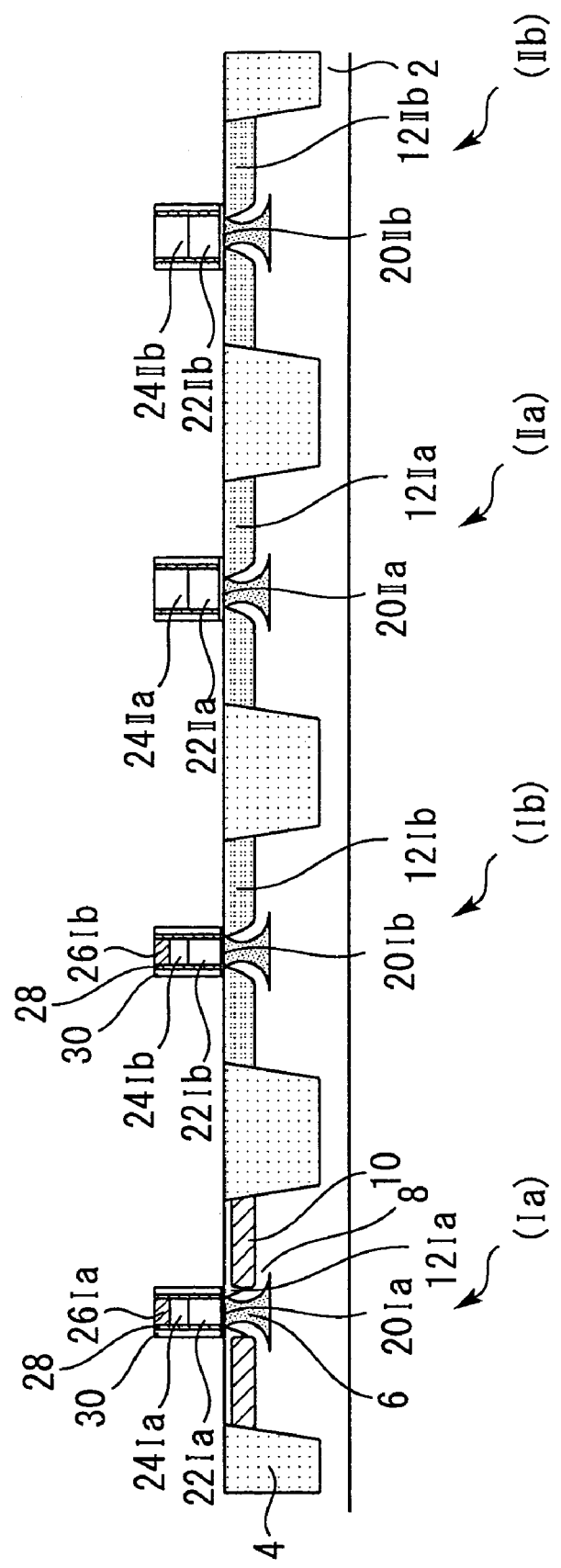

Specifically, in the same manner as Steps S518 to S522 in the fifth embodiment, impurities are implanted into the pMOS region for LSTP (IIa). Here, as FIG. 50 shows, a resist mask 84 that covers the entire active region for LOP (I) and the nMOS region for LSTP (IIb) is formed (Step S720). Thereafter, the implantation of As ions (Step S722) and the implantation of B ions (Step S724) are performed, and then, the resist mask 84 is removed. Thereby, a pocket layer 8 and extensions 12 IIa are formed in the pMOS region for LSTP (IIa).

Next, in the same manner as Steps S414 to S420 in the fourth embodiment, impurities are implanted into the nMOS region for LSTP (IIb). Here, a resist mask that covers the entire active region for LOP (I) and the pMOS region for LSTP (IIa) is formed (Step S728). Thereafter, the implantation of B. ions (Step S730) and the implantation of As ions (Step S732) are performed using this resist mask and the gate electrode as masks, and then, the resist mask is removed (Step S734). Thereby, a pocket layer 8 and extensions 12 IIb are formed in the nMOS region for LSTP (IIb).

Next, in the same manner as Step S524 in the fifth embodiment, heat treatment is performed at about 1050° C. (Step S736). Thereby, the extensions 12 IIa and 12 IIb in the active region for LSTP (I) side can be activated.

Next, in the same manner as Steps S528 to S536 in the fifth embodiment, impurities are implanted into the pMOS region for LOP (Ia). Here, a resist mask that covers the entire active region for LSTP (II) and the nMOS region for LOP (Ib) is first formed (Step S738). Thereafter, the implantation of As ions (Step S740), the implantation of Ge ions (Step S742), and the implantation of B ions (Step S744) are performed using this resist mask and the gate electrode as masks, and then the resist mask is removed (Step S746). Thereby, a pocket layer 8, an amorphous region 10, and extensions 12Ia are formed in the pMOS region for LOP (Ia).

Next, in the same manner as Steps S414 to S420 in the fourth embodiment, impurities are implanted into the nMOS region for LOP (Ib). Here, a resist mask that covers the entire active region for LSTP (II) and the pMOS region for LOP (Ia) is first formed (Step S748). Thereafter, the implantation of B ions (Step S750), and the implantation of As ions (Step S752) are performed using this resist mask and the gate electrode as masks, and then the resist mask is removed (Step S754). Thereby, a pocket layer 8 and extensions 12Ib are formed in the nMOS region for LOP (Ib).

Next, as FIG. 52 shows, in the same manner as Steps S120 to S124 in the first embodiment, a sidewall 32 is formed on the side of the spacer 30 of each gate electrode (Step S760). The amorphous region 10 is simultaneously crystallize.

Thereafter, in the same manner as Steps S434 to S446 in the fourth embodiment, source-drain regions 14 are formed in each region. Specifically, a resist mask that covers the nMOS regions (Ib) and (IIb) is formed (Step S762), and $BF_2$ ions are implanted using the resist mask, the gate electrode, the oxide film 28, the spacer 30 and the sidewall 32 as masks (Step S764). Thereafter, the resist mask is removed (Step S766), instead, a resist mask that covers the pMOS regions (Ia) and (IIa) is formed (Step S768). Thereafter, As ions are implanted (Step S770), and the mask is removed (Step S772).

Next, in the same manner as Steps S128 to S130 in the first embodiment, low-temperature annealing is performed at about 60020 C. (Step S774), and visible light is radiated for about 1 msec (Step S776). Thereby, recrystallization is promoted; however, the junction of extensions and the source-drain regions are prevented from extending because of heating for an extremely short time.

Next, in the same manner as Steps S132 to S140 in the first embodiment, NiSi films 16 and 26, an SiN film 42, an $SiO_2$ film 44, contact plugs 46, an interlayer insulating film 48, and wirings 50 are formed.

Thus, the semiconductor device 700 as shown in FIG. 46 is formed.

According to the seventh embodiment, as described above, even when a cMOS for LOP and a cMOS for LSTP are formed in a chip, a shallow junction can be realized in the cMOS for LOP side, and leak current can be inhibited at a higher level in the cMOS for LSTP side. Therefore this allows reduction of power consumption, thereby providing a semiconductor device with excellent device characteristics.

In the seventh embodiment, although the case wherein the gate insulating film is an $SiO_2$ film, and the gate electrode has a laminated structure composed of SiGe, Si, and NiSi, the present invention is not limited thereto, but for example, as described in the sixth embodiment, a high-dielectric-constant film may be used as the gate insulating film; or as described in the third embodiment, a metal gate such as a TiN gate or the like may be used as the gate electrode. Thus, the same effects as described in the second and third embodiments and the like can be achieved.

Also in the seventh embodiment, the case wherein p-type extensions 12Ia and 12 IIa are first formed, and n-type extensions 12Ib and 12 IIb are subsequently formed in the active region for LOP (I) and the active region for LSTP (II) is described. However, the present invention is not limited thereto. Since the extensions 12 IIa and 12 IIb in the active region for LSTP is preferably subjected to high-temperature heat treatment after forming, the extensions 12 IIa and 12 IIb in the active region for LSTP (H) is preferably formed first; however, n-type extensions 12Ib and 12 IIb maybe first formed in the active region for LOP (I) and the active region for LSTP (II), respectively.

Also in the seventh embodiment, although the case wherein ion implantation into the pMOS region for LOP (Ia) and the pMOS region for LSTP (IIa) is performed in the same time when the source-drain regions are formed is described. However, the present invention is not limited thereto. For example, ion implantation into the pMOS region for LOP (Ia) and the pMOS region for LSTP (IIa) may be performed separately. In this case, after implanting Ge ions, B ions may be implanted into the pMOS region for LOP (Ia), and only B ions may be implanted into the pMOS region for LSTP (IIa).

Since other parts are identical to the first to sixth embodiments, the description thereof will be omitted.

In the seventh embodiment, for example, the isolating step can be carried out by carrying out Step S702; and the gate-forming step can be carried out by carrying out Steps S704 to S712. Also for example, the steps for forming the first diffusion in the present invention can be carried out by carrying out Steps S720 to S726; the steps for forming the second diffusion layer can be carried out by carrying out Steps S728 to S734; the steps for forming the third diffusion layer can be carried out by carrying out Steps S738 to S746; and the steps for forming the fourth diffusion layer can be carried out by carrying out Steps S748 to S754. Also the step for radiating visible light of the present invention can be carried out by carrying out Step S776.

Also in the seventh embodiment, the step for forming the amorphous layer of the present invention can be carried out by carrying out Step 742.

Also in the seventh embodiment, for example, the step for high-temperature heat treatment of the present invention can be carried out by carrying out Step 736. Also in the seventh embodiment, for example, the step for forming the sidewall of the present invention and for performing heat treatment are carried out by carrying out Step S760. Also in the seventh embodiment, for example, the step for concentrating fist, second, third, and fourth diffusion layer can be carried out by carrying out Steps S764 and S770, respectively.

According to one aspect of the present invention, after a transistor for LOP that required shallow junction has been formed, visible light is radiated for an extremely short time, in place of high-temperature treatment for activating the diffusion layer. Therefore, the junction depth of the diffusion layer can be prevented from extending, and the diffusion layer can be activated. Therefore, a semiconductor device having favorable device properties can be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-165719, filed on Jun. 10, 2003 including specification, claims, drawings and summary, on which the Convention priority of the present application is based, are incorporated herein by reference in its entirety.

The invention claimed is:

1. A method for manufacturing a semiconductor device comprising:
    forming a trench isolation on a substrate, dividing the substrate into a first active region and a second active region;
    forming a first well region in said first active region and a second well region in said second active region;
    forming a first gate insulating film and a first gate electrode on said first active region and forming a second gate insulating film and a second gate electrode on said second active region;
    forming a first mask on said second active region;
    using said first mask and said first gate electrode as masks, forming a first pocket region in said substrate in said first active region;
    using said first mask and said first gate electrode as masks, implanting a first dopant impurity into said substrate in said first active region to form a first doped region;
    removing said first mask;
    forming a second mask on said first active region;
    using said second mask and said second gate electrode as masks, forming a second pocket region in said substrate in said second active region;
    using said second mask and said second gate electrode as masks, forming an amorphous region by implanting ions into said substrate in said second active region, making a portion of the surface of said substrate in said second active region amorphous;
    using said second mask and said second gate electrode as masks, forming a second doped region by implanting a second dopant impurity into said substrate, in said second active region;
    removing said second mask;
    heat treating, at 500° C. to 700° C., said substrate;
    forming sidewalls on sides of said first gate insulating film, said first gate electrode, said second gate insulating film, and said second gate electrode;
    using said first gate electrode, said second gate electrode, and said side walls as masks, increasing impurity concentration in a part of said first doped region and in a part of said second doped region, respectively, by implanting said first dopant impurity and said second dopant impurity; and
    irradiating said substrate with visible light.

2. The method for manufacturing a semiconductor device according to claim 1, including forming said second doped region by implanting one of B ions and $BF_2$ ions as the impurity.

3. The method for manufacturing a semiconductor device according to claim 1, further comprising, after forming said sidewalls and before increasing impurity concentration, forming an amorphous region a second time by implanting ions into said substrate in said second active region, making a portion of the surface of said substrate in said second active region amorphous.

4. The method for manufacturing a semiconductor device according to claim 1, wherein said first and second gate insulating films include one of an $SiO_2$ film and a high-dielectric-constant film.

5. The method for manufacturing a semiconductor device according to claim 1, wherein said first and second gate electrodes are one of a TiN layer and a laminated layer containing SiGe and Si.

6. The method for manufacturing a semiconductor device according to claim 1, including forming the amorphous region by implanting one of Ge ions and Si ions.

7. The method for manufacturing a semiconductor device according to claim 1, including irradiating said substrate with visible light for a period no longer than 1 msec.

8. The method for manufacturing a semiconductor device according to claim 1, including heat treating for approximately 2 minutes.

9. The method for manufacturing a semiconductor device according to claim 1, including simultaneously heat treating said substrate and forming said sidewalls.

10. A method for manufacturing a semiconductor device comprising:
    forming a separating region in a substrate, dividing said substrate into a first active region and a second active region;
    forming a first gate insulating film on a surface of said substrate in said first active region and said second active region;
    forming a first mask covering said first active region, including said first gate insulating film;
    removing said first gate insulating film from said second active region;
    removing said first mask;
    forming a second gate insulating film on said first gate insulating film in said first active region and on the surface of said substrate in said second active region;
    forming a first gate electrode having a first gate length on said first and second gate insulating films in said first active region and a second gate electrode having a second gate length, shorter than the first gate length, on said second gate insulating film in said second active region;
    forming a second mask on said second active region;
    using said second mask and said first gate electrode as masks, forming a first doped region in said first active region, by implanting a dopant impurity into said substrate in said first active region;
removing said second mask;
forming a third mask in said first active region;
using said third mask and second gate electrode as masks, forming an amorphous region in said second active region, by implanting ions into said substrate in said second active region, making a portion of the surface of said substrate in said second active region amorphous;
using said third mask and said second gate electrode as masks, forming a second doped region in said second active region, by implanting a dopant impurity into said substrate in said second active region;
removing said third mask;
heat treating, at 500° C. to 700° C., said substrate;
forming sidewalls on said first gate electrode and said second gate electrode, in each of said first active region and said second active region;
using said first gate electrode and said sidewalls as masks, increasing dopant impurity concentration in said first doped region by implanting a dopant impurity into said substrate in said first doped region;
using said second electrode and said sidewalls as masks, increasing dopant impurity concentration in said second doped region by implanting a dopant impurity into said substrate in said second doped region; and
irradiating said substrate with visible light.

11. The method for manufacturing a semiconductor device according to claim 10, further comprising, after forming said first doped region, and before forming said amorphous region, heat treating at least 100° C.

12. The method for manufacturing a semiconductor device according to claim 10, wherein at least one of forming said first doped region and forming said second doped region includes implanting one of B ions and $BF_2$ ions.

13. The method for manufacturing a semiconductor device according to claim 10, further comprising, before increasing dopant impurity concentration of said second doped region, using said second gate electrode and said sidewalls as masks, making a portion of the surface of said substrate in said second active region amorphous a second time by implanting ions.

14. The method for manufacturing a semiconductor device according to claim 10, wherein the conductivity type of said first doped region is same as the conductivity type of said second doped region.

15. A method for manufacturing a semiconductor device comprising:
dividing a substrate into a first active region, a second active region, a third active region, and a fourth active region;
forming a first gate insulating film on a surface of said substrate in each of said first, second, third, and fourth active regions;
forming a first mask on said first and second active regions;
removing said first gate insulating film from said third and fourth active regions;
removing said first mask;
forming a second gate insulating film on said first gate insulating film in said first and second active regions and on the surface of said substrate of said third and fourth active regions;
forming a first gate electrode on said first and second gate insulating films in said first active region, a second gate on said first and second gate insulating films in said second active region, a third gate electrode on said second gate insulating film in said third active region, and a fourth gate electrode on said second gate insulating film in said fourth active region, said first and second gate electrodes having respective lengths longer than lengths of said third and fourth gate electrodes;
forming a second mask on said second, third, and fourth active regions;
using said second mask and said first gate electrode as masks, forming a first doped region in said substrate in said first active region, by implanting a dopant impurity into said substrate in said first active region;
removing said second mask;
forming a third mask on said first, third, and fourth active regions;
using said third mask and said second gate electrode as masks, forming a second doped region in said substrate in said second active region, by implanting a dopant impurity into said substrate in said second active region;
removing said third mask;
forming a fourth mask on said first, second, and fourth active regions;
using said fourth mask and said third gate electrode as masks, forming an amorphous region on the surface of said substrate in said third active region, by implanting ions into said substrate in said third active region;
using said fourth mask and said third gate electrode as masks, forming a third doped region in said substrate in said third active region, by implanting a dopant impurity into said substrate in said third active region;
removing said fourth mask;
forming a fifth mask on said first, second, and third active regions;
using said fifth mask and said fourth gate electrode as masks, forming a fourth doped region in said substrate in said fourth active region;
removing said fifth mask;
heat treating, at 500° C. to 700° C., said substrate;
forming sidewalls on sides of said first, second, third, and fourth gate electrodes;
forming sixth mask on said second and fourth active regions;
using said sixth mask, said first and third gate electrodes, and said sidewalls as masks, increasing dopant impurity concentration in said substrate in said first and third doped regions by implanting a dopant impurity into said substrate in said first and third doped regions;
removing said sixth mask;
forming a seventh mask on said first and third active regions;
using said seventh mask, said second and fourth gate electrodes, and said sidewalls as masks, increasing dopant impurity concentration in said second and fourth doped regions by implanting a dopant impurity into said substrate in said second and fourth doped regions; and
irradiating said substrate with visible light.

16. The method for manufacturing a semiconductor device according to claim 15, further comprising, before forming said third doped region, heat treating at at least 1000° C.

* * * * *